US006788594B2

(12) United States Patent
Ware et al.

(10) Patent No.: US 6,788,594 B2
(45) Date of Patent: Sep. 7, 2004

(54) ASYNCHRONOUS, HIGH-BANDWIDTH MEMORY COMPONENT USING CALIBRATED TIMING ELEMENTS

(75) Inventors: Frederick A. Ware, Los Altos, CA (US); Ely K. Tsern, Los Altos, CA (US); Craig E. Hampel, San Jose, CA (US); Donald C. Stark, Los Altos Hills, CA (US)

(73) Assignee: Rambus Inc., Los Altos, CA (US)

( * ) Notice: Subject to any disclaimer, the term of this patent is extended or adjusted under 35 U.S.C. 154(b) by 18 days.

(21) Appl. No.: 10/271,936

(22) Filed: Oct. 15, 2002

(65) Prior Publication Data

US 2003/0039159 A1 Feb. 27, 2003

Related U.S. Application Data

(62) Division of application No. 09/796,924, filed on Feb. 28, 2001.

(51) Int. Cl.[7] .................................................. G11C 7/00
(52) U.S. Cl. .................. 365/194; 365/233; 365/189.05
(58) Field of Search ................................ 365/194, 233, 365/189.05

(56) References Cited

U.S. PATENT DOCUMENTS

| 5,661,688 A | | 8/1997 | Yim et al. |
| 5,835,443 A | * | 11/1998 | Fujita ..................... 365/189.05 |
| 5,848,260 A | | 12/1998 | Chen et al. |
| 5,923,615 A | | 7/1999 | Leach et al. |
| 6,101,136 A | * | 8/2000 | Mochida ..................... 365/194 |
| 6,351,433 B1 | | 2/2002 | Kosugi |

FOREIGN PATENT DOCUMENTS

WO      WO 99/50852      10/1999

* cited by examiner

*Primary Examiner*—Huan Hoang
(74) *Attorney, Agent, or Firm*—Lee & Hayes, PLLC

(57) ABSTRACT

Disclosed herein are embodiments of an asynchronous memory device that use internal delay elements to enable memory access pipelining. In one embodiment, the delay elements are responsive to an input load control signal, and are calibrated with reference to periodically received timing pulses. Different numbers of the delay elements are configured to produce different asynchronous delays and to strobe sequential pipeline elements of the memory device.

45 Claims, 35 Drawing Sheets

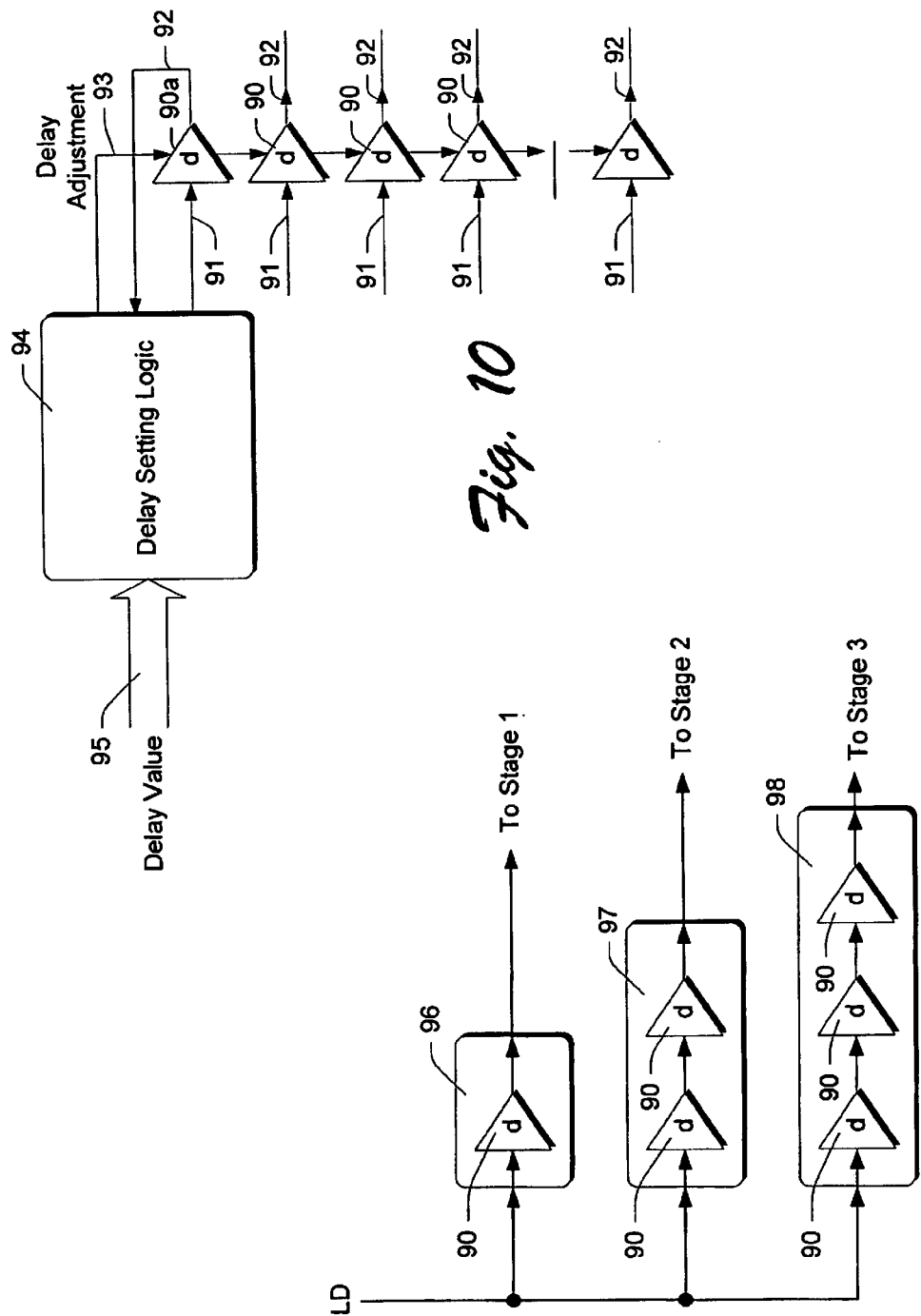

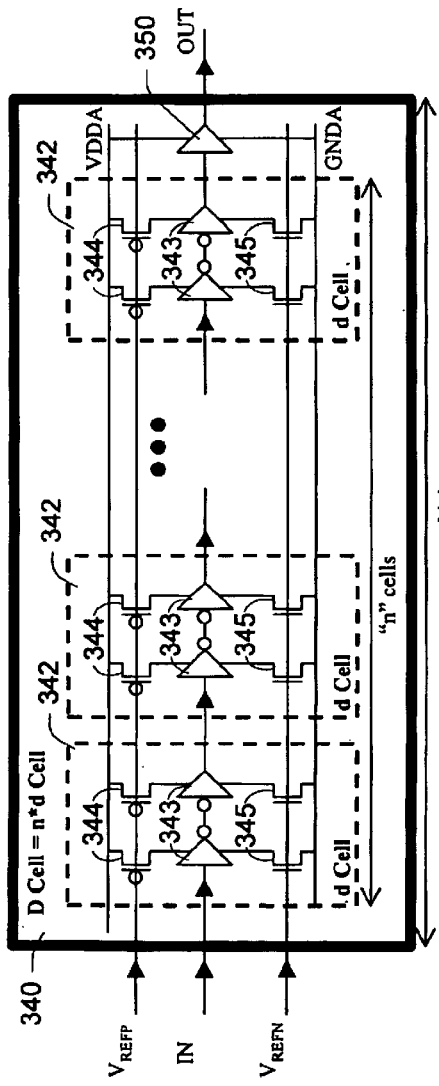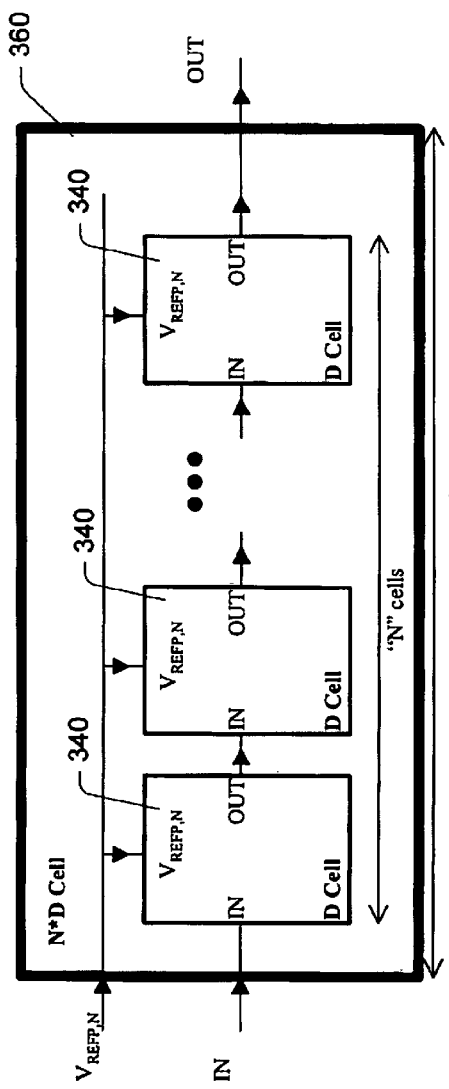

ASYNCHRONOUS, HIGH-BANDWIDTH MEMORY COMPONENT USING CALIBRATED TIMING ELEMENTS

RELATED APPLICATIONS

This is a divisional of and claims priority to U.S. patent application Ser. No. 09/796,924, filed Feb. 28, 2001, entitled "Asynchronous, High-Bandwidth Memory Component Using Calibrated Timing Elements," by inventors Frederick A. Ware, Ely K. Tsern, Craig E. Hampel, and Donald C. Stark.

TECHNICAL FIELD

This invention relates to high-speed memory systems and devices, and in particular to high-speed memory devices that accommodate pipelined memory access operations.

BACKGROUND OF THE INVENTION

FIG. 1 shows an example of prior art asynchronous memory device 10. Memory device 10 is an asynchronous DRAM (dynamic random access memory) having a memory array 12 that is addressable by the combination of a row address and a column address. The row and column addresses are typically provided during different bus cycles on a common address bus ADDR. A RAS signal indicates a bus cycle in which the row address is supplied, and the CAS signal indicates a bus cycle in which the column address is supplied. Memory results are provided in response to individual column addresses—in response to CAS bus cycles.

The memory device shown in FIG. 1 includes address registers 14 and 15 that hold the row and column addresses during memory access. The RAS and CAS signals, respectively, load the row and column addresses from the address bus into registers 14 and 15.

The CAS signal also loads a command or instruction (write or read) into a command register 16. A command decode block 17 interprets the current memory instruction and enables an appropriate driver 18 or 19, depending on whether the memory operation is a write operation or a read operation.

FIG. 2 shows the CAS timing of a read operation in the memory device of FIG. 1. The rising edge of CAS loads the column address into register 15, loads the read command into register 16, and starts the column access. Actual memory access requires a time $t_{CAC}$ from the leading edge of the CAS signal. The assertion of CAS also turns on the data output driver 18 after a delay of $t_{ON}$. Initially, invalid data (cross-hatched) is driven on the DATA bus. Valid data is driven after the time $t_{CAC}$ and until a time $t_{OFF}$ after CAS is de-asserted.

This access is asynchronous since read data appears on the DATA bus after a time that is determined by the DRAM and not by timing signals supplied externally (other than the initial CAS edge that loads the address). The advantage of this approach is simplicity—it is relatively easy to use this memory device. The disadvantage is performance—the number of read operations per unit of time is relatively limited since accessing the memory array and transporting the resulting data on the DATA bus must be done sequentially before the next access can begin.

FIG. 3 shows pertinent elements of a synchronous DRAM 20, a prior art device having an architecture that facilitates higher access speeds relative to the asynchronous DRAM described above. DRAM 20 has one or more banks of memory arrays 21. It has row and column address registers 22 and 23 that receive row and column addresses from a common address bus ADDR. DRAM 20 also has a command register 24 that receives and stores commands or instructions from a command or control bus OP. This device allows more complex memory access operations that the device of FIG. 1, and therefore allows more commands through its OP bus.

Instead of RAS and CAS signals, this device uses a single CLK signal, in conjunction with the OP bus, to load row and column addresses into registers 22 and 23. The command register 24 is loaded by the CLK signal as well.

Another difference from the circuit of FIG. 1 is that DRAM 20 has registers 25 and 26 in the path of the read and write data (between the DATA bus and the memory arrays 21). These registers are also loaded by the CLK signal. A command decode block 27 generates signals that enable drivers 28 and 29 for the read and write data.

The inclusion of two or more independent banks of memory arrays permits more that one memory access to take place at a time. In other words, a second memory access operation can be initiated even before obtaining results of an earlier operation. Registers 25 and 26, in the path of the read and write data, are necessary for this type of overlapped operation. Such overlapped operation is typically referred to as "pipelined" operation or "pipelined" memory access.

FIG. 4 shows the timing of a column read access for synchronous DRAM 20. On the first rising edge of CLK the column address is loaded from the ADDR bus into column address register 23, and a command is loaded from the OP bus into command register 24. Accessing the appropriate memory array and obtaining memory data requires a time $t_{CAC}$, which is slightly less than the period of the clock signal CLK. At the next rising edge of CLK, the read data is loaded from the memory array into read data register 25. This CLK edge also turns on the data output driver 28 after a delay of $t_{ON}$. The third rising edge of CLK turns off the data output drivers after a time $t_{OFF}$.

This operation is synchronous, in that data output is timed and enabled relative to an externally supplied clock signal. The row and column address registers 22 and 23 form a first pipeline stage, in which addresses are obtained for accessing memory. The read data register 25 forms a second pipeline stage, which is capable of holding memory results even as another memory access operation is initiated in the first pipeline stage. As a result of this technique, the two steps of memory access and data transport are done sequentially in the two pipeline stages of the DRAM. A second memory access could be started after the second CLK edge, overlapping the two operations.

There are two benefits to this technique. First, it permits sequential transactions to be overlapped, increasing the number of read transactions per unit of time. Second, it resynchronizes the transport of the read data—the signals that enable and disable the drivers are timed by the subsequent CLK edges.

As the signaling bandwidth of memory buses is increased, more pipeline stages can be added to the DRAM so that individual data slots are very small. Modern memory designs utilize a high degree of pipelining to support very high transfer rates.

Although pipelining has been essential to achieving high memory access rates, the technology does have disadvantages. High latency is one disadvantage, resulting from the need to quantize internal delays to the externally-supplied clock period. A disproportionally high power requirement is another disadvantage. Power is a concern because a freerunning clock dissipates power even when no useful work is being done. Some devices utilize low-power modes in which the clock is gated off, but this creates further latency problems. Furthermore, the power needed while restarting the clock threatens to erase whatever savings might have otherwise been gained by disabling the clock.

BRIEF DESCRIPTION OF THE DRAWINGS

FIG. 10 is a block diagram of delay elements and calibration logic as used in the embodiments described herein.

FIG. 11 is a block diagram showing one configuration of delay elements for use in the embodiments described herein.

FIG. 24 is a block diagram of a "D" cell delay element.

FIG. 25 is a block diagram of an "N*D" cell delay element.

DETAILED DESCRIPTION

Figure 1:
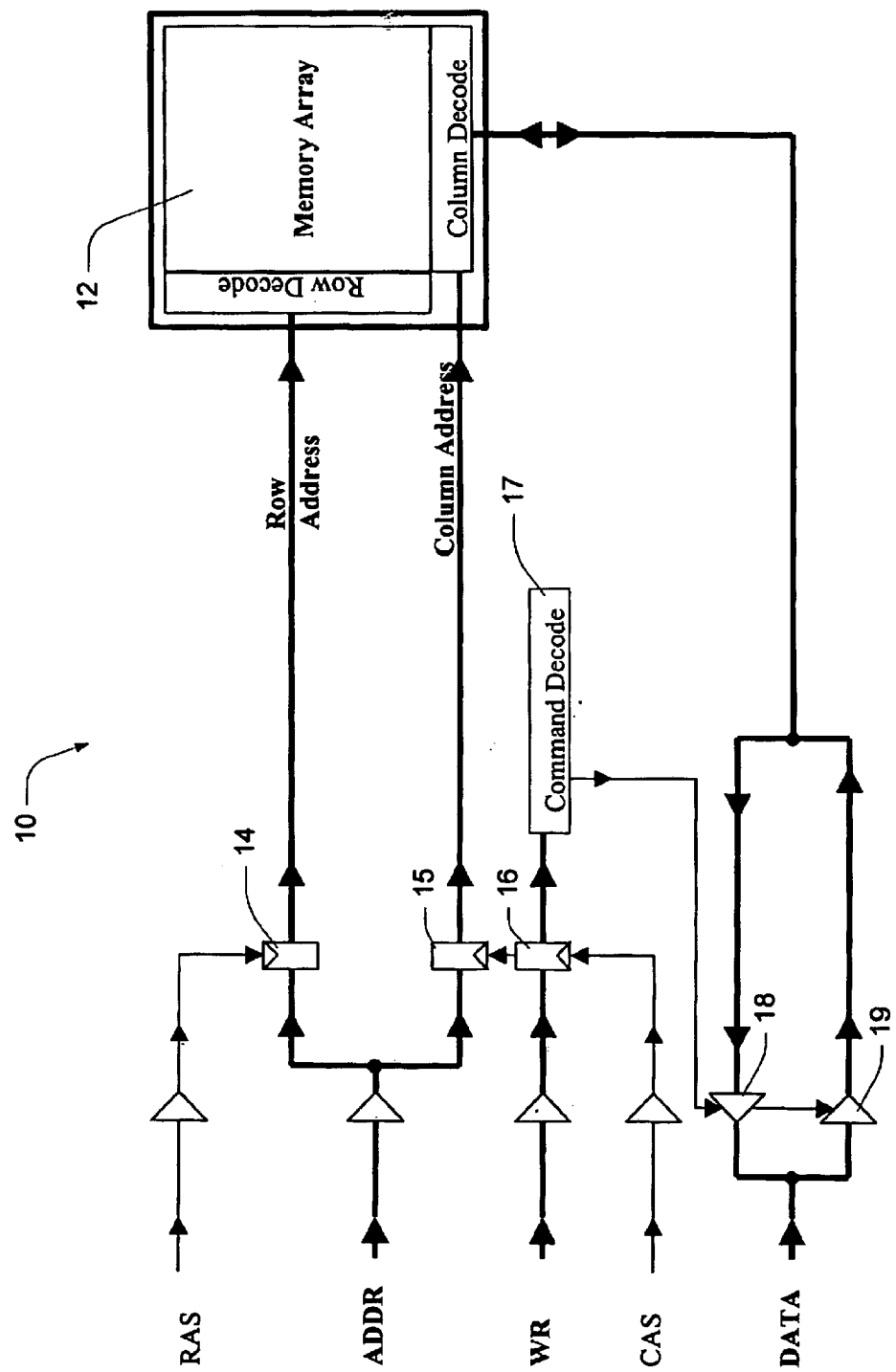
FIG. 1 is a block diagram of a prior art asynchronous memory device.
Figure 2:
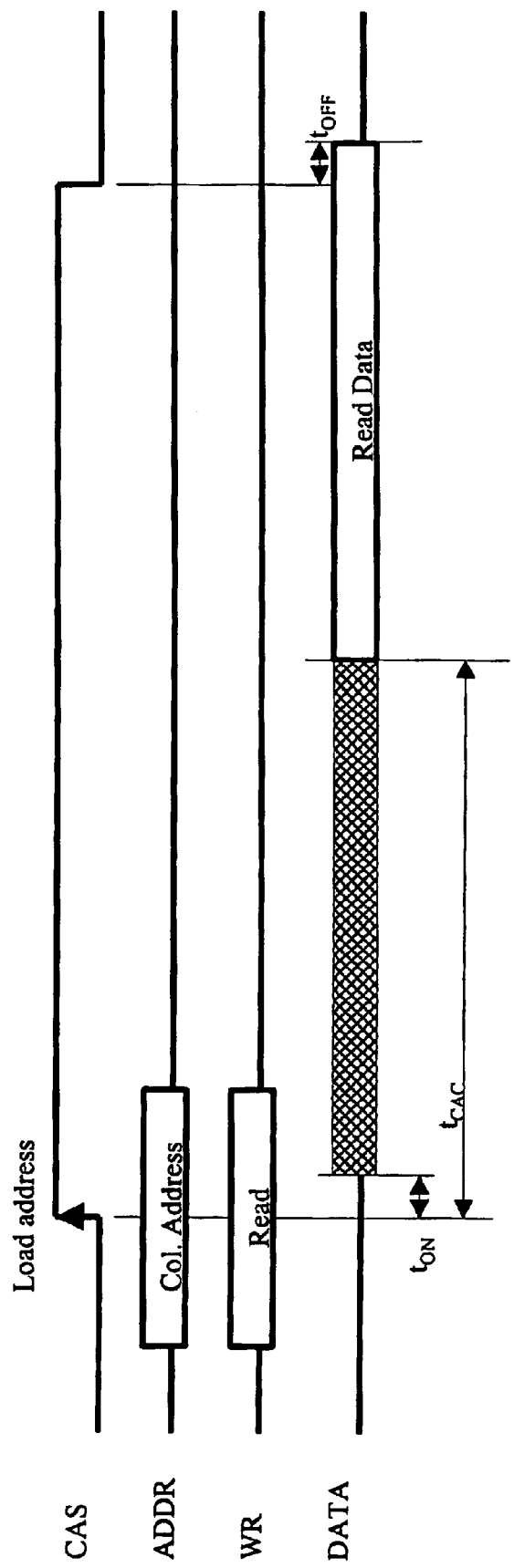
FIG. 2 is a timing diagram illustrating operation of the device of FIG. 1.
Figure 3:
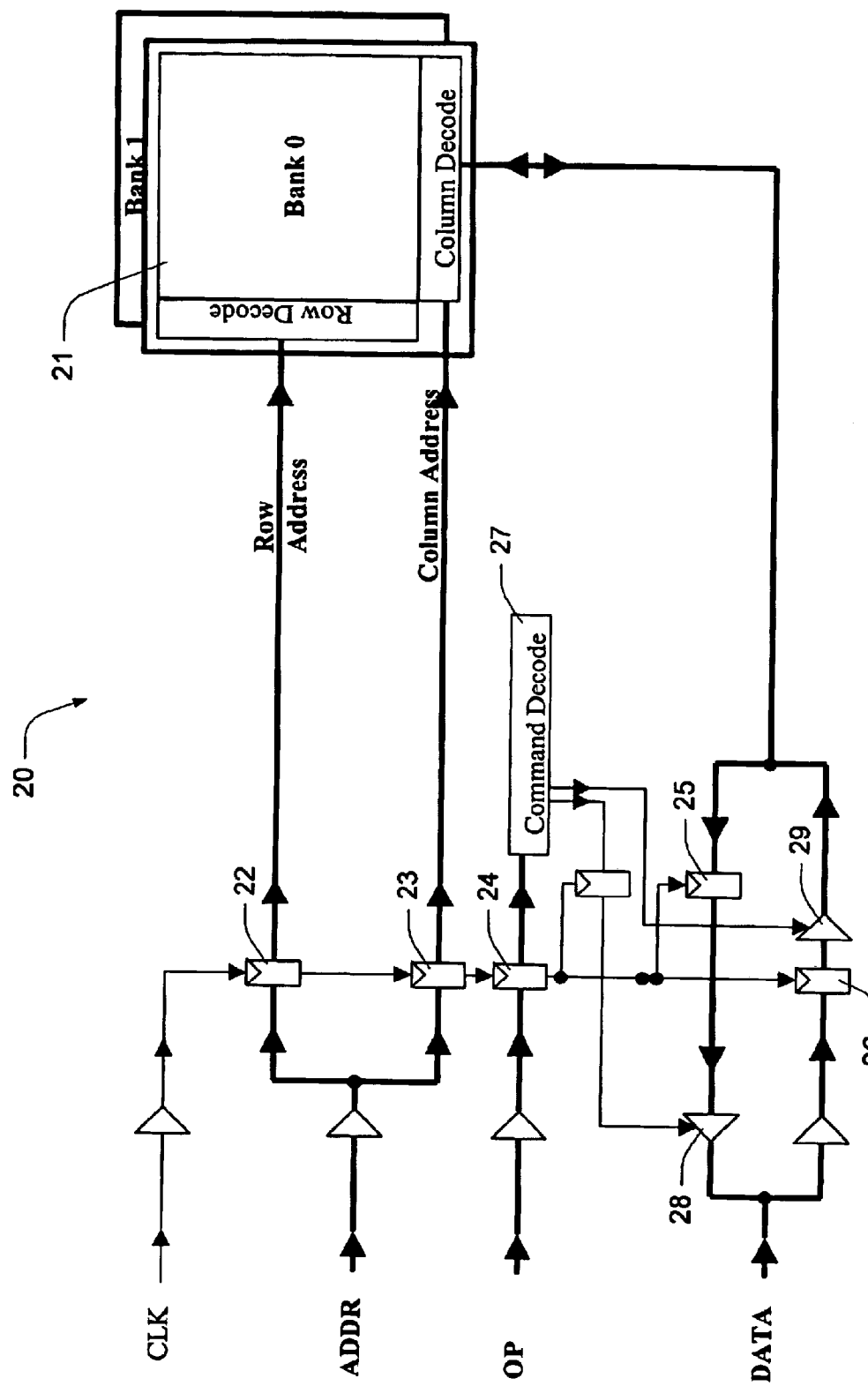
FIG. 3 is a block diagram of a prior art synchronous memory device.
Figure 4:
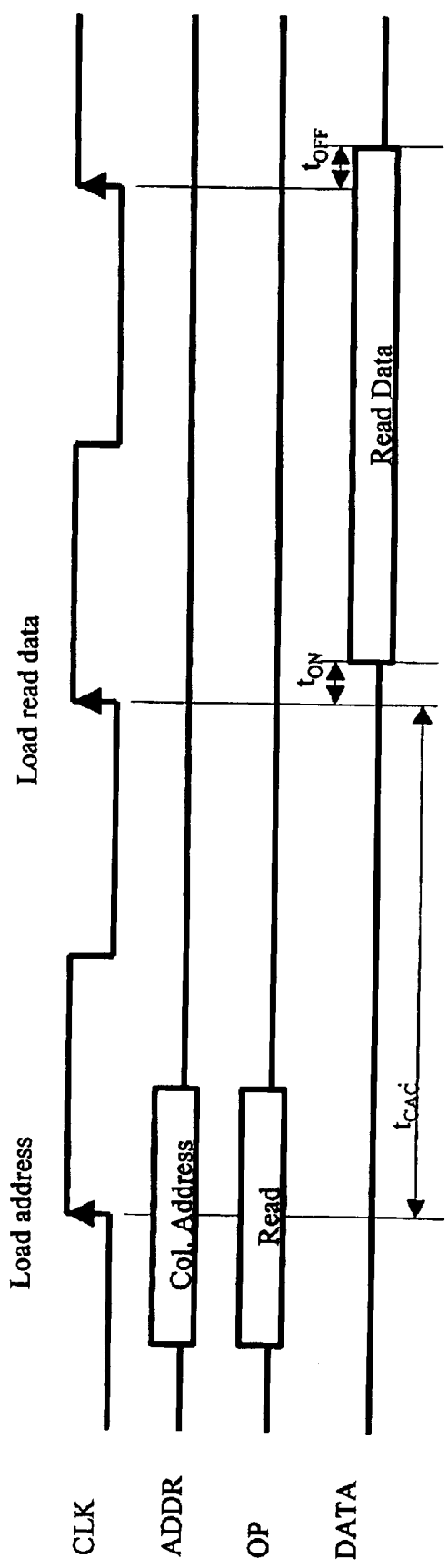
FIG. 4 is a timing diagram illustrating operation of the device of FIG. 3.
Figure 5:
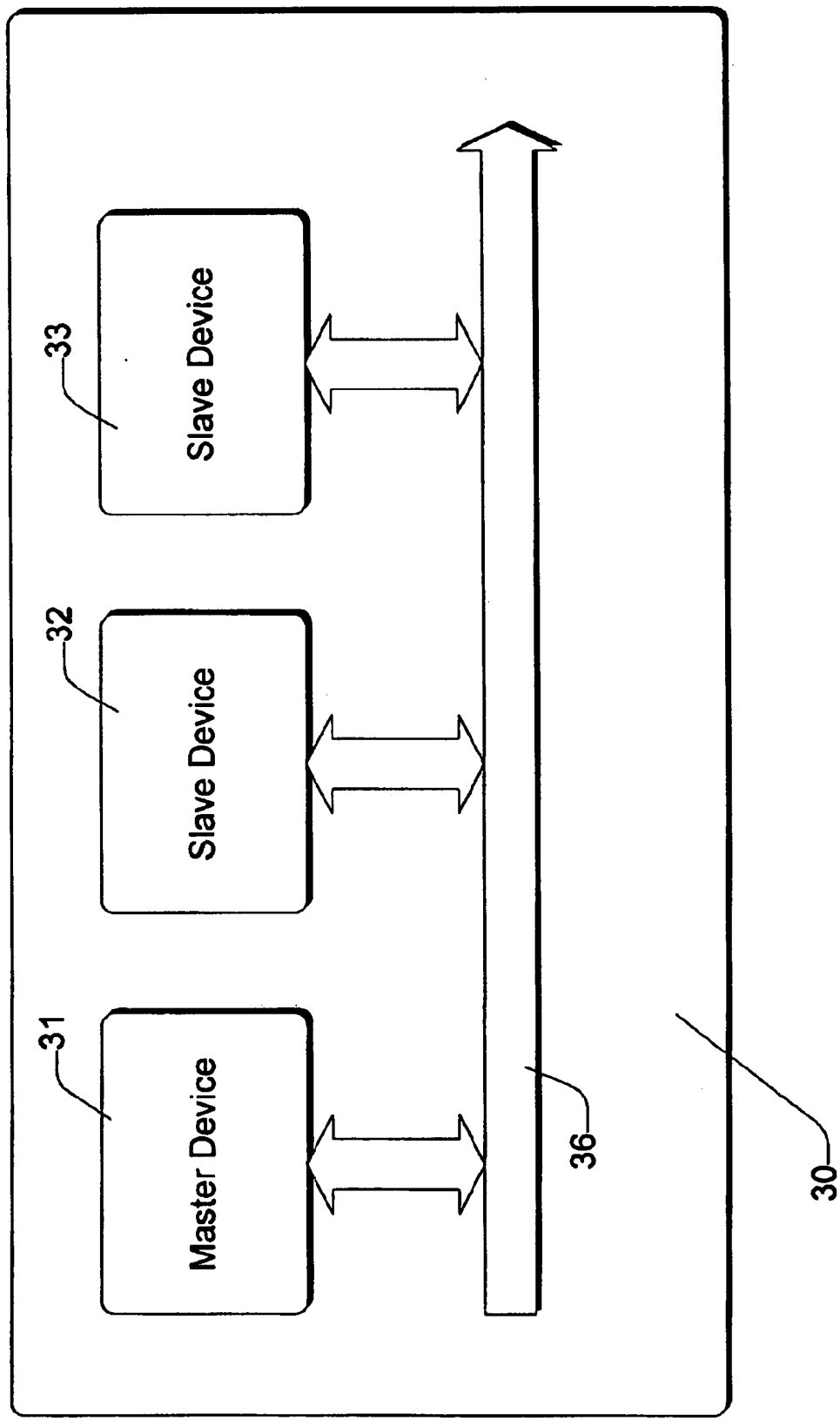
FIG. 5 is a block diagram of a high-speed bus system.

FIG. 5 shows a high-speed bus system 30. The bus system includes a number of discrete devices 31–33, which communicate over an electrical bus 36 at very high speeds. Specifically, signals driven by devices 31–33 on bus 36 have durations that are shorter than the propagation delay of the bus. This type of environment is referred to as a "wavepipelined" environment, because more than one signal can be in transit on a bus line at any given time.

The described system includes a master device 31, such as a memory controller, and a plurality of slave devices 32–33, which might comprise memory devices. The master device 31 initiates and controls data exchanges over bus 36. It is located at one end of the bus, referred to herein as the master end of the bus. Slave devices 32–33 are spaced along the remaining portions of the bus, toward its other end.

The bus can be configured in a variety of different ways. For example, bus 36 might include a shared address bus that is used for both row and column addresses. Alternatively, bus 36 might include individual buses, dedicated respectively to row and column addresses. Bus 36 also includes a data bus, which might be dedicated to only data or might be shared between data and address information. Furthermore, the data bus might be uni-directional or bi-directional. Bus 36 further includes a command bus, which again might be dedicated or shared.

The bus includes one or more input load signal lines 37 that carry input load signals. An input load signal is issued by master device 31 and received by slave devices 32–33 to initiate data access cycles such as memory read and write cycles in slave devices 32–33. As will be described in more detail below, the slave devices are responsive to the input load signal to load data at predetermined, asynchronous times following the input load signal. In the case of a read cycle, the slave devices load data from internal storage and present or enable such data on bus 36. In the case of a write cycle, the slave devices load data from bus 36.

First Embodiment

Figure 6:
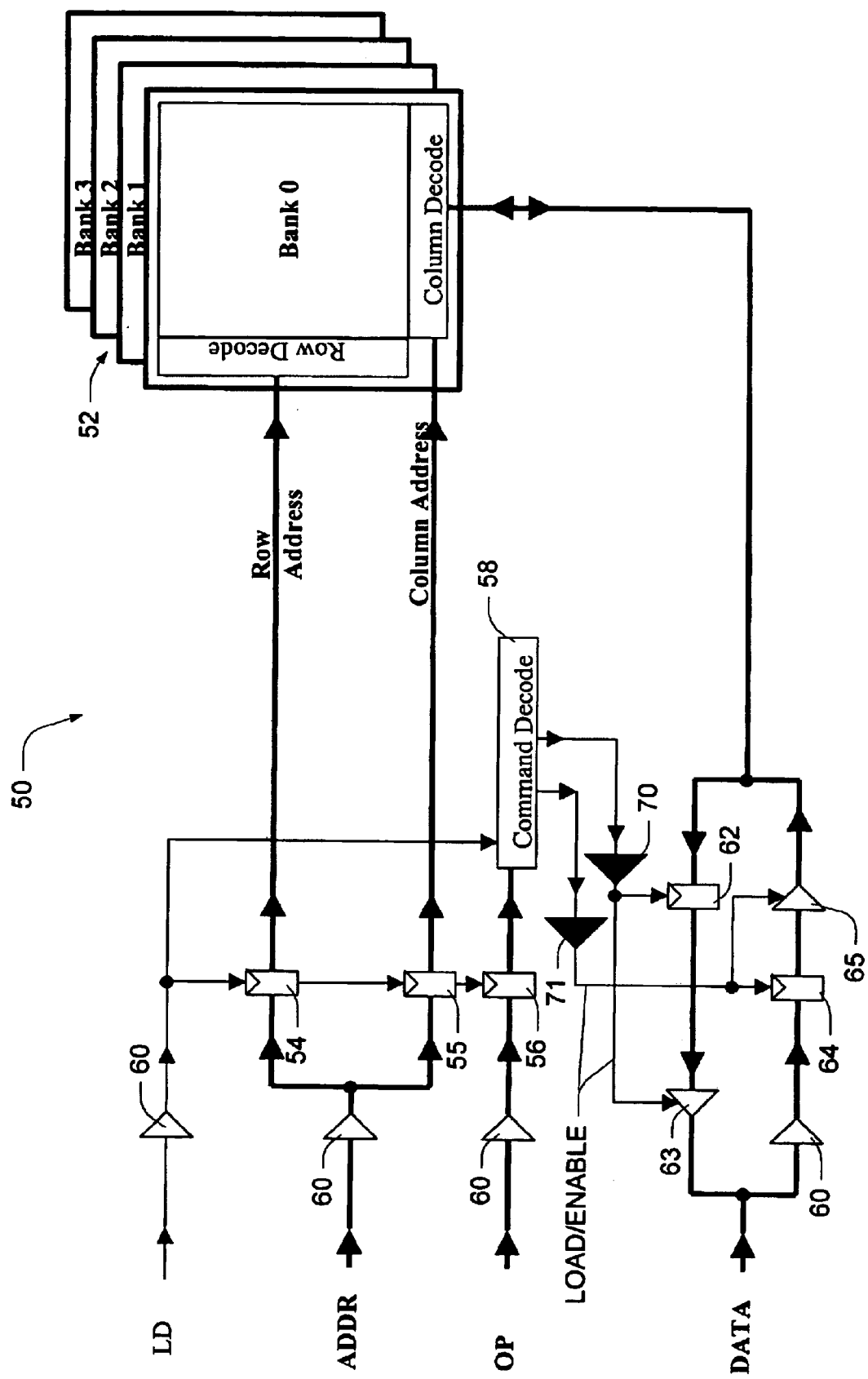
FIG. 6 is a block diagram of a first embodiment of an asynchronous, pipelined memory device.

FIG. 6 shows pertinent components of an asynchronous high-speed memory device 50 which might be used in a system such as that shown in FIG. 5, or in other types of memory systems. The architecture shown in FIG. 6 allows asynchronous data transfer while still allowing data pipelining.

This example is a DRAM, but the concepts described herein are applicable to various different kinds of volatile, non-volatile, random access, and read-only memory, including SRAM (static random access memory); flash memory; mask-programmable memory; field-programmable memory; electrically-erasable, programmable, memory; ferro-electric memory; magneto-resistive memory, etc.

Furthermore, while certain aspects of the described circuits utilize asynchronously generated signals, it is contemplated that the described asynchronous techniques might be employed in circuits that also utilize or receive periodic clock signals for certain purposes.

DRAM 50 comprises a plurality of memory arrays or banks 52, each having a plurality of memory cells, which will be referred to collectively as the memory core. This type of memory is addressable by bank, column, and row. Typically, the bank address is incorporated in the row address as the highest several bits. The banks are capable of being independently accessed.

Memory such as this is typically accessed by providing a row address, sensing all the columns of the specified row, and then accessing one or more memory columns of the sensed memory row. Column data is available only after a minimum sense time, measured from the previous sensing operation.

DRAM 50 has one or more address registers 54 and 55 that correspond to row and column addresses, respectively. An input load signal LD, also referred to as an address load signal, is received from an external source such as a memory controller, and is used to load the row and column address registers 54 and 55 from a common address bus ADDR. In addition DRAM 50 has one or more command registers 56 that load received command information from a command bus OP at a time indicated by the received LD signal. Command decoding logic 58 responds to the value loaded in command register 56 to gate signals appropriately within the device.

Data is received from a data bus, labeled DATA in FIG. 6, during write cycles. Data is provided to the DATA bus during read cycles.

Appropriate buffers 60 are provided for incoming signals.

The memory device includes a read data register 62 that is positioned to receive and latch data from core memory 52 during a memory read cycle. The output of read data register 62 passes through a read output driver 63 on its way to the DATA bus.

The memory device also includes a write data register 64 that receives data from the DATA bus and provides it to core memory 52. A write driver 65 is positioned between write data register 64 and the core memory 52.

Read data register 62 loads memory data from memory cells of core memory 52 at a time indicated by a data register load and enable signal LOAD/ENABLE. More specifically, both read data register 62 and read driver 63 are enabled in common by the LOAD/ENABLE signal. In response to this signal, read data register 62 latches any data being provided by core memory 52, and read driver 63 turns its outputs on to present read data on the DATA bus.

Write data register 64 similarly loads memory data at a time indicated by its received data register load and enable signal LOAD/ENABLE. Specifically, both write data register 64 and write driver 65 are enabled in common by the corresponding LOAD/ENABLE signal. In response to this signal, write data register 64 latches any data being provided from the DATA bus, and write driver 65 turns its outputs on. During a subsequent, independent operation, the data provided from data register 64 is loaded into memory cells of core memory 52.

The LOAD/ENABLE timing signals are created by respective asynchronous delay elements 70 and 71. Each of these elements asynchronously generates its LOAD/ENABLE signal at a predetermined time after receiving the load signal LD. More specifically, command decoding logic 58 is configured so that delay element 70, which is associated with a read operation, receives the LD signal when it is received in conjunction with a column read command from the OP command bus. Delay element 70 responds by delaying the LD signal to create a LOAD/ENABLE signal which is supplied to read data register 62. Delay element 71, which is associated with a write operation, receives the LD signal when it is received with a column write command from the OP command bus. It responds by delaying the LD signal to create a LOAD/ENABLE signal which is supplied to write data register 64.

Delay element 70 is responsive to its input signal to delay its input signal by a predetermined amount $t_{CAC}$. This time corresponds approximately to the time required from specifying a column address to the time at which the corresponding data is available from core memory 52. Delay element 71 is responsive to its input signal to delay its input signal by a predetermined amount $t_{CWR}$. This time corresponds approximately to the time required from specifying a column address to the time at which the corresponding write data loaded into register 64 and presented to the memory core 52.

Figure 7:
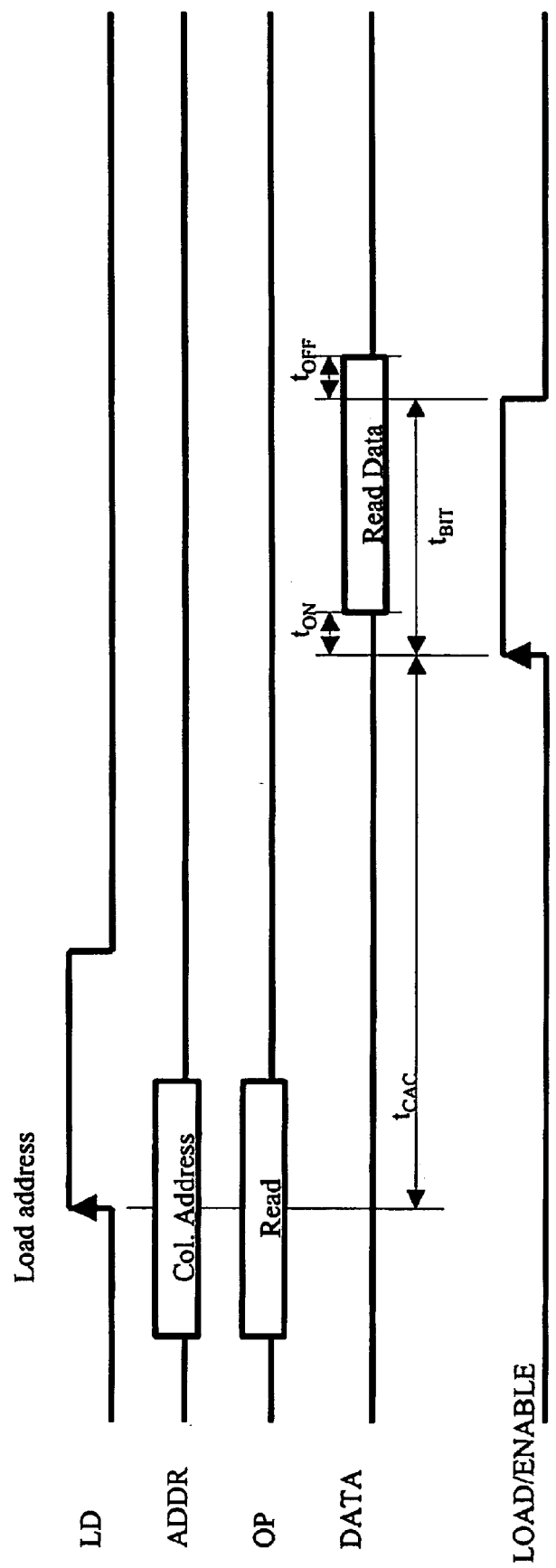
FIG. 7 is a timing diagram illustrating operation of the device of FIG. 6.

FIG. 7 shows timing details for a read cycle in the device of FIG. 6. The input load signal LD initiates the memory access cycle. Note, however, that this signal is not a periodic clock signal as in the prior art. Rather, only a single transition is utilized for any single memory operation. Subsequent actions within the memory device, including pipeline operations, are performed at asynchronously-timed intervals following the LD signal, without reference to an externally supplied clock signal.

At the rising edge of the LD signal, a received column address is loaded from address bus ADDR into column address register 55 and a read command is loaded from command bus OP into command register 56. The LD signal is passed through command decoding logic 58 and initiates a timing interval within delay element 70. After a time $t_{CAC}$, the delay element produces the LOAD/ENABLE signal, which both loads memory data from core memory 52 into read data register 62, and also enables output driver 63 (after a delay $t_{ON}$ caused by the latency of driver 63). The LOAD/ENABLE signal remains active for a time $t_{BIT}$, and then turns off driver 63 (after a delay $t_{OFF}$, again caused by the latency of driver 63). Write cycles occur with similar timing, except that data is latched from the DATA bus rather than from core memory 52.

This configuration allows the two memory operation steps, access and transport, to be performed sequentially, in a pipelined fashion. In a first stage, address and command data are loaded into first stage registers 55 and 56, and memory access is initiated. In a second stage, accessed memory data is loaded into second stage output register 62 and driven on the DATA bus for transport. A second access cycle can be initiated during the transport stage by reasserting the input load signal LD prior to completion of the first access cycle—after a time $t_{CAC}$ from the initial LD signal.

Using this architecture, pipelining is controlled with asynchronous delay elements rather than with synchronous clocking. There are two benefits to this approach. First, the delay of each pipeline stage can be adjusted differently, rather than forcing all of the delays to match an arbitrary clock period. This also reduces latency, especially in cases where the memory controller might operate at a clock cycle time that is not well matched to the pipeline stage delays of the memory.

Power reduction is a second benefit. A prior art synchronous DRAM uses registers to perform two functions: delay and information storage. Furthermore, as a single transaction passes through a synchronous DRAM, all registers must be continuously clocked. The memory device of FIG. 6, on the other hand, uses registers only for information storage. Also, a single transaction passing through this device creates only the control edges needed for that transaction.

Furthermore, as the signaling bandwidth of memory buses is increased, the clock recovery logic (delay-locked loops and phase-locked loops) that are needed for synchronous DRAMs can require circuits that are continuously on and that require a long time interval to reach their operating point. This can result in a significant power level even when no memory accesses are being performed. Turning off these circuits can result in significant added latency when an access must be started.

Second Embodiment with Additional Pipeline Element

Figure 8:
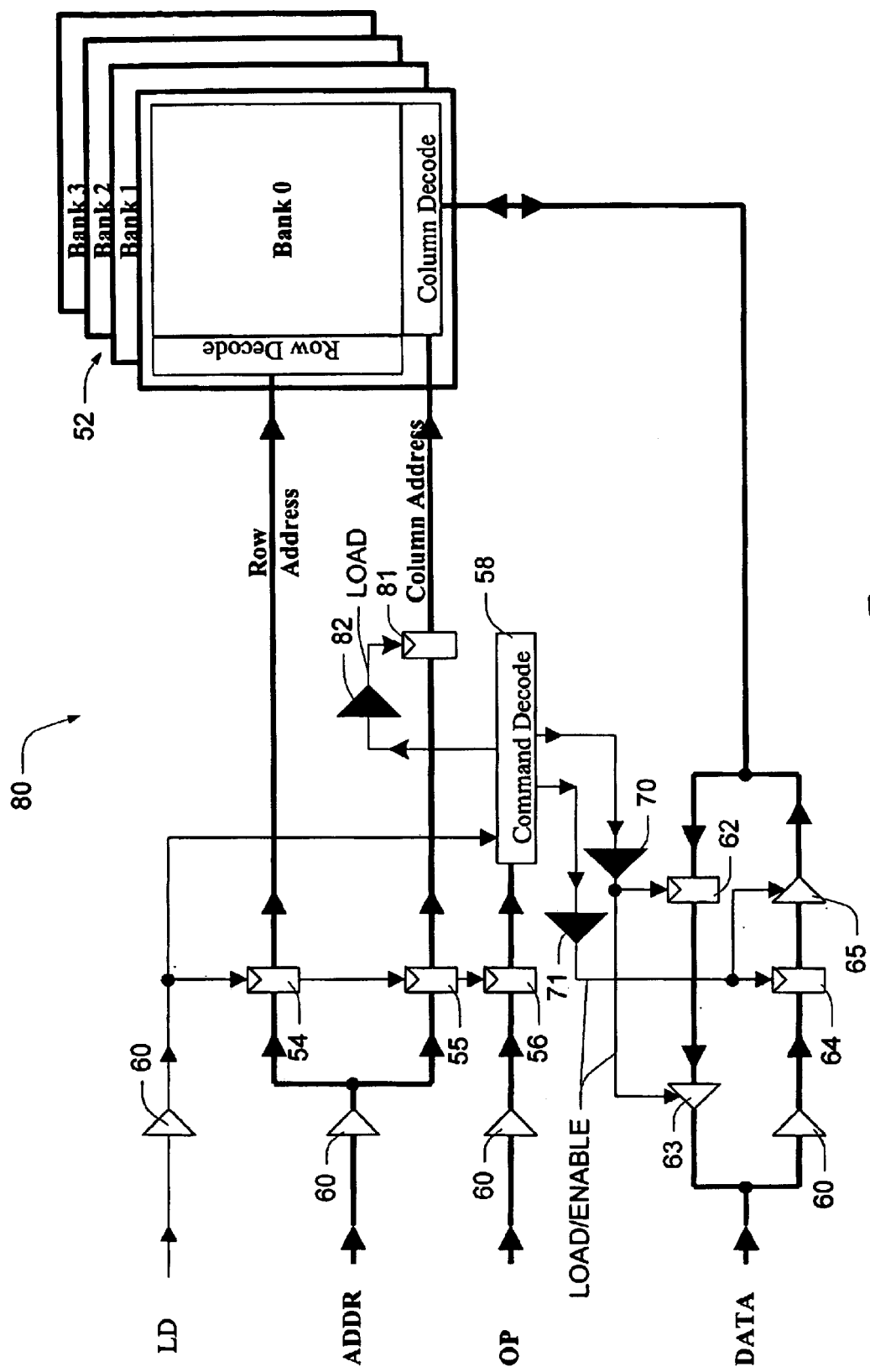
FIG. 8 is a block diagram of a second embodiment of an asynchronous, pipelined memory device.

FIG. 8 shows a different embodiment of a memory device, referenced by numeral 80. For the most part, this embodiment is identical to that of FIG. 5, and identical reference numerals have therefore been used to indicate identical elements. The difference in this embodiment is an additional stage of pipelining, relating to column addressing. Specifically, an additional address pipeline register 81 has been added between column address register 55 and memory core 52. This register is loaded by its own LOAD signal, which is derived or created by delaying the input load signal LD. Specifically, a delay element 82 receives the LD signal during operations involving column addresses, and delays the LD signal by an appropriate, predetermined amount.

Figure 9:
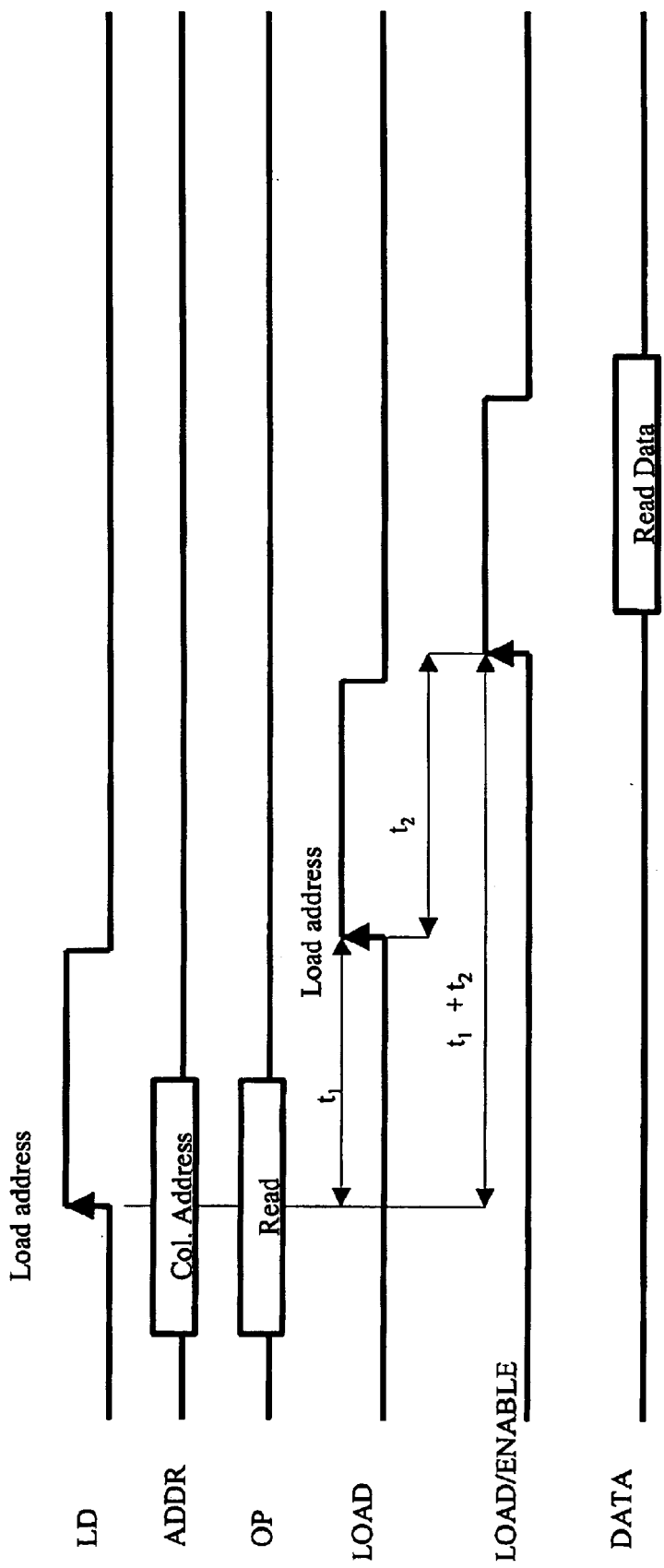
FIG. 9 is a timing diagram illustrating operation of the device of FIG. 8.

FIG. 9 shows timing for a read cycle in the embodiment of FIG. 8. The input load signal LD initiates the memory access cycle. Again, this signal is not a periodic clock but a single transition. Subsequent actions within the memory device are triggered asynchronously by the LOAD and LOAD/ENABLE signals, which are generated by asynchronous delay elements within the memory device.

At the rising edge of the LD signal, column address is loaded from address bus ADDR into column address register 55 and a read command is loaded from command bus OP into command register 56. The LD signal is passed through command decoding logic 58 and initiates a timing interval within delay element 82. After a time $t_1$, the delay element produces the LOAD signal, which loads address pipeline register 81 with the column address from address register 55. After another delay, $t_2$, produced by delay element 70, the LOAD/ENABLE signal becomes active, which loads memory data from core memory 52 into read data register 62 and enables output driver 63. Note that the LOAD/ENABLE signal in this embodiment may be created either by delaying LOAD by $t_1$, or by delaying LD by $t_1+t_2$.

Note that the LD signal, which loads addresses and initiates memory access cycles, might take forms other than the simple single-conductor voltage transition shown in the disclosed embodiments. For example, the LD signal might be derived from a combination of two or more other signals that have been logically gated to decode memory access events.

The advantage of this embodiment is the presence of the additional pipeline stage, which allows a higher degree of overlapped operations. In this embodiment, a subsequent memory operation can be initiated sooner than in the embodiment of FIG. 6—at time $t_1$, when the LOAD signal transitions. If desired, additional address pipeline stages can be utilized to provide even higher bus utilization.

This embodiment, and the more complex embodiments that follow, demonstrate the general concept of a memory device having a plurality or sequence of pipeline registers or elements that are asynchronously signaled and loaded, in a predetermined sequence, to complete memory access cycles. In the embodiment of FIG. 6, such pipeline elements relate to both addresses and data, including address registers 54 and 55, command register 56, read data register 62, and write data register 64. In the embodiment of FIG. 8, the pipeline elements include an additional address pipeline register 81.

In the prior art, pipeline elements are generally signaled or strobed by a periodic clock signal, with the disadvantages that have already been noted. In the embodiments described herein, however, a memory cycle is initiated with a single input load signal. Timing logic, including a plurality of delay elements, is responsive to the input load signal to produce a corresponding sequence of asynchronously timed register load signals. This sequence of load signals is utilized to load the various pipeline elements in the proper sequence, with the proper timing.

Delay Elements

The various load signals to the pipeline elements are produced by corresponding delay elements. In the described embodiments, a plurality of delay elements are designed within a single integrated circuit to have matching delays, and individual delay elements are grouped or aggregated to produce delays of different lengths. For example, individual delay elements might be designed to have a delay $t_d$. Multiples of $t_d$ are then obtained by chaining a plurality of individual delay elements.

For high-speed operations, it is desirable to calibrate the individual delay elements as precisely as possible. Such calibration allows external devices, such as memory controllers, to communicate in synchronization with the advance of data through the pipeline elements of the memory device.

FIG. 10 shows a plurality of matching delay elements 90 such as are preferably used in the embodiments of FIGS. 6 and 8. Each delay element receives an input signal 91 and in response produces an output signal 92. The output signal is similar or identical to the input signal, except that the output signal is delayed by a time $t_d$. Each delay element is identically constructed within the integrated circuit, so that each delay element will produce a nearly identical delay $t_d$.

The time $t_d$ is preferably changeable in response to a delay value that is either generated internally to the memory device or received from a source external to the memory device. More specifically, each delay element 90 is responsive to a delay adjustment signal 93. This common signal is provided to all of the matching delay elements. As a result, the delay elements are collectively adjustable, to produce individual matching delays. Such delays are asynchronous—in the described embodiments, the delays are not necessarily aligned to any received clock signal.

The memory device includes delay setting logic 94 that sets and calibrates the delays of the delay elements. Delay setting logic 94 receives a signal 95 that indicates a delay value. In response to the supplied delay value, delay setting logic 94 sets its delay adjustment output 93 to an appropriate value or level, so that each of the delay elements 90 provides the desired signal delay between its input and its output.

Delay setting logic 94 preferably uses a feedback loop to calibrate its delay adjustment output, and to in turn calibrate the delay elements 90. Specifically, one of the delay elements 90a is dedicated for use as a calibration element. Delay setting logic 94 generates a signal at the input of calibration delay element 90a, and monitors the resulting output from element 90a to determine the actual delay resulting from the delay adjustment value 93. Based on this determination of the actual delay, delay setting logic 94 varies its delay adjustment output signal 93 until the desired delay value $t_d$ is obtained through element 90a. Because the delay elements are all similar in design and implementation, calibrating one of the delay elements ensures that all of them are similarly calibrated.

The delay value 95 can be generated by an internal source such as a capacitive circuit or other type of circuit that is capable of generating a precise reference interval. More desirably, the delay value is generated externally to the memory device, so that the internal delays of the memory device can be synchronized with operations of an external device such as a memory controller.

The delay value 95 can be supplied to delay setting logic 94 in various forms, but is preferably supplied as a pair of signals or timing events that are separated in time by the actual desired delay. For example, the delay value can be specified as the time between two voltage edges on a single input conductor, or as the time between two signal edges on a pair of conductors. Alternatively, the delay value might be specified as two relatively timed events on an input conductor that is normally used for some other purpose, such as a conductor that is normally part of the address, data, or command bus, or a conductor that normally carries the input load signal. The delay value might also be encoded on one or more conductors such as the conductors that normally form part of the address, data, or command bus.

A calibration process, which utilizes the feedback of delay element 90a, is preferably performed at regular intervals, to account for variations in temperature and voltage of the memory device. When timing events are supplied by an external source, it is desirable to provide such events on a periodically repeating basis for periodic recalibration. As will become more apparent in the more detailed discussion below, it is desirable to provide periodic bursts of such timing events for recalibration purposes. Such bursts can be provided concurrently with memory access cycles. However, it is not necessary for the timing signals to accompany individual memory cycles. Furthermore, the timing signals can be asynchronous to other signals used within the memory device.

FIG. 11 shows a configuration of delay elements for use in a memory device having three pipeline stages. In this example, each successive stage is loaded at a successive delay from the cycle initiation signal LD. A first delay block 96 has a single one of delay elements 90 to produce a first delayed load signal to load the first stage of the pipeline. A second delay block 97 contains a pair of serially connected delay elements 90 to produce a second delayed load signal to load the second stage elements of the pipeline. A third delay block 98 contains three serially connected delay elements 90 to produce a third delayed load signal to load the third pipeline stage. Although not shown, each of the delay elements 90 is connected to be calibrated by a delay adjustment signal 93, as shown in FIG. 10.

Figure 12:
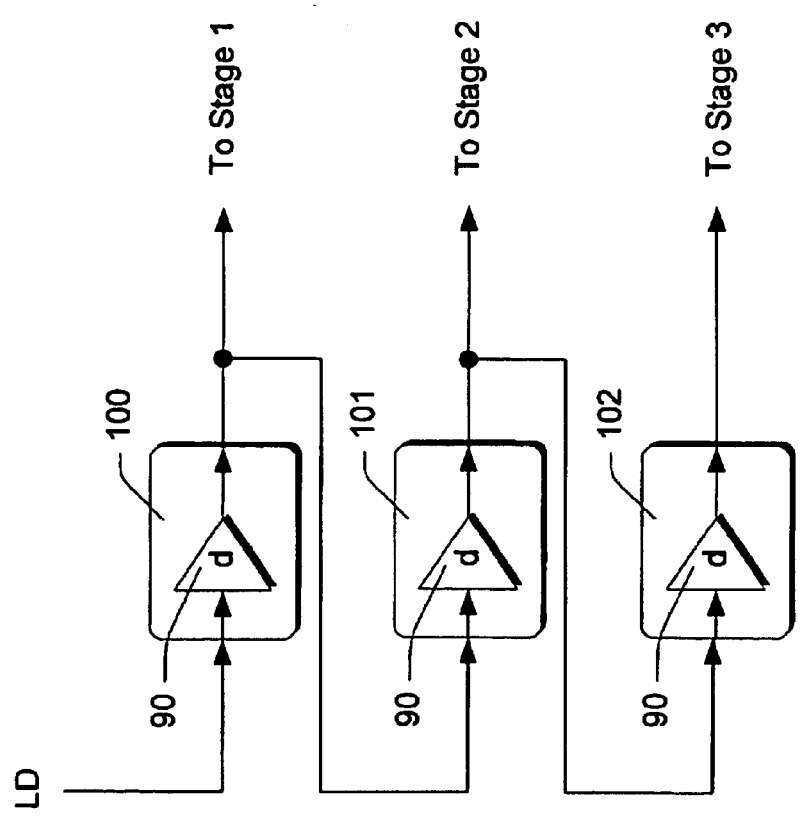
FIG. 12 is a block diagram showing another configuration of delay elements for use in the embodiments described herein.

FIG. 12 shows an alternative configuration of delay elements, again for use in a memory device having three pipeline stages. In this case, each successive pipeline load signal is derived from the previous one. This configuration includes three delay blocks 100, 101, and 102, which produce load signals corresponding respectively to the three device pipeline stages. The first delay block 100 is responsive to the cycle initiation signal LD. The second delay block 101 is responsive to the output of the first delay block 100. The third delay block 102 is responsive to the output of the second delay block 101.

In certain situations, it may be desirable to be able to configure, after device manufacture, the timing within a pipelined device such as described above to vary the time at which data is loaded within various pipeline stages. In the embodiment of FIG. 6, for example, it might be desirable to configure the predetermined time $t_{CAC}$ from the LD signal to the LOAD/ENABLE signal. This might be important to ensure that read data returns to a memory controller after a fixed delay from when the read address is first transmitted, regardless of how far the memory component is located from the controller. If, for example, there were two ranks of memory devices present on the memory bus, the closer rank would be programmed with enough extra delay to compensate for the longer round trip flight time to the further rank. When a controller issued a read address to either rank, the read data would appear at the same absolute time at the controller pins.

Figure 13:
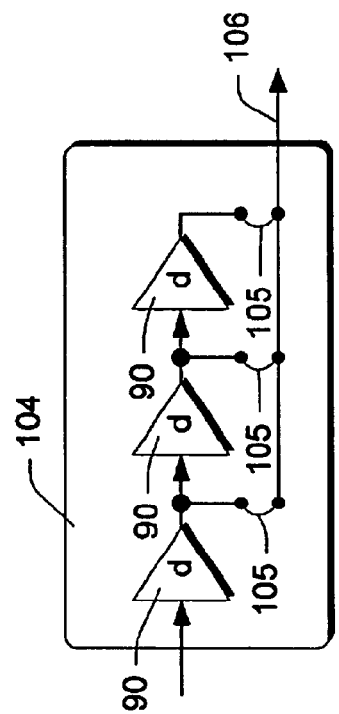
FIG. 13 shows a memory delay block that can be configured after device manufacture to change its delay.

FIG. 13 shows a memory delay block 104 that can be configured after device manufacture to change its delay. This delay block contains three delay elements 90 connected in series. In addition, fusible links 105 connect the output of each delay element 90 to a block output 106. Prior to use, two of fusible links 105 are broken using conventional techniques such as by applying voltage to appropriate points of the memory device. Depending on which of the links are broken, a fixed delay of either $t_d$, $2t_d$, or $3t_d$ can be selected as a block delay.

A delay block such as the one shown in FIG. 13 can be used at various places in a an asynchronous pipeline design, to provide any desired configurability in the delays employed between pipeline stages. Note that mechanisms other than fusible links might be used to provide such selectivity, such as multiplexers, control registers, non-volatile memory, etc. The embodiment described below with reference to FIGS. 15–38, for example, uses a multiplexer to provide programmable delays between pipeline stages.

Third Embodiment with Received Data Register Load

Figure 14:
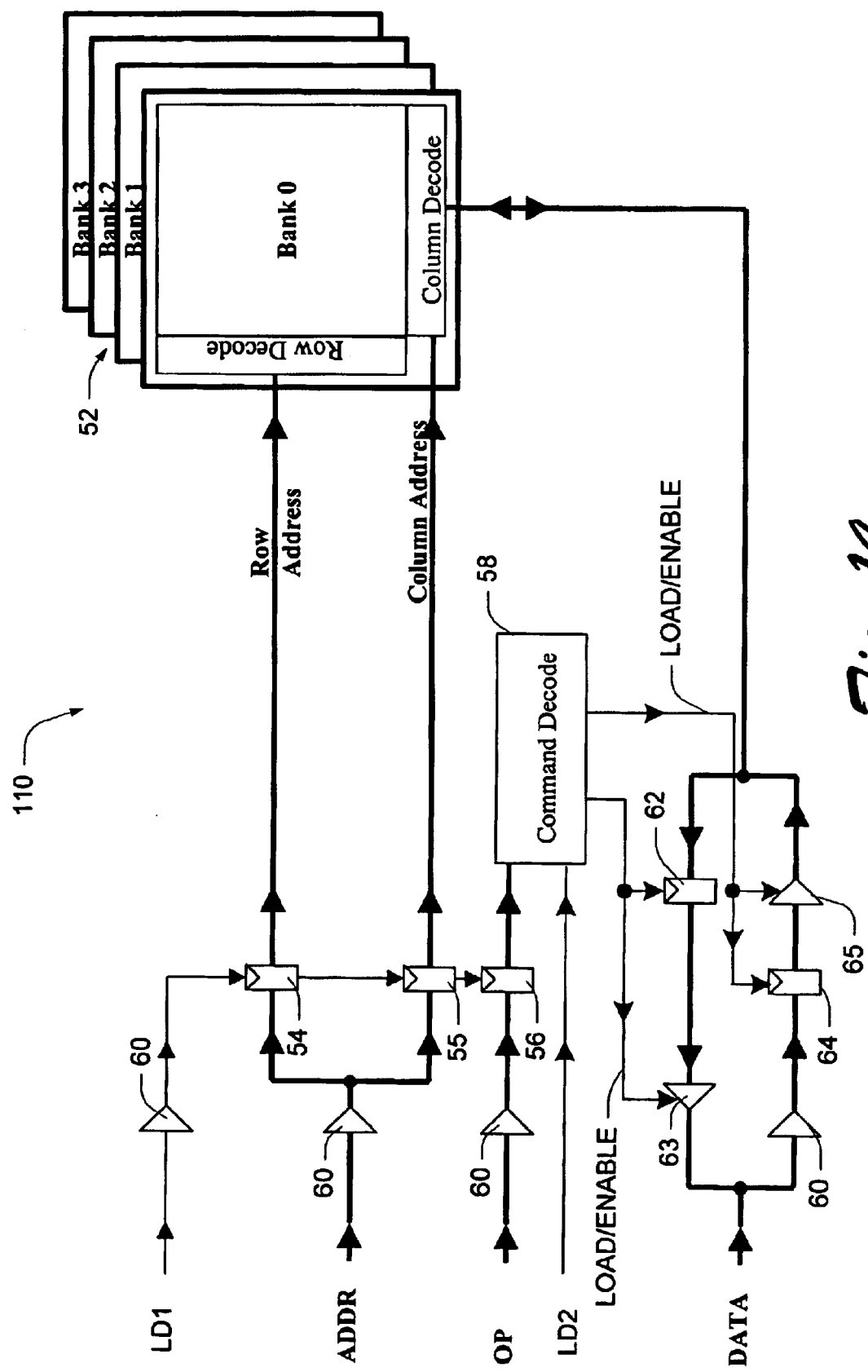
FIG. 14 is a block diagram of a third embodiment of an asynchronous, pipelined memory device.

FIG. 14 shows yet another embodiment of an asynchronous memory device, referenced by numeral 110. For the most part, this embodiment is identical to that of FIG. 6, and identical reference numerals have therefore been used to indicate identical elements. The difference in the embodiment of FIG. 14 is that the delay elements have been omitted. Instead, DRAM 80 accepts two externally-supplied input load signals: LD1 and LD2. First input load signal LD1 is the same as the single LD signal of FIG. 5: it loads addresses into address registers 54 and 55, and loads a command into register 56.

Second input load signal LD2, also referred to herein as a data register load signal, is used in place of the delay element outputs. The memory controller, which generates LD2, has its own timing elements that delay LD2 relative to LD1. During a read cycle, LD2 is gated to form a LOAD/ENABLE signal that loads read data register 62. Output driver 63 is responsive to this LOAD/ENABLE signal to present read data on the DATA bus. During a write cycle, LD2 is gated to form a LOAD/ENABLE signal that loads write data register 64 and enables driver 65. Timing details are similar to what is shown in FIG. 7.

Fourth Embodiment

FIGS. 15–38 show pertinent details of a further embodiment of a high-speed, asynchronous, pipelined memory device. This device is designed for a high-speed bus environment in which signals are driven on bus lines for durations that are shorter than the propagation delays of the bus lines themselves. Such systems are referred to as "wave-pipelined" systems, because more than one data signal can be in propagation on a signal line at any given time. As in the embodiments already discussed, this embodiment allows a form of address and data pipelining in which data and address transfers within the device, including reads and writes of memory cells, are timed asynchronously following a received memory access initiation signal such as an input load signal.

Address Interfacing Logic

Figure 15:
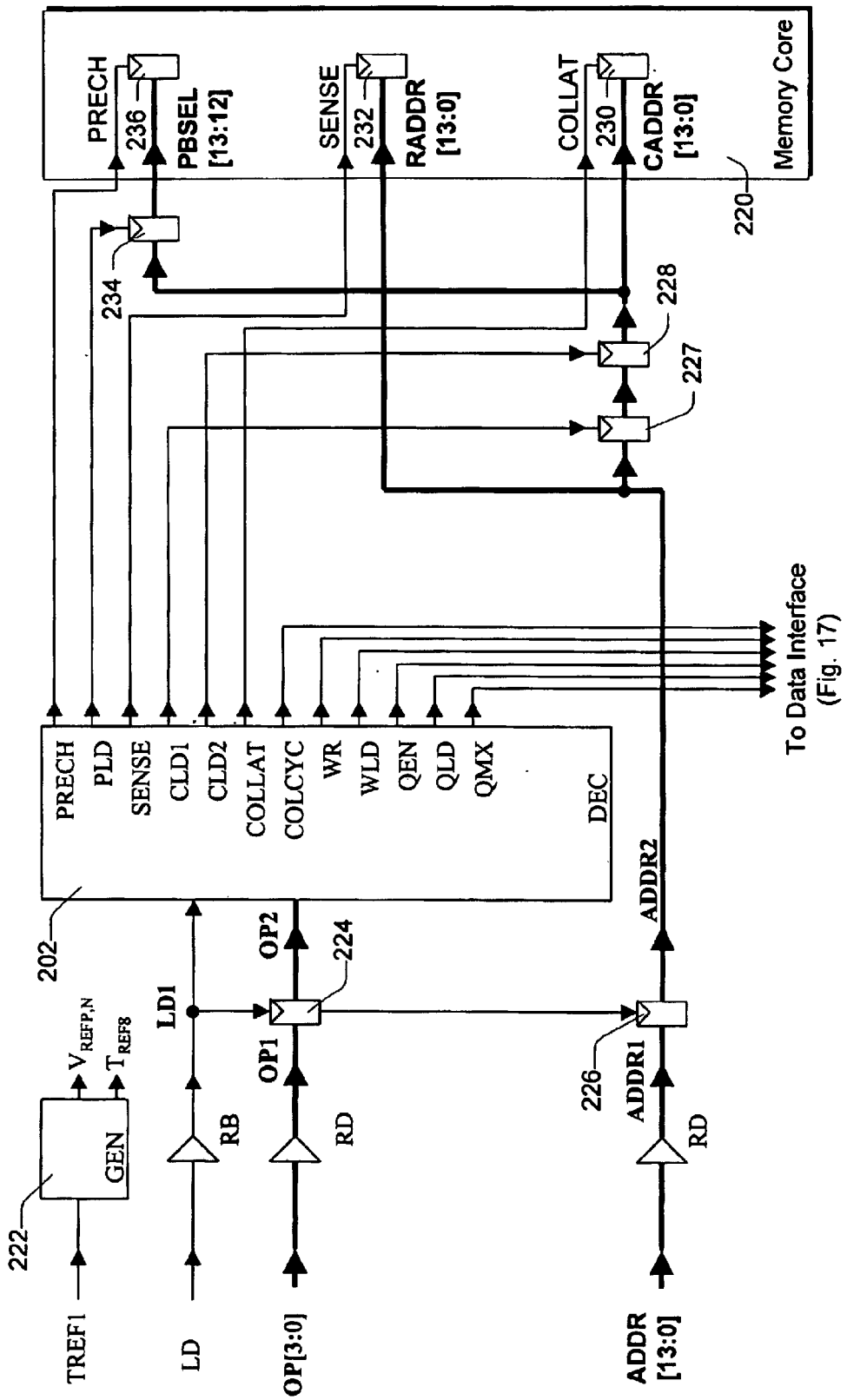
FIG. 15 is a block diagram showing address interfacing logic for a fourth embodiment of an asynchronous, pipelined memory device.

FIG. 15 shows details of address interfacing logic for an asynchronous, high-bandwidth DRAM using calibrated timing elements. Memory core is shown on the right, referenced by numeral 220.

On the left side of the FIG. 15 are interface signals that connect to external components. These signals include:

TREF1 is a time reference signal. The interval between successive rising edges of this signal defines a time interval which is used by a calibration circuit 222 to calibrate delay elements within the memory device. The delay elements, in turn, are used to create precise timing intervals for pipeline control signals. The calibration circuit 222, also referred to as a timing and voltage reference generator GEN, generates reference voltages $V_{REFP}$, $V_{REFN}$, and $V_{REFS}$, which are used to adjust the delays of the delay elements. Calibration circuit 222 will be described in more detail with reference to FIGS. 20–23.

ADDR[13:0] is a 14 bit address bus input that receives bank, row, and column addresses.

OP[3:0] is a four-bit command bus. It specifies a memory access operation such as a read or write operation.

LD is an input load signal. Its rising edge causes the OP bus to be loaded into a command register 224, and causes the ADDR input bus to be loaded into address register 226. Its rising edge also generates pulses on control signals to perform memory access operations.

The LD, OP, and ADDR signals are received by input receiver blocks and buffers, labeled RB and RD. These blocks provide signal buffering and also impose uniform calibrated delays on the signals to ensure that the signals maintain their initial time relationships to each other. There are two versions: RB and RD. The RB is used for signals which need to drive relatively large loads. The RD is used for signals which need to drive relatively small loads. The specific design of the RB and RD blocks is discussed with reference to FIGS. 26 and 27.

The command bus supports the following operations in this simplified example:

| OP[3] | OP[2] | OP[1] | OP[0] | Command |
|-------|-------|-------|-------|---------|
| 0 | 0 | 0 | 0 | reserved |
| 0 | 0 | 0 | 1 | activate (ACT) |
| 0 | 0 | 1 | 0 | reserved |
| 0 | 0 | 1 | 1 | reserved |
| 0 | 1 | 0 | 0 | read (RD) |
| 0 | 1 | 0 | 1 | write (WR) |
| 0 | 1 | 1 | 0 | read and automatic pre-charge (RDA) |
| 0 | 1 | 1 | 1 | write and automatic pre-charge (WRA) |
| 1 | x | x | x | no operation |

An actual DRAM product would include a richer set of operations. However, the set shown above is sufficient to demonstrate an implementation of the basic transactions for the asynchronous DRAM interface.

The ACT command accesses a row in the DRAM core 220, sensing it and storing it in the sense amplifier latches. The RD and RDA commands read a column of information (32 bits in this example design) from the sensed row. The WR and WRA commands write a column of information (32 bits) into the sensed row. The RDA and WRA commands also cause the accessed row to be pre-charged at the end of the column operation.

ADDR receives bank and row addresses for the ACT command, or bank and column addresses for the read and write commands. This design example includes two bits (ADDR[13:12]) for selecting one of four independent memory core banks. The ADDR[11:0] bits contain the row address or the column address, depending on the type of memory operation.

This example includes a sequence of address registers that receive addresses and that advance the addresses through the address registers in response to generated sequences of asynchronously timed register load signals. The memory core is responsive to the addresses after they have advanced through this sequence of address registers.

A first stage of address pipelining is supported by address register 226, which loads ADDR on the rising edge of LD1. Subsequent pipeline registers 227 and 228 receive successively delayed versions of column addresses (CLD1 and CLD2), and a final stage is supported in memory core 220 by an address register 230, which is loaded by another delayed version of the LD1 signal (COLLAT).

Row addresses and column addresses are handled differently. A row address is received along with the LD signal, and initially loaded by the LD1 signal in the first address pipeline register 226. A SENSE signal is generated by delay elements in response to the LD1 signal, at a predetermined time following the LD1 signal (see detailed timing below). The row address is received from first stage address register 226 by a memory core register 232, where the row address is loaded by the SENSE signal. Bank addresses for an automatic precharge operation (from a RDA or WRA command) are received from third stage address register 228 and are loaded into a bank address register 234 by yet another delayed version of LD1 (PLD). From there, the precharge operation's bank address is loaded by another delayed version of LD1 (PRECH) into the core's bank select register 236.

The described pipelined memory device includes memory timing or access logic 202 that is responsive to the input load signal LD1 and to the supplied 4-bit operation code to generate the delayed versions of LD1 mentioned above, and to thereby control the flow of information through the various pipeline registers shown in FIG. 15. Stated generally, timing logic 202 contains a plurality of delay elements that produce corresponding timing signals in response to the LD1 signal. These timing signals, and others that are used in a data interface to be described below, are responsible for the precise timing of the different operations. They use calibration logic to insure that the asynchronous timing of the different intervals is accurate enough to support very high transfer bandwidths. These signals take the place of a clock in a conventional synchronous DRAM.

Specifically, timing logic 202 generates the following signals:

PRECH is a load signal. Its rising edge causes the PBSEL[13:12] bus to be loaded into a register 236. Its rising edge also initiates a pre-charge operation in core 220.

PBSEL[13:12] contains the bank address for a pre-charge operation that is scheduled after a column access.

SENSE is a load signal. Its rising edge causes the RADDR[13:0] bus to be loaded into a register 232. Its rising edge also initiates an activate operation in core 220.

RADDR[13:0] contains the bank address and row address for an activate operation.

COLLAT is a load signal. Its rising edge causes the CADDR[13:0] bus to be loaded into a register 230. Its rising edge also initiates a column access operation in core 220.

CADDR[13:0] contains the bank and column address for a column access.

PLD, CLD1, and CLD2 are load signal that are used in conjunction with pipeline address registers 234, 227, and 228 to load successively delayed versions of the address bus ADDR.

The remaining signals, COLCYC, WR, WLD, QEN, QLD, and QMX are used in the data interface portion of the memory device, and will be described below with reference to FIG. 17.

Registers 224, 226, 227, 228, and 234 each include a buffer for driving the load presented by the internal logic and wiring. The delay of these registers and buffers are masked by longer delays of control signals, so no timing calibration logic is used here.

The following table sets for exemplary timing parameters for the device of FIGS. 15–38. These are nominal values, listed so that the sequencing of memory operations will be clear, and are not intended to be limiting in any sense—actual values will be dependent upon the implementation details of the particular memory device. The descriptions in some cases refer to a "D" cell. A "D" cell is a delay element having a standard, calibrated delay of $t_D$. Most delays within the memory device are multiples of $t_D$, and are created by chaining a plurality of "D" cells.

| Parameter | Value | Description |
|---|---|---|
| $t_{RC}$ | 60 ns | Minimum time for successive activate operations to the same bank |
| $t_{RR}$ | 20 ns | Minimum time for successive activate operations to different banks |
| $t_{RP}$ | 15 ns | Minimum time between activate and pre-charge operations to the same bank |
| $t_{CC}$ | 10 ns | Minimum time for successive column operations to a bank |
| $t_{OP}$ | 5 ns | Minimum time for successive commands on the OP bus |
| $t_{BIT}$ | 2.5 ns | Minimum time to transport a bit on the DQ, DM, DQS pins |
| $t_Q$ | 2 ns | Maximum time from load signal to output data valid for a register |
| $t_S$ | 1 ns | Minimum time for a register input to be valid prior to a load signal for a register |
| $t_H$ | 1 ns | Minimum time for a register input to be valid after a load signal for a register |
| $t_{WROFF}$ | 5 ns | Maximum interval (either direction) between the rising edges of LD and DQS for WR |
| $t_{CSH}$ | 20 ns | Minimum interval between rising edges of SENSE and COLLAT |
| $t_{CLS}$ | 5 ns | Minimum interval between rising edges of COLLAT and COLCYC |
| $t_{RCD}$ | 25 ns | Minimum interval between rising edges of SENSE and COLCYC |
| $t_{DAC}$ | 7.5 ns | Maximum interval from rising edge of COLCYC to valid read data |
| $t_{DOH}$ | 2.5 ns | Minimum interval from rising edge of COLCYC to valid read data |
| $t_{CPS}$ | 20 ns | Minimum interval between falling edge of COLCYC and rising edge of PRECH |
| $t_d$ | 0.25 ns | Nominal delay of inverter pair in "d" cell (adjustable) |
| $t_D$ | 1.25 ns | Nominal delay of four inverter pairs and buffer in "D" cell (adjustable) |
| $t_X$ | 1.25 ns * X | Nominal delay of "$N_X$" copies of the "D" cell: $t_X = N_X * t_D$ |
| $t_{REF}$ and $t_{REF1}$ | 10 ns | Nominal delay of "$N_{REF}$" copies of the "D" cell: $t_{REF} = N_{REF} * t_D$ and $N_{REF} = 8$ |
| $t_{TOT}$ | 2.50 ns | Nominal delay of "$N_{TOT}$" copies of the "D" cell: $t_{TOT} = N_{TOT} * t_D$ and $N_{TOT} = 2$ |
| $t_{DEC}$ | 1.25 ns | Nominal delay of "$N_{DEC}$" copies of the "D" cell: $t_{DEC} = N_{DEC} * t_D$ and $N_{DEC} = 1$ |
| $t_{LIM}$ | 1.25 ns | Nominal delay of "$N_{LIM}$" copies of the "D" cell: $t_{LIM} = N_{LIM} * t_D$ and $N_{LIM} = 1$ |
| $t_{EXP}$ | 5.00 ns | Nominal delay of "$N_{EXP}$" copies of the "D" cell: $t_{EXP} = N_{EXP} * t_D$ and $N_{EXP} = 4$ |
| $t_{EXP2}$ | 6.25 ns | Nominal delay of "$N_{EXP2}$" copies of the "D" cell: $t_{EXP2} = N_{EXP2} * t_D$ and $N_{EXP2} = 5$ |
| $t_{REP2}$ | 5.00 ns | Nominal delay of "$N_{REP2}$" copies of the "D" cell: $t_{REP2} = N_{REP2} * t_D$ and $N_{REP2} = 4$ |
| $t_{REP4}$ | 2.50 ns | Nominal delay of "$N_{REP4}$" copies of the "D" cell: $t_{REP4} = N_{REP4} * t_D$ and $N_{REP4} = 2$ |

Figure 16:
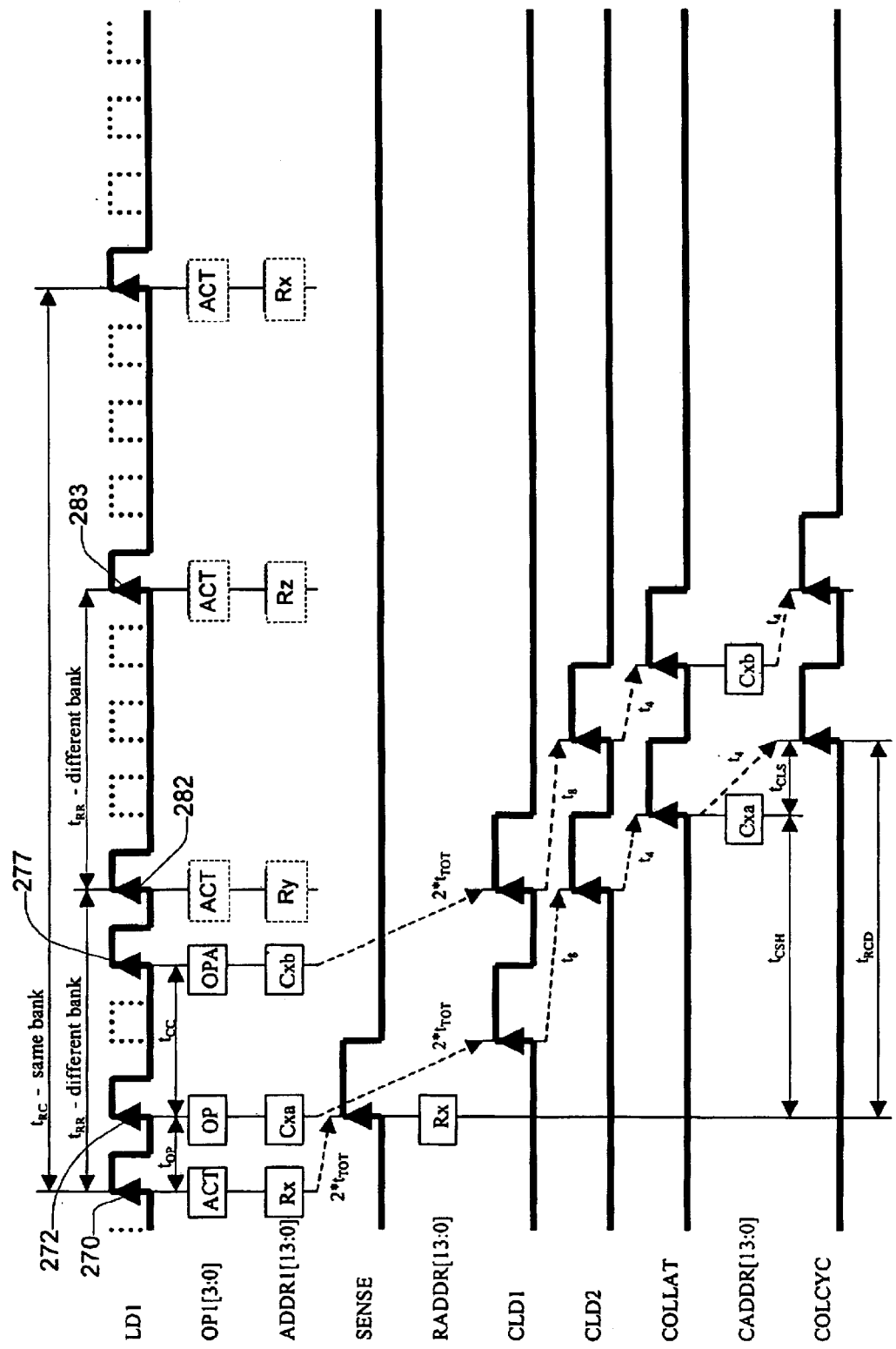
FIG. 16 is a timing diagram illustrating operation of the components shown in FIG. 15.

FIG. 16 shows the timing of the signals shown in FIG. 15. The LD1 signal dictates the pace of activities in the asynchronous DRAM, somewhat like the clock signal of a synchronous DRAM. Various load signals are simply delayed versions of LD1. Thus, unlike a clock, only one edge of the LD1 signal is needed or used to initiate the requested operation; all subsequent edges that are needed for the operation are generated from the single LD1 edge. In a synchronous DRAM, more than one clock edge is applied to move the operation from one pipeline stage to the next.

A synchronous controller will probably generate the LD1 signal (and the other input signals). As a result, they will probably have an underlying regularity, and this is shown in FIG. 16. However, the asynchronous interface would work just as well if the LD1 edges were issued in an irregular fashion, provided that the minimum values of timing parameters for the memory core and interface were met.

A first LD1 edge 270, in conjunction with an ACT command on the OP1 bus, initiates an activate operation. Along with the ACT command, a bank and row address Rx is presented on the ADDR1 bus. The rising edge 270 of LD1 loads the bank and row address into first-stage address register 226 and loads the ACT command into register 224. The LD1 edge is delayed a time $2*t_{TOT}$, and then causes an edge on the SENSE signal. This loads the Rx address into core register 232 and starts the activate operation. No further activity occurs in the interface for this operation.

In this figure and subsequent figures, delays caused by delay elements are indicated by dashed lines from the event initiating the delay to the event resulting from the delay. In FIG. 16, for example, a dashed line is shown from the leading edge 270 of LD1 to the leading edge of the SENSE signal. This indicates that the SENSE signal is generated at a predetermined, asynchronous time after the leading edge of LD1. The time is indicated alongside the dashed line, in this case $2*t_{TOT}$. Except where noted, these delays are implemented with collectively calibrated delay elements such as discussed with reference to FIGS. 10–13, and such as will be discussed in more detail below with reference to FIGS. 24 and 25.

A second LD1 edge 272 (received from the memory controller), in conjunction with an OP (RD or WR) command on the OP1 bus, initiates a column access operation. It is presented at a time top after the first LD1 edge. Along with the OP command, a bank and column address Cxa is presented on the ADDR1 bus. The second LD1 edge is delayed a time $2*t_{TOT}$, and then causes an edge on the CLD1 signal. This loads the Cxa address into second-stage pipeline register 227. The CLD1 edge is delayed an additional time $t_8$, and then causes an edge on the CLD2 signal. This moves the Cxa from the pipeline register 227 into the third-stage pipeline register 228. The CLD2 edge is delayed an additional time $t_4$, and then causes an edge on the COLLAT signal. This moves the Cxa from pipeline register 228 into the fourth-stage register 230 in the DRAM core. The COLLAT edge is delayed an additional time $t_4$, and then causes an edge on the COLCYC signal. This signal controls data transport to and from the DRAM core, and will be discussed further with reference to FIG. 17.

A third LD1 edge 277, in conjunction with an OP (RD or WR) command on the OP1 bus, initiates a second column access operation. This leading edge is presented a time $t_{CC}$ after the second LD1 edge 272. Again, a bank and column address Cxb is presented on the ADDR1 bus. The third LD1 edge 277 is delayed a time $2*t_{TOT}$, and then causes an edge on the CLD1 signal. This loads the Cxa address into second-stage pipeline register 227. The CLD1 edge is delayed an additional time $t_8$, and then causes an edge on the CLD2 signal. This moves the Cxa from the pipeline register 227 into the third-stage pipeline register 228. The CLD2 edge is delayed an additional time $t_4$, and then causes an edge on the COLLAT signal. This moves the Cxa from pipeline register 228 into the fourth-stage register 230 in the DRAM core. The COLLAT edge is delayed an additional time $t_4$, and then causes an edge on the COLCYC signal. This signal controls data transport to and from the DRAM core, and will be discussed further with reference to FIG. 17.

Note that other transactions could be presented to the DRAM while this first transaction is being processed. On the fourth and fifth LD1 edges 282 and 283, for example, ACT commands are directed to other banks in the DRAM. In this embodiment, these commands must be given a time $t_{RR}$ or more after the first ACT command. An ACT command directed to the first bank must be given a time $t_{RC}$ or more after the first ACT command.

Note also that there are several timing constraints imposed upon the timing of the COLLAT and COLCYC signals by the DRAM core. In particular, they must be issued a time $t_{CSH}$ and a time $t_{RCD}$, respectively, after the SENSE signal.

Data Interfacing Logic

Figure 17:
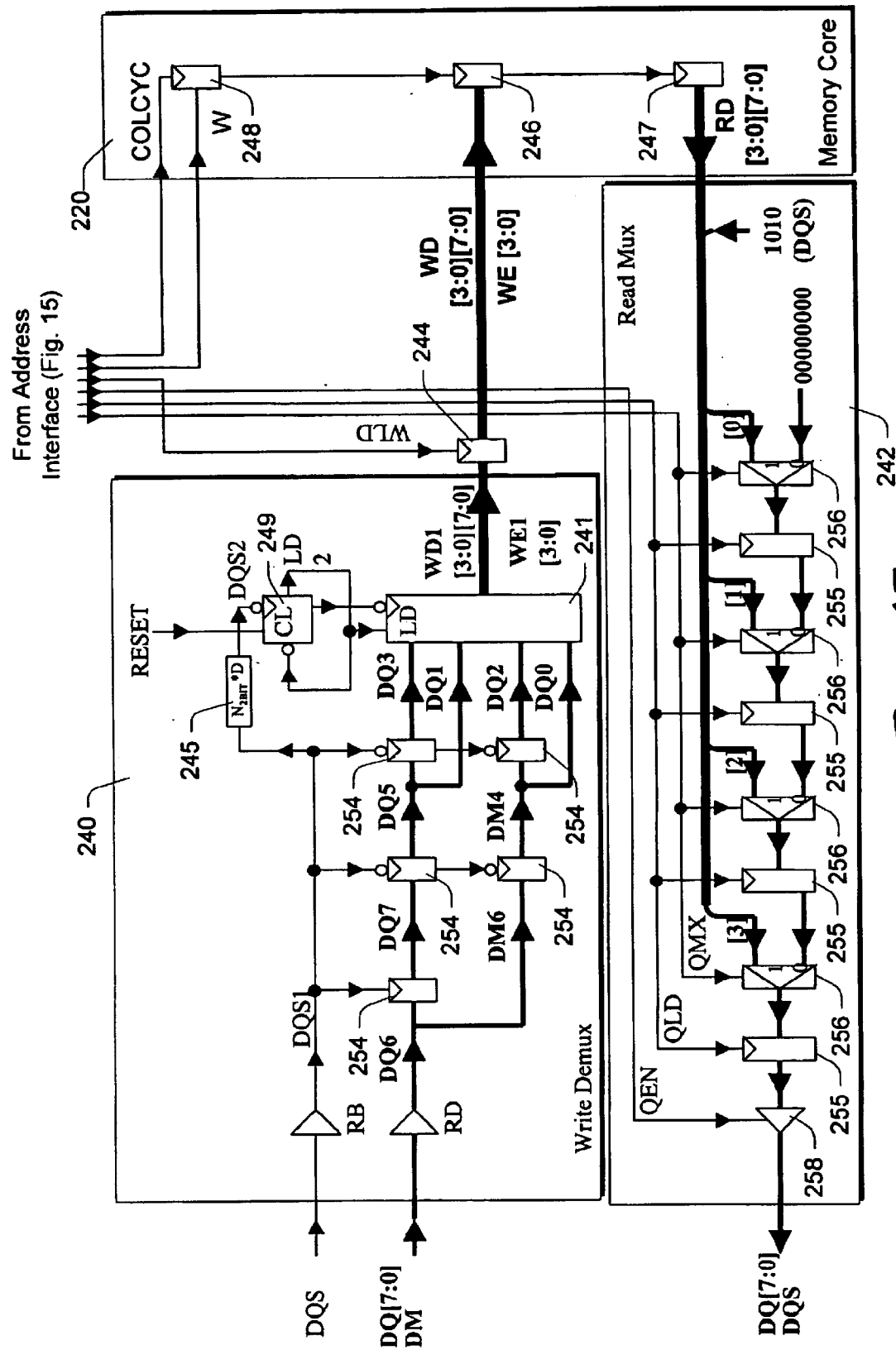
FIG. 17 is a block diagram showing data interfacing logic for the fourth embodiment of an asynchronous, pipelined memory device.

FIG. 17 shows details of data interfacing logic for the asynchronous, high-bandwidth DRAM shown in FIG. 15. Memory core is shown on the right, referenced by numeral 220.

The data interfacing logic includes a write demultiplexer 240 (also referred to herein as demultiplexing logic) and a read multiplexer 242 (also referred to herein as multiplexing logic).

The write demultiplexer 240 accepts a sequence of four eight-bit words from DQ[7:0] and assembles them into a single 32-bit word (WD1 and WD) for writing to memory core 220. The assembled 32-bit word WD1 is loaded into an intermediate pipeline register 244, and then loaded into the appropriate memory core register 246 a subsequent, independent memory operation (see FIG. 19).

The read demultiplexer 242 reads a 32-bit word RD[3:0][7:0] from the DRAM core read register 247 and splits it into four sequential eight-bit words for output from the memory device on DQ[7:0].

On the left side of FIG. 17 are the signals that connect to external components. These signals include:

DQS is a data strobe signal. The rising and falling edges of this signal provide timing marks to indicate when valid read or write data is present. During a read operation, this signal is composed in a manner similar to other read data. During a write operation, the DQS signal is used to load sequentially received bits—to assemble the data into registers in a "strobe domain" before passing it to the DRAM core.

DQ[7:0] is a data bus. It carries read and write data. Note that the core reads or writes a parallel 32-bit quantity in each column access (in this example implementation), and the interface transports this in a serial burst of four 8-bit pieces on the DQ bus. The mux and demux blocks in the data interface are responsible for the conversion between the serial and parallel formats of the data.

DM is a data mask signal. It is used for byte masking of the incoming write data. It is not used with read data. Only one DM pin is required since the example implementation uses an eight-bit DQ bus. If the DQ bus were wider, more DM pins would be allocated. It is treated like another write data bit by the interface logic. Note that the DM signal is unidirectional, unlike the DQ and DQS signals, which are bi-directional.

The right side of FIG. 17 includes the signals that connect to the DRAM core. These signals include:

COLCYC is a load signal. Its rising edge causes the W signal to be loaded into a register 248 within the DRAM core 220. Its rising edge also initiates a data transport operation to or from the core.

W is the write control signal. When it is a zero, the data transport operation that is initiated by COLCYC is a read. When it is a one, the data transport operation that is initiated by COLCYC is a write.

WD[3:0][7:0] is the write data bus. It is loaded into register 246 in the DRAM core on the rising edge of COLCYC. From there it is written into the sense amplifiers which hold the currently selected row (page) of the DRAM core.

WE[3:0] is the write enable bus. It is loaded into register 246 in the DRAM core on the rising edge of COLCYC. Each bit controls whether the associated eight bits of the WD bus is written to the sense amplifiers of the DRAM core.

RD[3:0][7:0] is the read data bus. It is driven from register 247 in the DRAM core after the rising edge of COLCYC. It is valid until the next rising edge of COLCYC.

The Write Demux block 240 accepts the write data DQ[7:0], the write mask DM, and the write data strobe DQS from the external memory controller component The DQS signal functions as a timing signal to load serially-received bits from DQ[7:0]. The signals are received by the RB and RD receiver cells 250 and 251. There are two versions: RB and RD. The RB cell is used for signals which need to drive relatively large loads. The RD cell is used for signals which need to drive relatively small loads. Both blocks have the same delay, controlled by calibration logic. These blocks are described with reference to FIGS. 26 and 27.

The DQS1 signal from the RB cell is used to clock a set of registers 254 which accumulate the four bits that appear serially on each wire for each write operation. One of these registers is loaded on the rising edge of DQS1, and the rest are loaded on the falling edge of DQS1. Toggle flip-flop 249 alternates its state between low and high on each falling edge of DQS2. It is forced to a low state by the RESET signal which is applied when the component is first powered on. The DQS2 signal is a delayed version of the DQS1 data strobe, using the delay element 245.

The result is that the four nine-bit serial words DQ3, DQ2, DQ1, and DQ0 will all be valid for a timing window surrounding the falling edge of DQS2 when the LD2 signal from toggle flip-flop 249 is high. These four serial words are loaded into register 241 on that falling DQS2 edge.

When the complete 36 bit parallel word (WD1[3:0][7:0] and WE[3:0]) is loaded into register 241, it is then driven and loaded into a intermediate pipeline register 244 on the rising edge of the WLD signal. The output of this register drives the WD[3:0][7:0] write data bus of the DRAM core. The DM bits are assembled on the WE[3:0] write mask bus in an identical manner.

The Read Mux block 242 accepts the read data RD[3:0][7:0] driven from the DRAM core after the rising edge of COLCYC. The parallel word is loaded into four eight bit registers 255 on the first rising edge of the QLD signal (when QMX is asserted to one). The four eight bit pieces are then shifted out serially onto the DQ[7:0] bus (when QMX is asserted to zero). The QEN signal is asserted to one enabling the output driver 258. Two-to-one multiplexers 256 are responsive to the QMX signal to control whether registers 255 are loaded from the RD[3:0][7:0] in response to the QLD signal, or are loaded from the previous register 255. Note that the pattern "1010" is appended to the RD[3:0][7:0] bus to form the timing signal on the DQS output. This timing information is treated like another data bit; the timing signals QLD and QMX shift the "1010" timing information onto the conductor used for the DQS signal.

Figure 18:
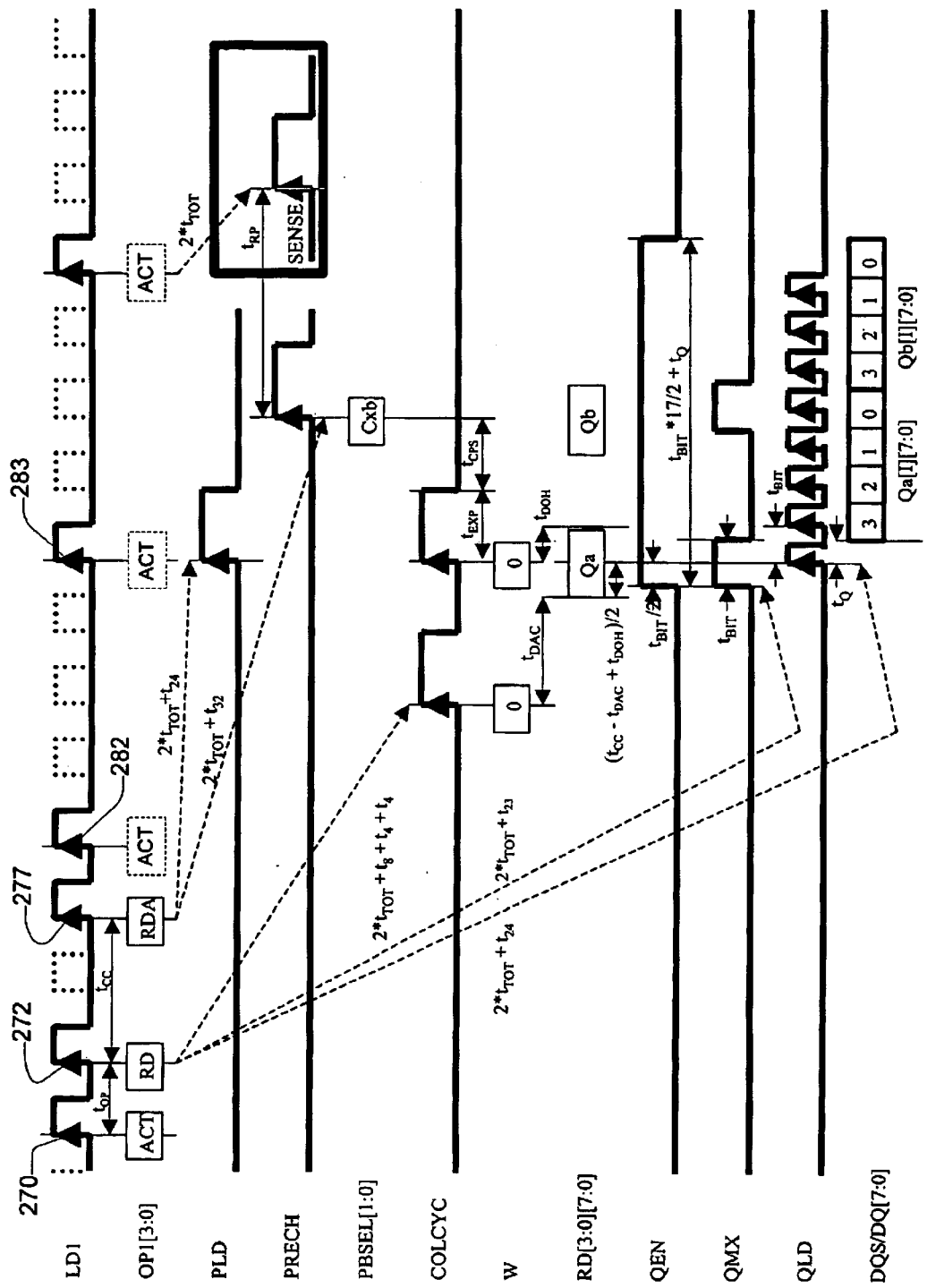
FIGS. 18 and 19 are a timing diagrams illustrating operation of the components shown in FIG. 17.

FIG. 18 shows the timing of the signals from the block diagram in FIG. 17 for a read transaction. The first LD1 edge 270 is discussed above with reference to FIG. 16. The second LD1 edge 272 (with the RD command) initiates a column read operation. The operations associated with the loading the column address were already described, with reference to FIG. 16. The operations associated with the transport of the read data begin with the rising COLCYC edge. The COLCYC rising edge is delayed a time $2*t_{TOT}+t_8+t_4+t_4$ after the second LD1 rising edge 272. The rising edge of COLCYC drives the read data Qa on RD[3:0][7:0] (corresponding to first column address Cxa) from register 247 after a delay of $t_{DAC}$. This data remains valid for a time $t_{DOH}$ after the next rising edge of COLCYC.

This read data Qa is sampled by registers 255 at a time $2*t_{TOT}+t_{24}$ after the second rising edge of LD1 (in the center of the valid window) by the first rising edge of the QLD control signal. The QMX and QEN control signals are asserted high a time $2*t_{TOT}+t_{23}$ after the second rising edge of LD1. The QEN signal will remain asserted high for the time during which read data is being driven on the DQ and DQS pins. The QMX signal will remain high for the first rising edge of QLD, allowing the 32 bits of read data Qa[3:0][7:0] to be loaded into the serial output registers 255. The first eight bits Qa[3][7:0] will also be driven onto the DQ[7:0] pins a time $t_Q$ after the first rising edge of QLD. QMX will be left low for the next three QLD rising edges, allowing the remaining 24 bits Qa[2:0][7:0] to be shifted out.

The third LD1 edge 277 (with the RDA command) initiates a second column read operation. This command produces a second series of operations identical to that of the first column read, culminating in driving the second read data Qb[3:0][7:] onto the DQ[7:0] pins. Note that the assertion of the QEN signal from the first read command merges with the assertion from the second read command; the QEN signal never returns to a low value between the commands.

The RDA command performs one set of operations not performed by the RD command; automatic pre-charge. The third rising edge 277 of LD1 causes the PLD signal to be asserted high at a time $2*t_{TOT}+t_{24}$ later. This signal loads the Cxb bank address into a register 234 (FIG. 15) in the address interface. The PRECH signal is asserted high a time $2*t_{TOT}+t_{32}$ after the third rising edge 277 of LD1. This signal loads the Cxb bank address into a register 236 (FIG. 15) in the DRAM core and starts the pre-charge operation. The pre-charge operation requires a time $t_{RP}$, at which point another ACT command can assert the SENSE signal for that bank. The rising edge of PRECH must be at least a time $t_{CPS}$ after the second falling edge of COLCYC (this is a core constraint).

Figure 19:
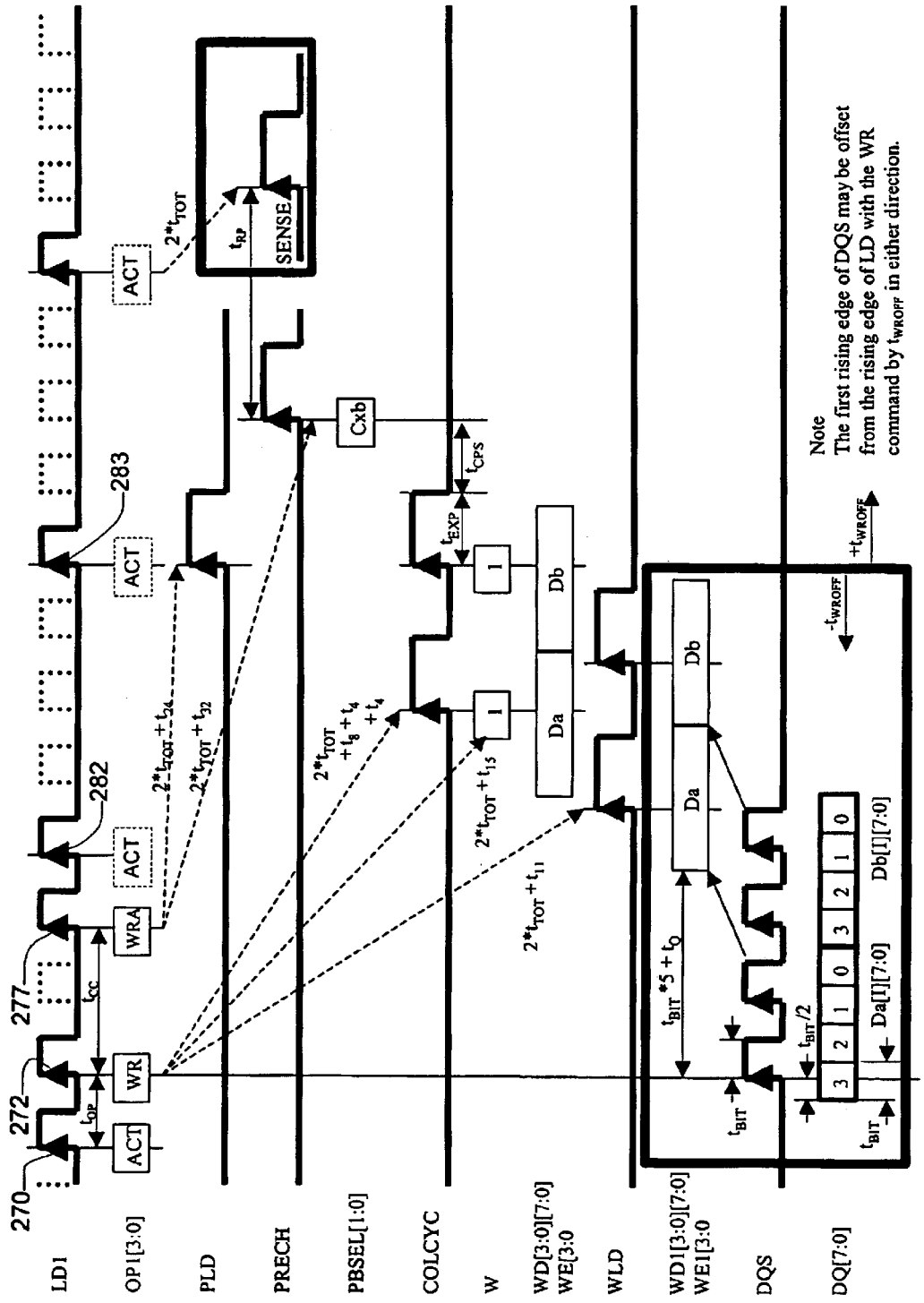

FIG. 19 shows the timing of the signals from the block diagram in FIG. 17 for a write transaction. The second LD1 edge 272 (with the WR command) initiates a column write operation. The operations associated with the column address were already described. The operations associated with the transport of the write data begin at approximately the same time on the first rising edge of DQS. In the timing diagram, the rising edges of these two signals are shown as being coincident, as the external memory controller will drive them. There may be differences in the routing delay of the data (DQ, DM, and DQS) signals and the control (LD, OP, and ADDR) signals on the wires between the controller and the memory component. This will appear as an offset between the rising edge 272 of LD1 and the rising edge of DQS. The logic in the example implementation can accommodate an offset from $+t_{WROFF}$ to $-t_{WROFF}$. This range could be increased further, if it were necessary.

On the first rising edge of DQS in FIG. 19, the first piece of write data Da[3][7:0] is valid on the DQ[7:0] bus. The remaining three pieces Da[2:0][7:0] are valid around the next three falling and rising edges of DQS. When all 32 bits have been loaded into individual registers, they are loaded in parallel into a final 32-bit register 241 (FIG. 17) in the DQS timing domain. This register drives the WD1[3:0][7:0] bus. The write mask information has been transferred from the DM pin onto the WE1[3:0] bus with an identical data path (the mask information may be treated like write data for timing purposes).

The WLD control signal is delayed by $2*t_{TOT}+t_{11}$ after the second rising edge 272 of LD1 (with the WR command). The rising edge of WLD causes register 244 to sample the WD1 and WE1 buses. This sampling point is designed to be in the center of the valid window for the data on these buses so that the offset parameter $+t_{WROFF}$ to $-t_{WROFF}$ has as much margin as possible. It is possible to adjust the delay path for the WLD signal if the sampling point needs to be shifted because of routing differences in the control and data wires for the memory subsystem.

The data on the WD and WE inputs to the DRAM core are sampled by register 246 (FIG. 17) that is loaded on the rising edge of COLCYC. The COLCYC control signal is delayed by $2*t_{TOT}+t_8+t_4+t_4$ after the second rising edge 272 of LD1 (with the WR command). The W control signal is delayed by $2*t_{TOT}+t_{15}$ after the second rising edge 272 of LD1, and is also sampled by a register 248 that is loaded on the rising edge of COLCYC.

On the third rising edge of DQS in FIG. 19, the first piece of write data Db[3][7:0] for the second column write is valid on the DQ[7:0] bus. The remaining three pieces Db[2:0][7:0] are valid around the next three falling and rising edges of DQS. The 32 bits of this second column write are loaded and transferred to the WD and WE buses in exactly the same manner as the first column write. The data on the WD and WE inputs to the DRAM core are sampled by register 246 that is loaded on the rising edge of COLCYC. The COLCYC control signal is delayed by $2*t_{TOT}+t_8+t_4+t_4$ after the third rising edge 277 of LD1 (with the WRA command). The W control signal also sampled on this edge, as before.

The WDA command performs one set of operations not performed by the WD command: automatic pre-charge. The third rising edge 277 of LD1 cause the PLD signal (FIG. 15) to be asserted high at a time $2*t_{TOT}+t_{24}$ later. This signal loads the Cxb bank address into a register 234 in the address interface (FIG. 15). The PRECH signal is asserted high a time $2*t_{TOT}+t_{32}$ after the third rising edge 277 of LD1. This signal loads the Cxb bank address into register 236 in the DRAM core and starts the pre-charge operation. The pre-charge operation requires a time $t_{RP}$, at which point another ACT command can assert the SENSE signal for that bank. The rising edge of PRECH must be at least a time $t_{CPS}$ after the second falling edge of COLCYC (this is a core constraint).

In the described embodiment, timing information is carried on a single, dedicated conductor corresponding to the DQS signal. However, in alternative embodiments such timing information might be encoded with the data itself. In such alternative embodiments, both timing information and data information might be transferred on a single signal line. A transmitter would receive a timing signal and the data signal, and in response produce a single signal to be carried by a single signal line to a receiver. In response, the receiver would separate the data information and timing information into two signals. A disadvantage of this technique is that the signal line must use some of its signaling bandwidth for the timing information. However, the technique might be desirable in some embodiments because it minimizes any skew between the data and timing information (as there would be if two separate signal lines were used).

Delay Element Calibration Circuit

Figure 20:
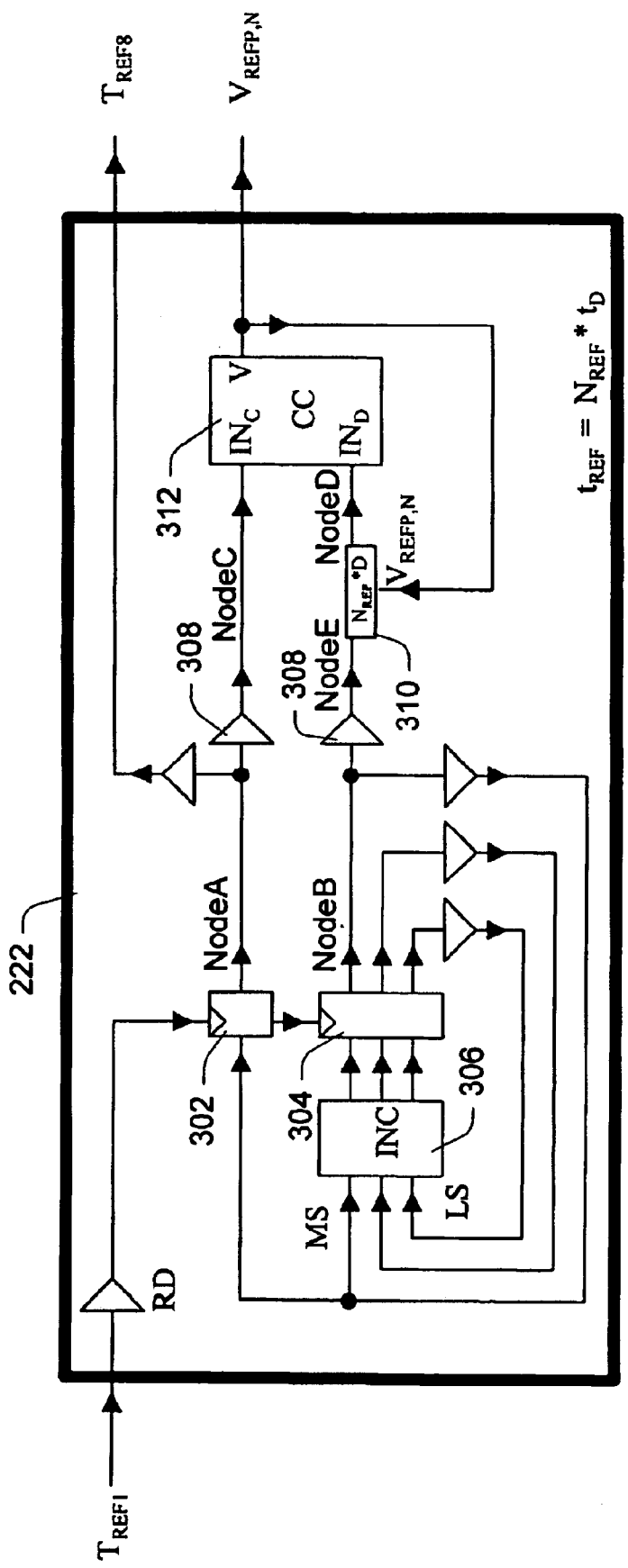
FIG. 20 is a block diagram showing a calibration circuit.

FIG. 20 shows the logic contained within the calibration circuit or GEN block 222 in FIG. 15. On the left side of the figure, the TREF1 supplies an external timing reference consisting of pulses whose rising edges are separated by intervals of $t_{REF1}$. This signal is received by an RD block, and then serves as a clock for a one-bit register 302 which creates a signal NodeA and a three-bit register 304 which creates a signal NodeB. The NodeB signal is passed back to a three-bit incrementer 306, so that a three-bit counter is formed. One-bit register 302 is fed from the most-significant (MS) bit of NodeB. The reason for this will be explained in the text accompanying the next figure.

The NodeA signal and MS bit of NodeB signal are passed through identical buffers 308 to give signals NodeC and Node E, respectively. NodeE is fed through a delay block 310, consisting of $N_{REF}$ copies of a D block. A D block is a delay element having a delay equal to $t_D$, and will be described in more detail with reference to FIG. 24. A delay of $t_{REF}=N_{REF}*t_D$ is thus applied to the NodeE signal, yielding signal NodeD. The NodeC and NodeD signals drive $IN_C$ and $IN_D$ inputs of a compare and control block (CC block) 312.

CC block 312 compares the two signals on its $IN_C$ and $IN_D$ inputs and adjusts a pair of output voltages $V_{REFP}$ and $V_{REFN}$ so that the edges of the two signals are aligned in time. When a steady state voltage is reached, the delay between the pulses $t_{REF1}$ of the TREF1 signal will match the delay $t_{REF}$ of the delay block $N_{REF}*D$ (to within the resolution supported by the CC block). The reference voltages can now be used to create calibrated delays within the interface logic.

Pulses are applied periodically on the TREF1 input from an external source such as the memory controller. Because of this, the reference voltages are periodically adjusted to compensate for process, voltage, and temperature variations. In this manner, an external delay reference can be used to create precise internal delays.

Note that it is not necessary that the TREF1 provide a continuous stream of pulses. Rather, short bursts of pulses are provided at regular intervals. The length of the interval is a function of how quickly temperature and supply voltage can change—this will typically be on the order of milliseconds. The length of the burst of pulses that are supplied will typically be on the order of 30 to 50 pulses—the CC block 312 in FIG. 20 will take one negative or positive voltage step for every eight TREF1 pulses, and the first one may be in the incorrect direction because of the unknown state of the GEN block 222 in FIG. 20 when the pulse burst is started.

Figure 21:
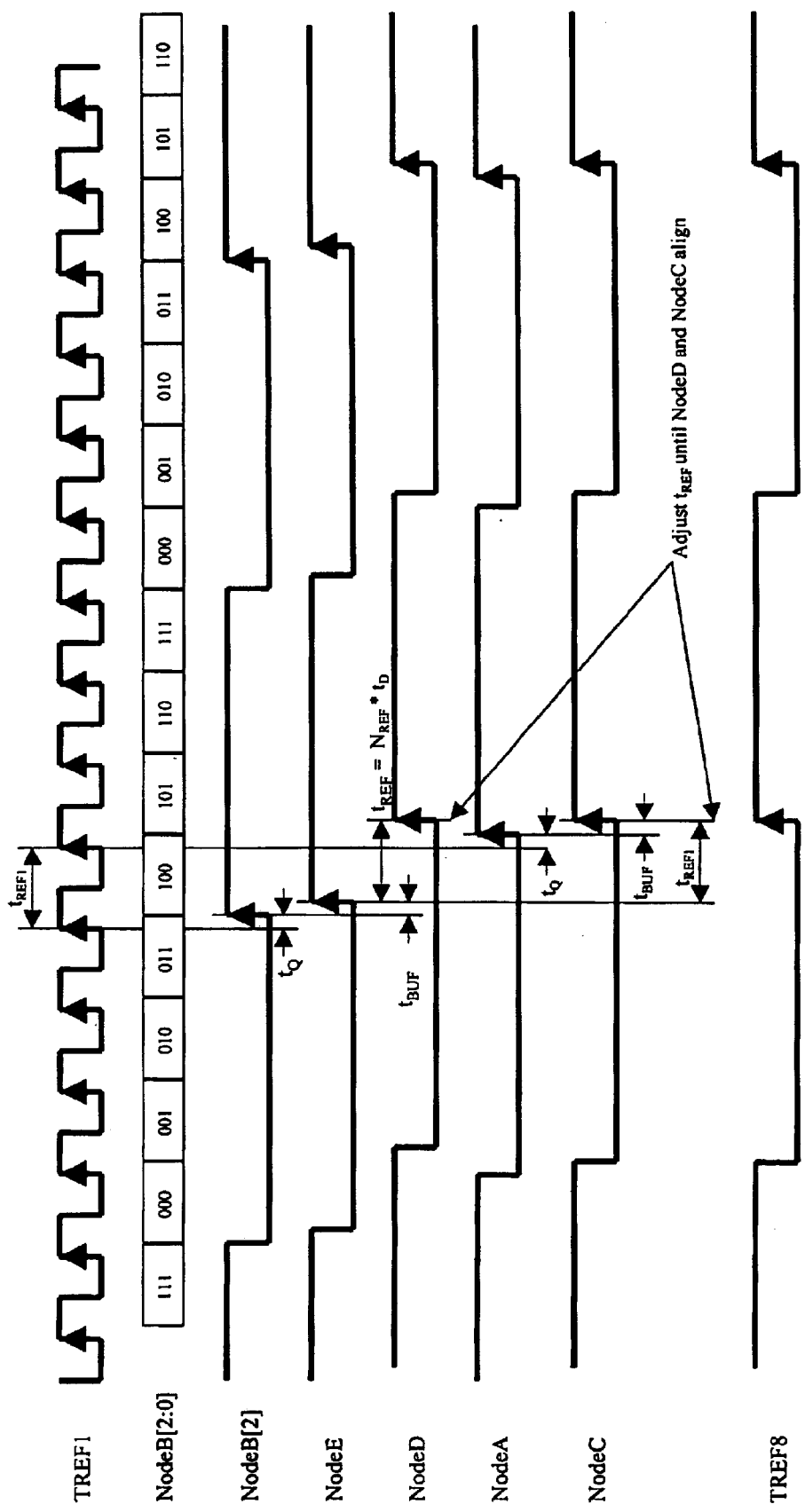
FIG. 21 is a timing diagram illustrating operation of the components shown in FIG. 20.

FIG. 21 shows the timing of the signals in the GEN block 222 in the previous figure. The three bits of NodeB count from 000 through 111 repeatedly. The most-significant bit is thus a divided-by-eight version of the TREF1 input signal. The most-significant bit of NodeB is delayed by a buffer to give NodeE, which is then passed through a delay element 310 to give NodeD, which is delayed by $t_{REF}$. The NodeA signal follows the NodeB signal by exactly $t_{REF1}$ because of the logic in the GEN block. This means that NodeC follows the NodeB signal by exactly $t_{REF1}$ as well. Thus, the CC block adjusts the reference voltages until $t_{REF}$ is equal to $t_{REF1}$.

Note that a simplified GEN block would consist of only the CC block and the delay block $N_{REF}*D$. The TREF1 signal would be received by the RD block, and would drive the INC input and the input of the delay block. The TREF8 signal would simply be a buffered version of TREF1. The disadvantage of this simpler approach is its lack of robustness. The minimum and maximum delay range of $t_{REF}$ would be $\{0.5*t_{REF1}, 1.5*t_{REF1}\}$. If $t_{REF}$ ever acquired a value outside of this range (at power-up, for example), the CC block would drive the reference voltages in the wrong direction. The corresponding range of the more complicated GEN cell in FIG. 20 is $\{0*t_{REF1}, 4*t_{REF1}\}$. This larger capture range ensures that there is less chance of a power-up error. The cost is a three-bit incrementer, four register bits, and some buffers.

Compare and Control Block

Figure 22:
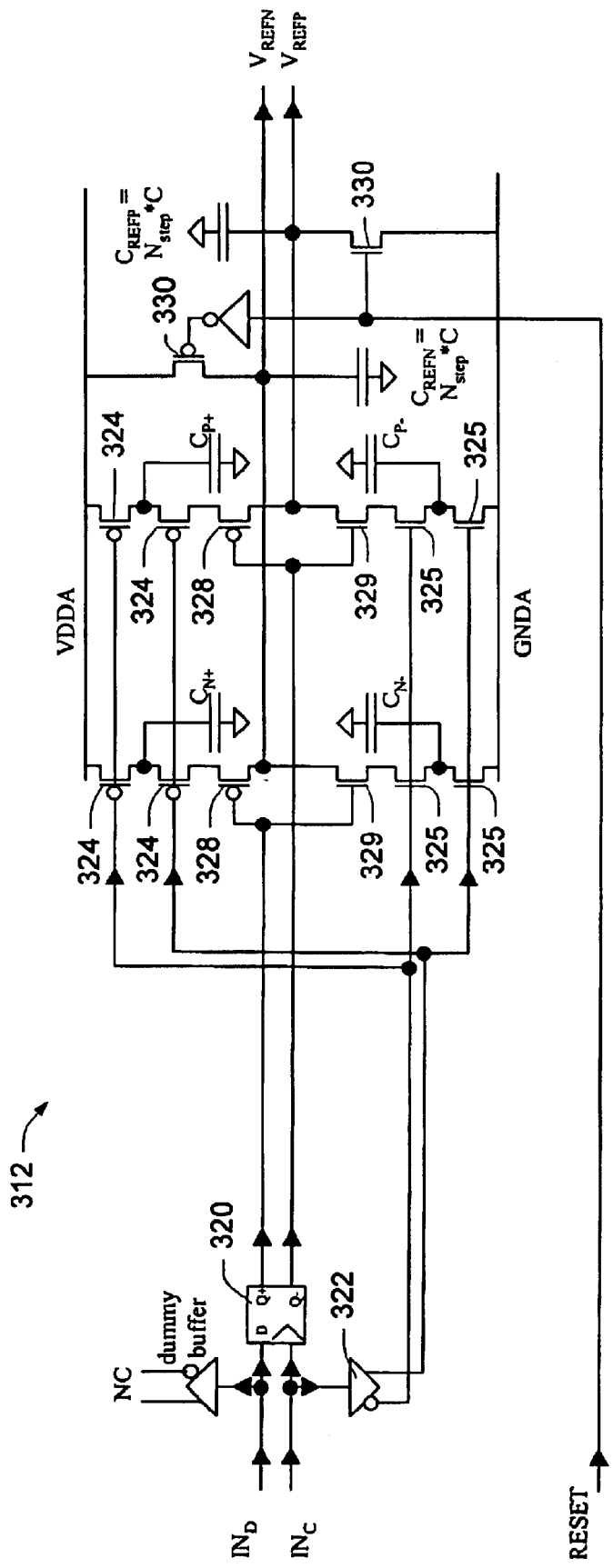
FIG. 22 is block diagram of a compare and control block.

FIG. 22 shows the logic inside the CC block 312 from FIG. 20. The $IN_C$ and $IN_D$ signals are the load and data input, respectively, for a register bit 320. The $IN_C$ input, through a buffer 322, also controls the gates of N and P channel transistors 324 and 325 so that a controlled amount of charge is steered from the supply voltages VDDA and GNDA to the reference voltages $V_{REFN}$ and $V_{REFP}$. The output of the register bit 320 controls the gates of further N and P channel transistors 328 and 329, to control the direction that the reference voltages move.

There are four capacitors, which are charged to one of the two supply voltages when $IN_C$ is high. They are $C_{N+}$, $C_{N-}$, $C_{P+}$, and $C_{P-}$. The capacitors each have a capacitance of "C". When $IN_C$ is low, two of the four capacitors dump their charge into the capacitors $C_{REFP}$ and $C_{REFN}$ on the reference voltage nodes $V_{REFP}$ and $V_{REFN}$. These two capacitors have the capacitive values $N_{step}*C$ and $N_{step}*C$. Thus, every time there is a pulse on $IN_C$, the reference voltages will make a step of $(VDDA-GNDA)/N_{step}$ in one direction or the other. At the steady-state reference voltages, the steps will alternate between up and down. The value of $N_{step}$ will be chosen as a compromise between the resolution of the steady state reference voltages and the time required to reach the steady state values at power-up time.

It would be possible to add logic to the CC block so that it would detect when it has made a series of steps in the same direction. It would then use a bigger capacitor to take bigger steps to the steady-state reference voltages. Once it began taking steps in the opposite direction, it would use the smaller capacitors for better delay resolution.

Note that $V_{REFP}$ and $V_{REFN}$ will always step in opposite directions. This will be clear when the details of the delay element are described (FIG. 24). In FIG. 22, when the RESET input is asserted high, the $V_{REFP}$ and $V_{REFN}$ voltages are driven to the values of GNDA and VDDA, respectively by transistors 330. This corresponds to the shortest possible delay in the delay element. After RESET is deasserted low, The GEN block 222 will drive $V_{REFP}$ higher and $V_{REFN}$ lower, in steps of (VDDA−GNDA)/$N_{step}$ until the steady state values are reached. This will compensate for all process, temperature and voltage effects at power-up time. Thereafter, the TREF1 input will be given a series of pulses periodically to ensure that variations of temperature and voltage will be tracked out and the reference delay will match the external delay within the resolution of the CC block.

Note also that the supply voltages VDDA and GNDA used by the CC block will be dedicated supplies that are different from the supplies used by the DRAM core and the data path logic of the interface. These dedicated supplies will be used only for the blocks of logic that generate precisely timed control signals. There will be less disturbance on these supplies due to switching noise, and the calibrated timing intervals will be more accurate as a result. The VDDA and GNDA will connect to the same external power supplies as the VDD and GND used by the rest of the DRAM, but will have dedicated pins and a dedicated set of power supply wires inside the component.

Figure 23:
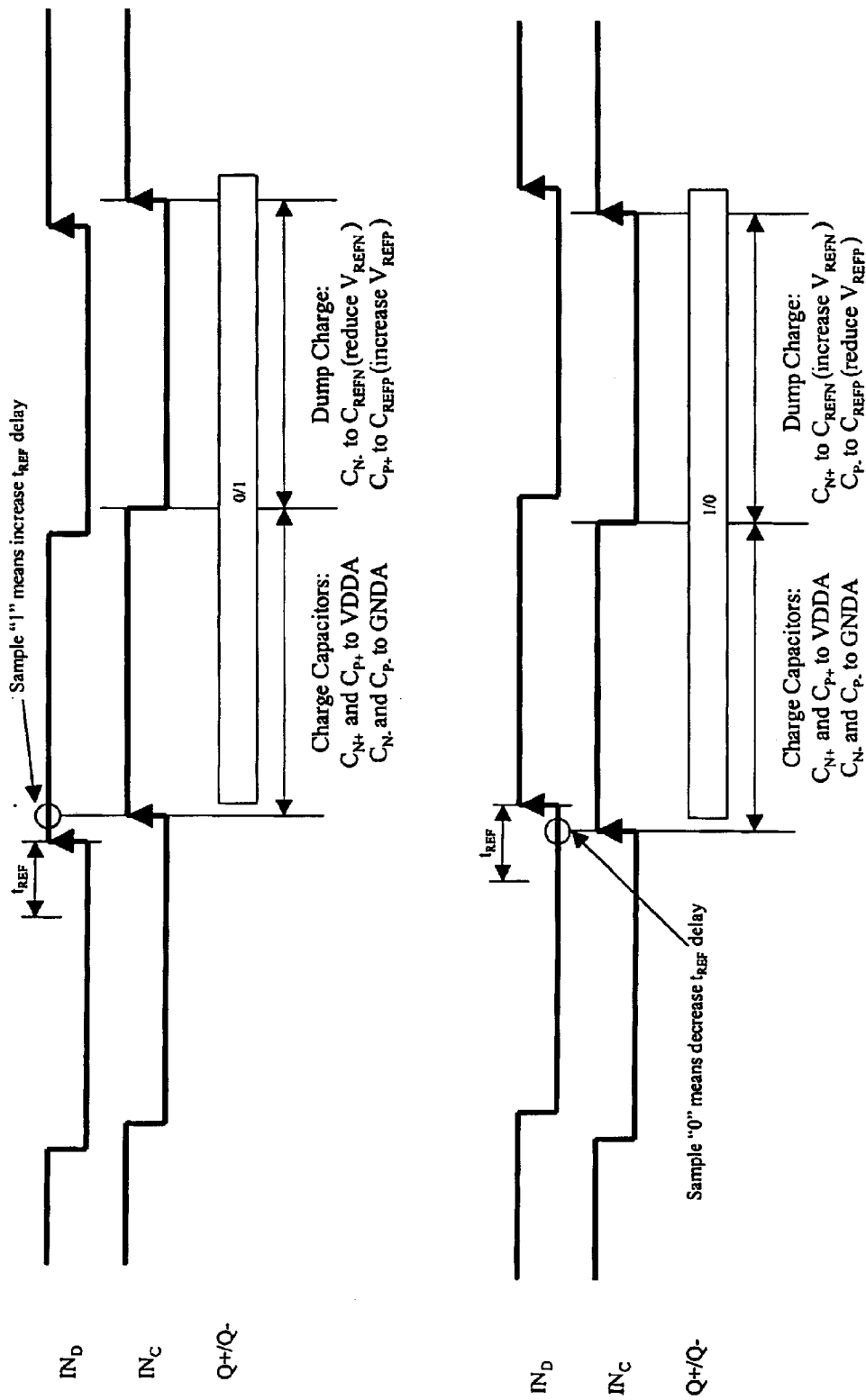
FIG. 23 is a timing diagram illustrating operation of the components shown in FIG. 22.

FIG. 23 shows the timing of the CC block 312 when the reference voltages are near their steady state values. The top diagram shows the case where the $t_{REF}$ delay of the delay block is too small, and the bottom diagram shows the case where the $t_{REF}$ delay of the delay block is too large.

In both diagrams, the time when $IN_C$ is high (after the $IN_C$ rising edge), the four capacitors $C_{N+}$, $C_{N-,\ CP+}$, and $C_{P-}$ are charged to the supply rails. While this is happening, the output of the sampling register is settling to the value that determines what happens when $IN_C$ drops low.

In the top diagram, the $IN_D$ input doesn't have enough delay, and the $IN_C$ rising edge samples $IN_D$ as a "1". This means that after $IN_C$ drops low, the charge will be dumped so that $V_{REFP}$ is increased and $V_{REFN}$ is decreased.

In the bottom diagram, the $IN_D$ input has too much delay, and the $IN_C$ rising edge samples $IN_D$ as a "0". This means that after $IN_C$ drops low, the charge will be dumped so that $V_{REFP}$ is decreased and $V_{REFN}$ is increased.

Note that the time that $IN_C$ remains high and low doesn't affect the amount of charge dumped into the capacitors $C_{REFP}$ and $C_{REFN}$ on the reference voltage nodes $V_{REFP}$ and $V_{REFN}$. It is only necessary to provide pulses on TREF1 with rising edges separated by the $t_{REF1}$ interval—the duty cycle of these pulses is not critical.

Delay Elements

FIG. 24 shows the internal details of a "D" cell delay block 340 such as used in delay element 310 of the GEN block of FIG. 20. Delay element 310 is actually $N_{REF}$ copies of the D cell 340.

Each D cell 340 contains a plurality of "d" cell delay elements 342. Each d cell 342 is a pair of inverters 343 connected to VDDA through P transistors 344 whose gate voltage is $V_{REFP}$, and connected to GNDA through N transistors 345 whose gate voltage is $V_{REFN}$.

When $V_{REFP}$ increases, the resistance of the P transistors 344 increase, increasing the delay of a signal through the inverters 343. When $V_{REFP}$ decreases, the resistance of the P transistors 344 decreases, decreasing the delay of a signal through the inverters 343.

The behavior is complementary for an N transistor. When $V_{REFN}$ decreases, the resistance of the N transistors 345 increases, increasing the delay of a signal through the inverters 343. When $V_{REFN}$ increases, the resistance of the N transistors 345 decreases, decreasing the delay of a signal through the inverter 343.

At power-on, the $V_{REFP}$ and $V_{REFN}$ voltages are driven to the values of GNDA and VDDA, respectively. This corresponds to the shortest possible delay in the delay element. The GEN block 222 will drive $V_{REFP}$ higher and $V_{REFN}$ lower until the steady state values are reached. Note that $V_{REFP}$ and $V_{REFN}$ will always step in the opposite direction.

Other voltage-controlled delay structures are possible. The one that is described gives a good delay range with fairly modest area requirements. It would also be possible to use a digitally-controlled delay structure, in which delay elements were added and removed with a multiplexer structure. This would yield much coarser delay resolution, however. A hybrid delay unit with a coarse structure and a fine structure could also be used.

D cell 340 also includes a buffer 350 (inverter pair) for restoring the nominal slew rate to a signal passing through the block. This permits the D cell to drive a larger load directly. The delay of the "D" cell is $t_D = n \cdot t_d$, where $t_d$ is the "d" cell delay.

FIG. 25 shows an "N*D" cell 360. It consists of "N" of the "D" cells 340. The delay of the "N*D" cell is $t_{N*D} = N \cdot t_D$, where $t_D$ is the "D" cell delay. The delay of the cell used in the GEN block 222 (FIG. 20) is $t_{REF} = N_{REF} \cdot t_D$. The values of "n" and "N" will be implementation dependent.

Receiver Blocks

Figure 26:
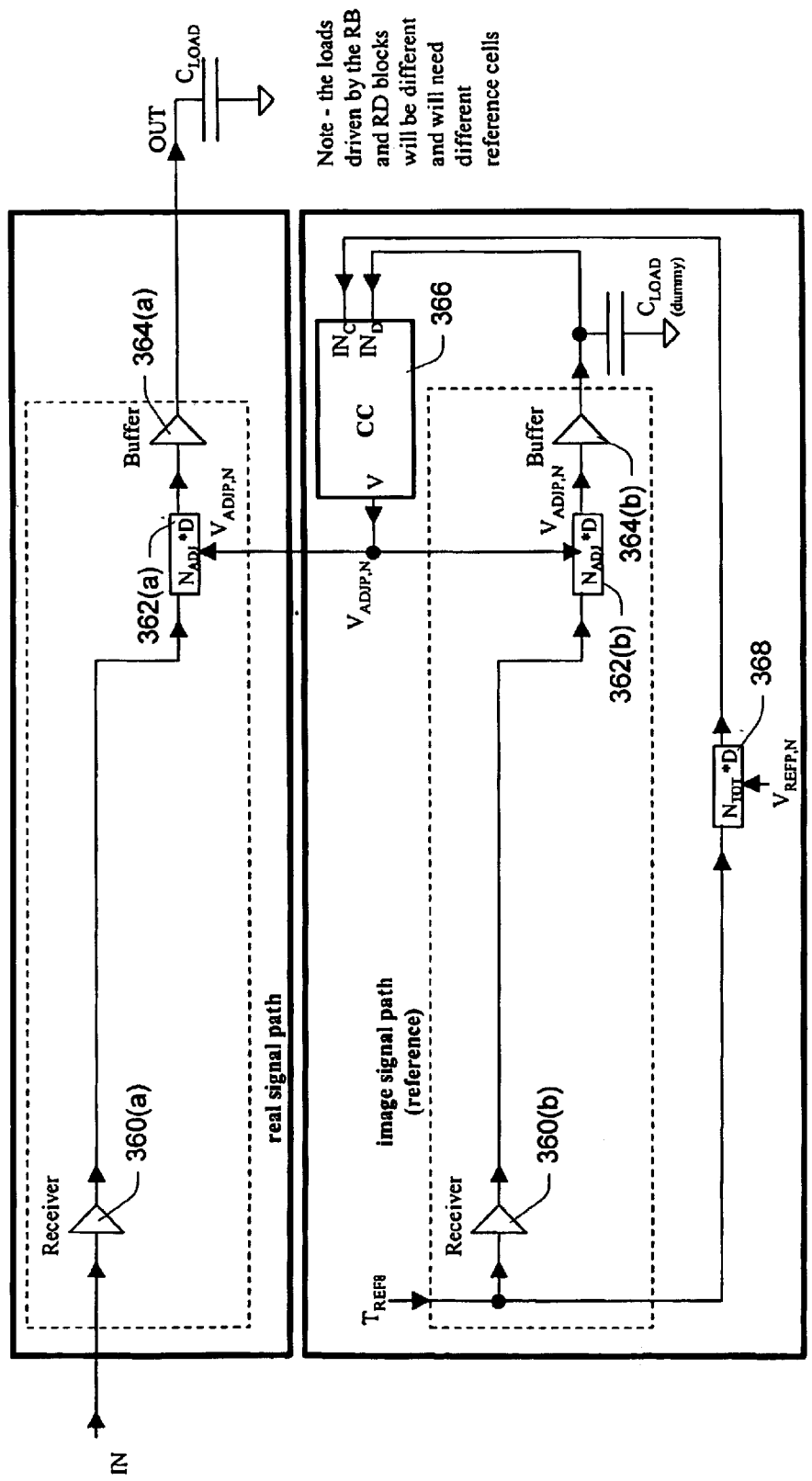
FIG. 26 is a block diagram of a receiver block.

FIG. 26 show details of the RB and RD receiver blocks shown in previous figures. Note that these two blocks are the same except that one is designed to drive a heavier load (the RB cell). The purpose of these blocks is to buffer their signals and to produce a uniform delay of $T_{TOT}$ in each of their signals.

Each receiver block has a real signal path, shown in the upper part of FIG. 26, and an image or reference signal path, shown in the lower part of FIG. 26. The image signal path receives the TREF8 signal (from the GEN block of FIG. 20) and produces a pair of reference voltages $V_{ADJP}$ and $V_{ADJN}$ that, when applied to a delay block, cause the receiver block to produce a delay equal to $t_{TOT}$.

The real signal path consists of an input signal IN passing through a receiver 360(a), a delay cell 362(a) comprising $N_{ADJ}$ D cells, and a buffer 364(a) to the output OUT.

The image signal path consists the TREF8 signal (from the GEN block of FIG. 20) passing through an identical receiver 360(b), through a delay cell 362(b) ($N_{ADJ} \cdot D$), and through a buffer 364(b). The buffer for the image signal drives a load that is equivalent to that driven by the buffer for the real signal. This image signal is fed into the $IN_D$ input of a CC block 366 (see FIG. 22). The TREF8 signal also goes through a second delay cell 368 with a delay of $t_{TOT} = N_{TOT} \cdot t_D$ and is fed into the $IN_C$ input of the CC block 366.

The reference voltages $V_{ADJP}$ and $V_{ADJN}$ produced by the CC block control the delay of the identical $N_{ADJ} \cdot D$ blocks 362(a) and 362(b). As a result, the pulses from the TREF8 signal will propagate through the two paths in the lower block, and will be compared in the CC cell 366. The CC cell will adjust the $V_{ADJP}$ and $V_{ADJN}$ voltages to make the delay of the receiver 360(b), delay cell 362(b), and buffer 364(b) equal to $t_{TOT}$.

In the upper cell, the delay seen by the input signal IN through the receiver 360(a), delay cell 362(a), and buffer 364(a) will also be equal to $t_{TOT}$ since all the components are matched and the $V_{ADJP}$ and $V_{ADJN}$ voltages are shared. If the delay of the receiver and buffer change because of temperature and supply voltage variations, the delay of the $N_{ADJ}*D$ delay cell will change in a complementary fashion so the overall delay remains $t_{TOT}$.

Figure 27:
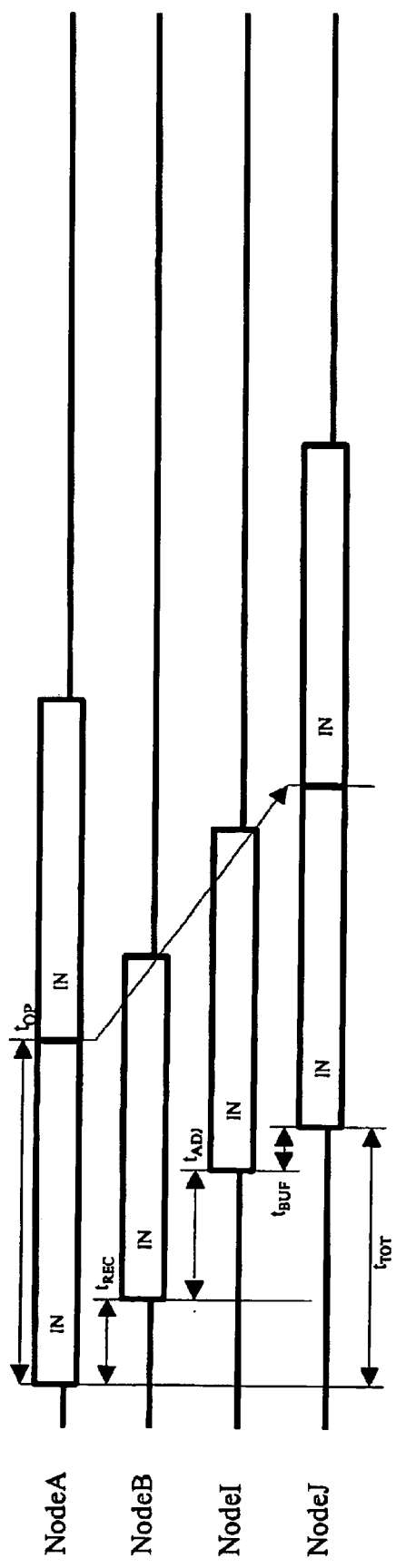
FIG. 27 is a timing diagram illustrating operation of the components shown in FIG. 27.

FIG. 27 shows a timing diagram for the RB and RD cells. The nodes along the real signal path are shown, and it can be seen that the delay from the input node (NodeA) to the output node (NodeJ) is the sum of $t_{TOT}=t_{REC}+t_{ADJ}+t_{BUF}$. The value of $t_{TOT}$ will be chosen to be greater than the maximum possible values (due to process, temperature and voltage variations) of $t_{REC}$, $t_{ADJ}$, and $t_{BUF}$ when the $V_{ADJP}$ and $V_{ADJN}$ voltages are at their minimum and maximum values, respectively (giving minimum delay). This ensures that the $N_{ADJ}*D$ delay cell has enough range to compensate for the process, temperature, and voltage variations without adding unnecessary delay.

This example implementation of an asynchronous DRAM interface assumes that the real signal path of each RB and RD cell has a dedicated image or reference signal path. In an actual implementation, it is likely that the image signal paths could be shared among all real signal paths that are matched. For example all the bits of the address input ADDR[13:0] could share one image path. This would reduce the cost of calibrating the RB and RD delay to the area of the ($N_{ADJ}*D$) delay cell plus a fraction of the image signal path cell. The $V_{ADJP}$ and $V_{ADJN}$ voltage signals would be routed to all the (matched) real signal paths from the image signal path.

It would also be possible to use the real signal path to generate its own adjustment voltage. This requires that the real signal path consist of pulses with a repetition rate that is constrained by the logic in the CC block. The advantage of this is that the delays are measured and adjusted in the real signal path, saving some area and perhaps making the timing calibration more accurate. The disadvantage is that if a real path is not exercised often enough, its delay may drift. The advantage of the image signal path is that it can have its adjustment voltage updated without interfering with its real signal operation.

Timing Logic

Figure 28:
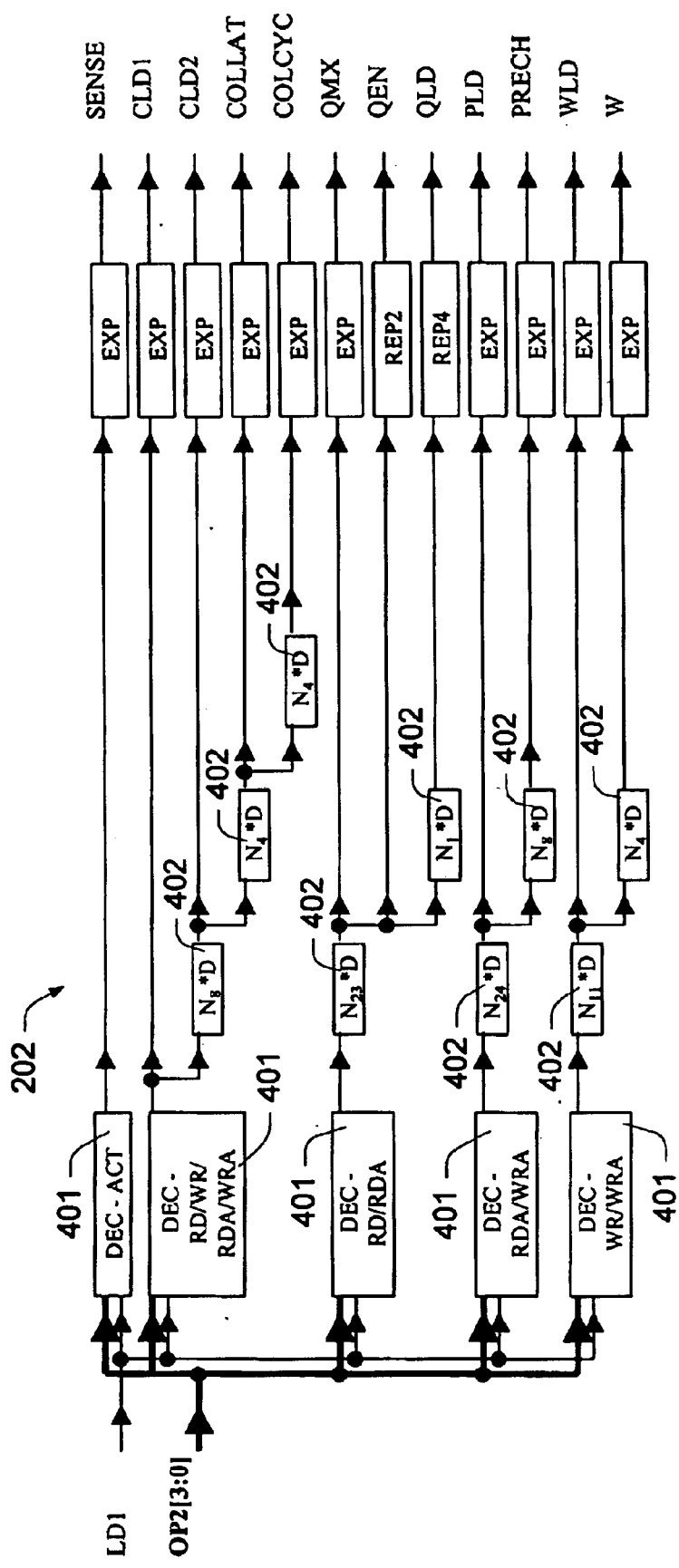
FIG. 28 is a block diagram of timing logic.

FIG. 28 shows details of timing logic 202, also referred to as a decode block. The timing logic accepts the OP2[3:0] command bus from an internal register and the LD1 signal that loads that register, and produces a set of control and timing signals that are precisely shaped and timed. These control signals fan out to the asynchronous interface and DRAM core and orchestrate the various memory access operations as already described.

There are five DEC blocks 401 which decode the four bit command OP2 into five command signals, indicating an activate operation (ACT), a column operation (RD/WR/RDA/WRA), a column read operation (RD/RDA), an automatic pre-charge operation (RDA/WRA), and a column write operation (WR/WRA).

These five signals then pass through a number of delay cells 402, each of which has a delay that is indicated in the figure. For example, the cell "$N_X*D$" generates the delay $t_X=N_X*t_D=X*t_D$, where the value of "X" can be {1,4,8,11,23,24}. These delay cells use the standard reference voltages $V_{REFP}$ and $V_{REFN}$ because the delays are calibrated to the reference delay $t_D$ from the GEN cell. The EXP, REP2, and REP4 (each of which will be described below) then shape the decoded and delayed signals cells.

Figure 29:
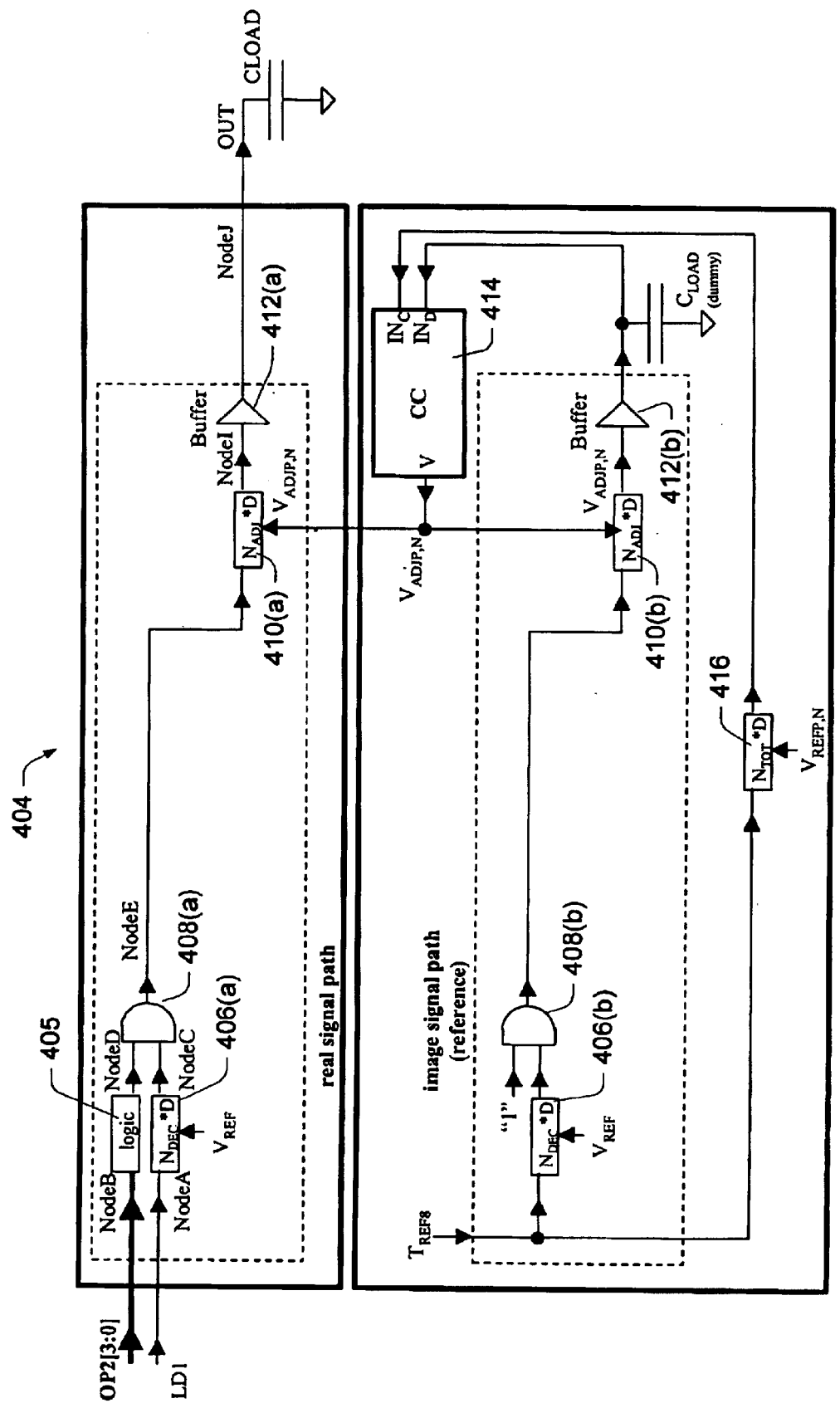
FIG. 29 is a block diagram of a decode block.

FIG. 29 shows the internal logic for an exemplary DEC block 401. Again, this circuit includes a real signal path and an image or reference signal path. The real signal path is contained in the upper part of the figure. It begins with the input bus OP2[3:0] passing through the "logic" block 405, which decodes the particular operation to which the DEC block responds. This logic block, as an example, will consist of a 2- or 3-input "and" gate.

The LD1 load signal passes through a delay block 406(a) ($N_{DEC}*D$). This provides a delay of $t_{DEC}=N_{DEC}*t_D$ which will be enough to match the load-to-output delay of the OP2 register 224 (FIG. 15) and the delay of the "logic" block 405. The delayed LD1 signal and the decoded OP2 signal are and'ed with a gate 408(a) and then passed through a second delay cell 410(a) ($N_{ADJ}*D$), and a buffer 412(a) to the output OUT.

Below the real signal path is the image signal path. It consists of the TREF8 signal (from the GEN block of FIG. 20) passing through identical delay cells 406(b) and 410(b) ($N_{DEC}*$ and $N_{ADJ}*D$) and gate 408(b), and buffer 412(b). The image path buffer 412(b) drives a load that is equivalent to that driven by the buffer 412(a) for the real signal. This image signal is fed into the $IN_D$ input of a CC block 414. The TREF8 signal also goes through a second delay cell 416 with a delay of $t_{TOT}=N_{TOT}*t_D$ and is fed into the $IN_C$ input of the CC block.

The reference voltages $V_{ADJP}$ and $V_{ADJN}$ produced by the CC block 414 control the delay of the $N_{ADJ}*D$ blocks. As a result, the pulses from the TREF8 signal will propagate through the two paths in the lower block, and will be compared in the CC cell. The CC cell will adjust the $V_{ADJP}$ and $V_{ADJN}$ voltages to make the delay of the two delay cells 406(b), 410(b) and buffers 412(b) equal to $t_{TOT}$.

In the upper cell, the delay seen by the input signal IN through the delay cell 406(a), and gate 408(a), delay cell 410(a), and buffer 412(b) will also be equal to $t_{TOT}$ since all the components are matched and the $V_{ADJP}$ and $V_{ADJN}$ voltages are shared. If the delay of the receiver and buffer change because of temperature and supply voltage variations, the delay of the $N_{ADJ}*D$ delay cell will change in a complementary fashion so the overall delay remains $t_{TOT}$.

Figure 30:
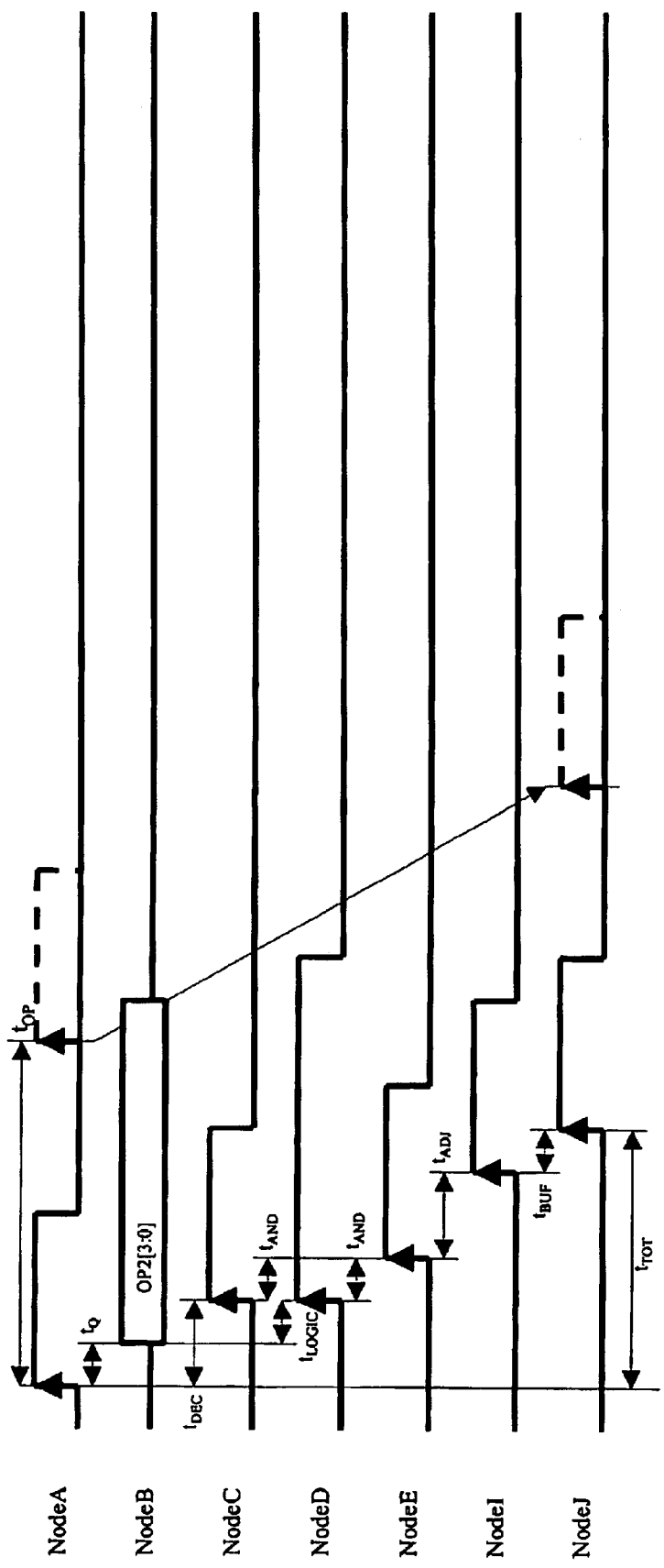
FIG. 30 is a timing diagram illustrating operation of the components shown in FIG. 29.

FIG. 30 shows a timing diagram for the DEC cells. The nodes along the real signal path are shown, and it can be seen that the delay from the LD1 node (NodeA) to the output node (NodeJ) is the sum of $t_{TOT}=t_{DEC}+t_{AND}+t_{ADJ}+t_{BUF}$. The value of $t_{TOT}$ will be chosen to be greater than the maximum possible values (due to process, temperature and voltage variations) of $t_{DEC}$, $t_{AND}$, $t_{ADJ}$, and $t_{BUF}$ when the $V_{ADJP}$ and $V_{ADJN}$ voltages are at their minimum and maximum values, respectively (giving minimum delay). This ensures that the $N_{ADJ}*D$ delay cell has enough range to compensate for the process, temperature, and voltage variations without adding unnecessary delay.

This example implementation of an asynchronous DRAM interface assumes that the real signal path of each DEC cell has a dedicated image signal path. In an actual implementation, it is likely that the image signal paths could be shared among all real signal paths that are matched. This is particularly easy since each DEC cell fans out to either one or two other cells that are also part of the Decode block. This would reduce the cost of calibrating the DEC delay to the area of the ($N_{ADJ}*D$) delay cell plus a fraction of the image signal path cell. The $V_{ADJP}$ and $V_{ADJN}$ voltage signals would be routed to all the (matched) real signal paths from the image signal path.

Figure 31:
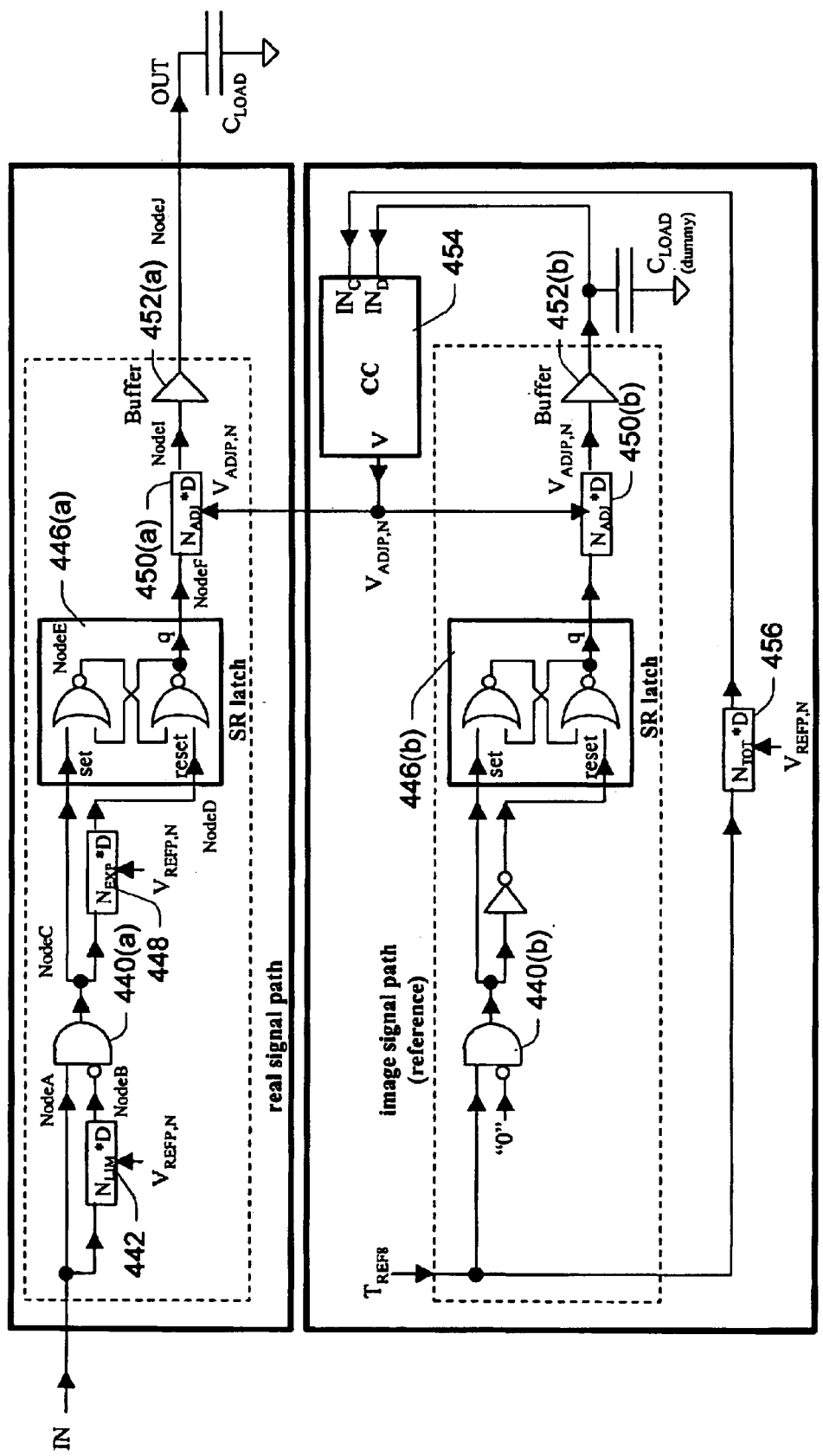
FIG. 31 is a block diagram of an EXP block.

FIG. 31 shows the internal logic for the EXP blocks shown in FIG. 28. The EXP block is one of the three blocks responsible for shaping the control pulses that have been decoded and delayed. The real signal path is contained in the upper part of the figure. It begins with the input signal IN passing through an "and" gate 440(a). The IN signal also passes through a delay block 442 ($N_{LIM}$*D). This provides a delay of $t_{LIM}=N_{LIM}*t_D$. The inverted delayed IN signal and the undelayed IN signal are and'ed by gate 440(a) to give NodeC. This first circuit is a pulse limiter—it accepts a pulse of unknown width (high time) and produces a pulse of width $t_{LIM}$. Note that the input signal width should be greater than $t_{LIM}$—this will be the case for all the signals produced by the decode blocks 401 in FIG. 28. The limited pulse is also delayed by $t_{AND}$ relative to the input pulse, but the accumulated delays of the EXP block will be adjusted to a calibrated total with a delay element.

The NodeC signal is expanded to the appropriate width by the next circuit. NodeC passes to the "set" input of an SR latch 446(a). This causes the "q" output to be set high. NodeC also passes through a delay block 448 ($N_{EXP}$*D) which provides a delay of $t_{EXP}=N_{EXP}*t_D$. The delayed signal passes to the "reset" input of the SR latch 446(a), causing the "q" to return low after a pulse width of about $t_{EXP}$.

The NodeF output of the SR latch 446(a) passes through a third delay block 450(a) ($N_{ADJ}$*D) and a buffer 452(a) which drives the control signal to the interface logic and the DRAM core. This third delay line is used to add an adjustable delay so the total delay of the EXP block remains fixed at the desired value $t_{TOT}$.

Below the real signal path is an image signal path. It consists of the TREF8 signal (from the GEN block) passing through an identical "and" gate 440(b), SR latch 446(b), delay cell 450(b) ($N_{ADJ}$*D) and buffer 452(b). The buffer for the image signal drives a load that is equivalent to that driven by the buffer for the real signal. This image signal is fed into the $IN_D$ input of a CC block 454. The TREF8 signal also goes through a second delay cell 456 with a delay of $t_{TOT}=N_{TOT}*t_D$ and is fed into the $IN_C$ input of the CC block. The reference voltages $V_{ADJP}$ and $V_{ADJN}$ produced by the CC block 454 control the delay of the $N_{ADJ}$*D blocks 450(a) and 450(b).

The pulses from the TREF8 signal propagate through the two paths in the lower block, and are compared in the CC cell 454. The CC cell adjusts the $V_{ADJP}$ and $V_{ADJN}$ voltages to make the delay of the two delay cells and buffer equal to $t_{TOT}$. Note that the delay cells ($N_{LIM}$*D) and ($N_{EXP}$*D) are not included here because there is no need to shape the TREF8 reference signal; the CC block only uses the relative positions of the IND and INC rising edges to generate the adjustment voltage.

In the upper cell, the delay seen by the input signal IN through the "and" gate, SR latch, delay cell and buffer will also be equal to $t_{TOT}$ since all the components are matched and the $V_{ADJP}$ and $V_{ADJN}$ voltages are shared. If the delay of the receiver and buffer change because of temperature and supply voltage variations, the delay of the $N_{ADJ}$*D delay cell will change in a complementary fashion so the overall delay remains $t_{TOT}$.

Figure 32:
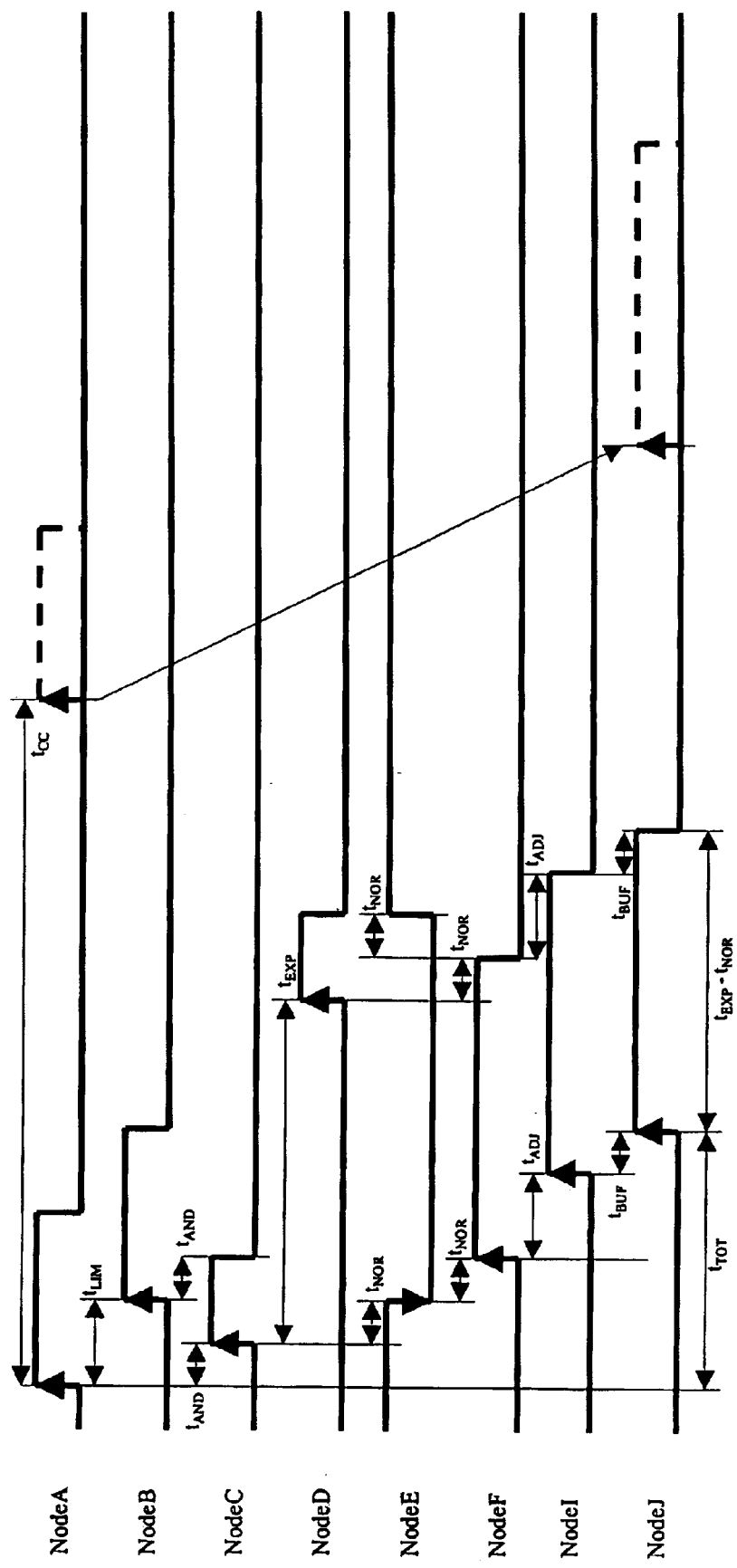
FIG. 32 is a timing diagram illustrating operation of the components shown in FIG. 31.

FIG. 32 shows a timing diagram for the EXP cells. The nodes along the real signal path are shown, and it can be seen that the delay from the IN node (NodeA) to the output node (NodeJ) is the sum of $t_{TOT}=t_{AND}+t_{NOR}+t_{NOR}+t_{ADJ}+t_{BUF}$. The value of $t_{TOT}$ will be chosen to be greater than the maximum possible values (due to process, temperature and voltage variations) of $t_{AND}$, $t_{NOR}$, $t_{NOR}$, $t_{ADJ}$, and $t_{BUF}$ when the $V_{ADJP}$ and $V_{ADJN}$ voltages are at their minimum and maximum values, respectively (giving minimum delay). This ensures that the $N_{ADJ}$*D delay cell has enough range to compensate for the process, temperature, and voltage variations without adding unnecessary delay.

Note also that the pulse width at NodeJ is ($t_{EXP}-t_{NOR}$). The pulse width will have some variation with respect to temperature and voltage since the $t_{NOR}$ delay is uncalibrated. However, the position of the falling edge of all control signals is not important—it is only necessary to precisely position the rising edges. Thus, this slight variation of pulse width will not affect the performance of the memory component.

This example implementation of an asynchronous DRAM interface assumes that the real signal path of each EXP cell has a dedicated image signal path. In an actual implementation, it is likely that the image signal paths could be shared among all real signal paths that are matched. This could be accomplished by adding dummy loading to the real signals so that all EXP blocks see the same effective load. This would reduce the cost of calibrating the DEC delay to the area of the ($N_{ADJ}$*D) delay cell plus a fraction of the image signal path cell. The $V_{ADJP}$ and $V_{ADJN}$ voltage signals would be routed to all the (matched) real signal paths from the image signal path.

Figure 33:
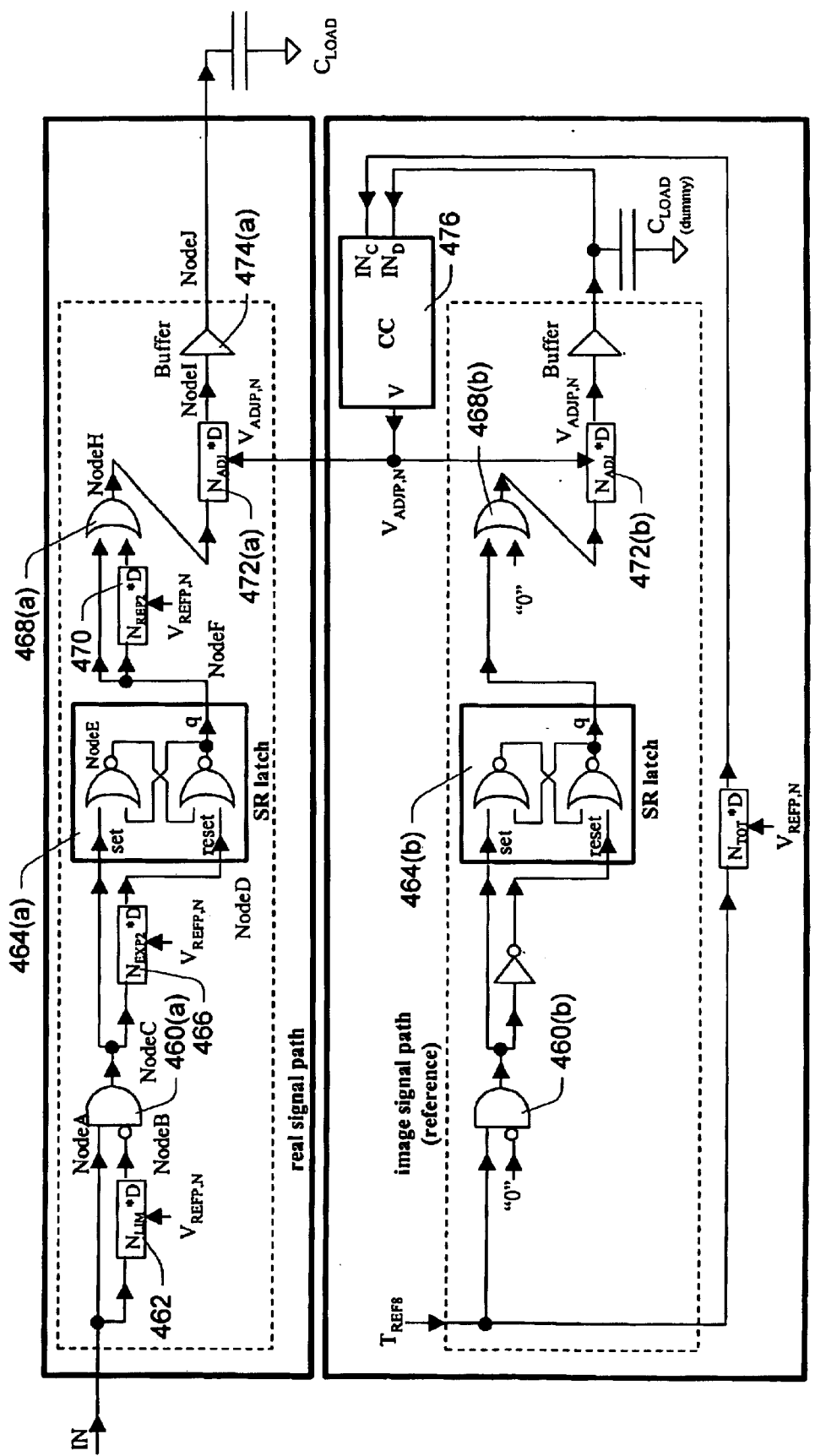
FIG. 33 is a block diagram of an REP2 block.

FIG. 33 shows the internal logic for a REP2 block such as shown in FIG. 28. This is one of the three blocks responsible for shaping the control pulses that have been decoded and delayed. A real signal path is contained in the upper part of the figure. It begins with the input signal IN passing through an "and" gate 460(a). The IN signal also passes through a delay block 462 ($N_{LIM}$*D). This provides a delay of $t_{LIM}=N_{LIM}*t_D$. The inverted delayed IN signal and the undelayed IN signal are and'ed by gate 460(a) to give NodeC. This first circuit is a pulse limiter—it accepts a pulse of unknown width (high time) and produces a pulse of width $t_{LIM}$. Note that the input signal width should be greater than $t_{LIM}$—this will be the case for all the signals produced by the decode blocks 401 in FIG. 28. The limited pulse is also delayed by $t_{AND}$ relative to the input pulse, but the accumulated delays of the REP2 block will be adjusted to a calibrated total with a delay element.

The NodeC signal is expanded to the appropriate width by the next circuit. NodeC passes to the "set" input of an SR latch 464(a). This causes the "q" output to be set high. NodeC also passes through a delay block 466 ($N_{EXP2}$*D) which provides a delay of $t_{EXP2}=N_{EXP2}*t_D$. The delayed signal passes to the "reset" input of the SR latch, causing the "q" to return low after a pulse width of about $t_{EXP}$.

The NodeF output of the SR latch 464(a) passes through an "or" gate 468(a). The NodeF signal also passes through a delay block 470 ($N_{REP2}$*D). This provides a delay of $t_{REP2}=N_{REP2}*t_D$. The delayed NodeF signal and the undelayed NodeF signal are or'ed to give NodeH. The values of $t_{EXP2}$ and $t_{REP2}$ are chosen so that the two pulses overlap and merge. This is because the REP2 block produces the enable signal for the output driver. It must remain asserted (without glitching low) during the whole time that read data is driven.

The NodeH output of the "or" gate passes through a third delay block 472(a) ($N_{ADJ}$*D) and a buffer 474(a) which drives the control signal to the interface logic and the DRAM core. This third delay line is used to add an adjustable delay so the total delay of the REP2 block remains fixed at the desired value $t_{TOT}$.

Below the real signal path is an image signal path. It consists of the TREF8 signal (from the GEN block of FIG. 20) passing through an identical "and" gate 460(b), SR latch 464(b), delay cell 472(b) ($N_{ADJ}$*D), "or' gate 468(b), and buffer 474(b). The buffer 474(b) for the image signal drives a load that is equivalent to that driven by the buffer 474(a) for the real signal. This image signal is fed into the $IN_D$ input of a CC block 476. The TREF8 signal also goes through a second delay cell with a delay of $t_{TOT}=N_{TOT}*t_D$ and is fed into the $IN_C$ input of the CC block 478. The reference voltages $V_{ADJP}$ and $V_{ADJN}$ produced by the CC block control the delay of the $N_{ADJ}*D$ blocks.

The pulses from the TREF8 signal will propagate through the two paths in the lower block, and will be compared in the CC cell 478. The CC cell will adjust the $V_{ADJP}$ and $V_{ADJN}$ voltages to make the delay of the two delay cells and buffer equal to $t_{TOT}$. Note that the delay cells ($N_{LIM}*D$), ($N_{EXP2}*D$) and ($N_{REP2}*D$) are not included here because there is no need to shape the TREF8 reference signal; the CC block only uses the relative positions of the IND and INC rising edges to generate the adjustment voltage.

In the upper cell, the delay seen by the input signal IN through the "and" gate, SR latch, delay cell, "or" gate, and buffer will also be equal to $t_{TOT}$ since all the components are matched and the $V_{ADJP}$ and $V_{ADJN}$ voltages are shared. If the delay of the receiver and buffer change because of temperature and supply voltage variations, the delay of the $N_{ADJ}*D$ delay cell will change in a complementary fashion so the overall delay remains $t_{TOT}$.

Figure 34:
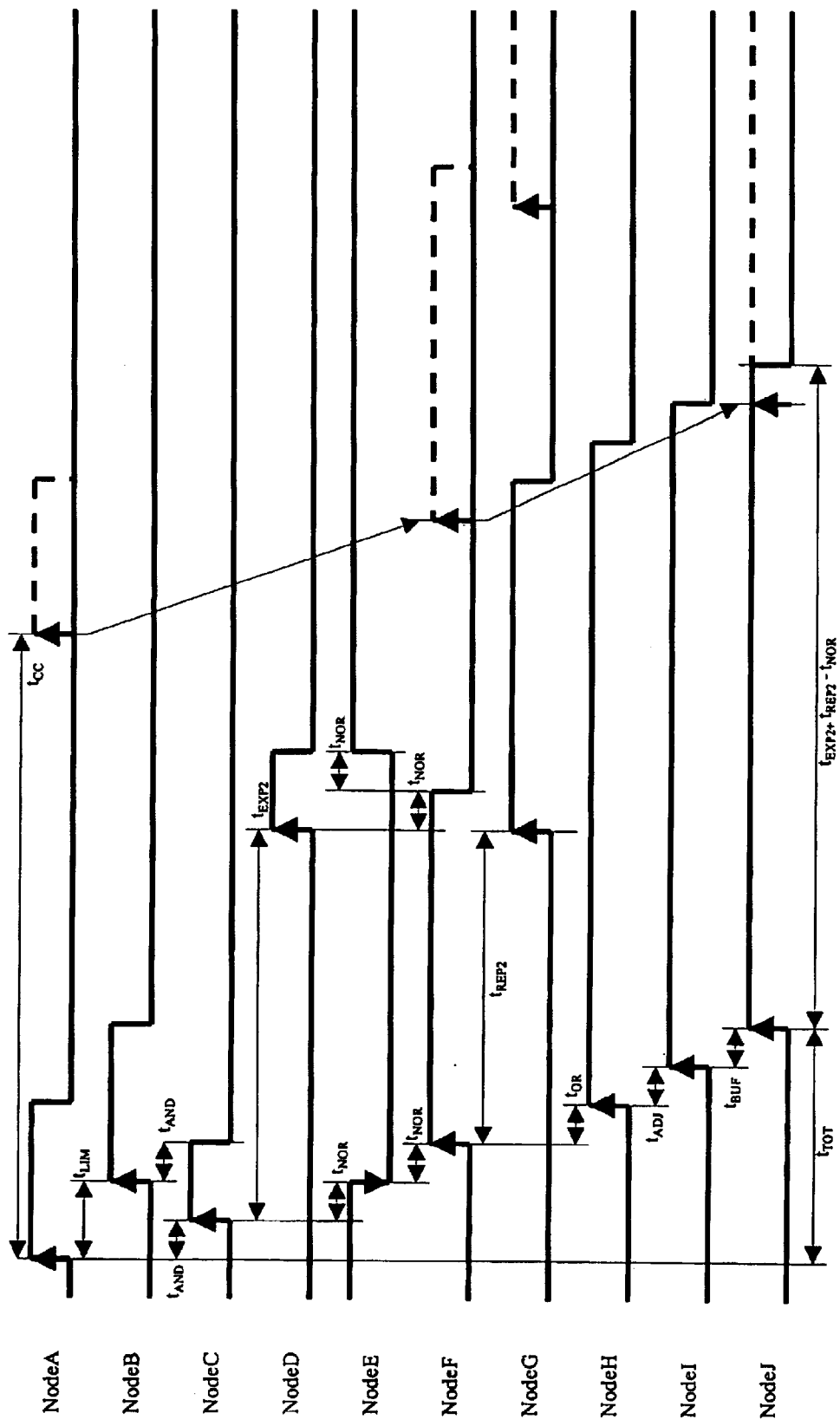
FIG. 34 is a timing diagram illustrating operation of the components shown in FIG. 33.

FIG. 34 shows a timing diagram for the REP2 cell of FIG. 33. The nodes along the real signal path are shown, and it can be seen that the delay from the IN node (NodeA) to the output node (NodeJ) is the sum of $t_{TOT}=t_{AND}+t_{NOR}+t_{NOR}+t_{OR}+t_{ADJ}+t_{BUF}$. The value of $t_{TOT}$ will be chosen to be greater than the maximum possible values (due to process, temperature and voltage variations) of $t_{AND}$, $t_{NOR}$, $t_{NOR}$, $t_{OR}$, $t_{ADJ}$, and $t_{BUF}$ when the $V_{ADJP}$ and $V_{ADJN}$ voltages are at their minimum and maximum values, respectively (giving minimum delay). This ensures that the $N_{ADJ}*D$ delay cell has enough range to compensate for the process, temperature, and voltage variations without adding unnecessary delay.

Note also that the pulse width at NodeJ is ($t_{EXP2}+t_{REP2}-t_{NOR}$). The pulse width will have some variation with respect to temperature and voltage since the $t_{NOR}$ delay is uncalibrated. However, the position of the falling edge of all control signals is not important—it is only necessary to precisely position the rising edges. Thus, this slight variation of pulse width will not affect the performance of the memory component.

If the subsequent column operation is also a RD or RDA command, there will be another pulse on NodeA a time $t_{CC}$ after the first pulse (dotted line). The pulse that is produced a time $t_{TOT}$ later on NodeJ will be merged with the first pulse because of the "or" gate that drives NodeH. This ensures that the output driver remains on when driving read data from consecutive read accesses.

This example implementation of an asynchronous DRAM interface assumes that the real signal path of the REP2 cell has a dedicated image signal path (i.e., only one REP2 cell is used in this example). Other implementations might use more than one REP2 cell, in which case the image signal paths could be shared among all real signal paths that are matched. This could be accomplished by adding dummy loading to the real signals so that all REP2 blocks see the same effective load. This would reduce the cost of calibrating the DEC delay to the area of the ($N_{ADJ}*D$) delay cell plus a fraction of the image signal path cell. The $V_{ADJP}$ and $V_{ADJN}$ voltage signals would be routed to all the (matched) real signal paths from the image signal path.

Figure 35:
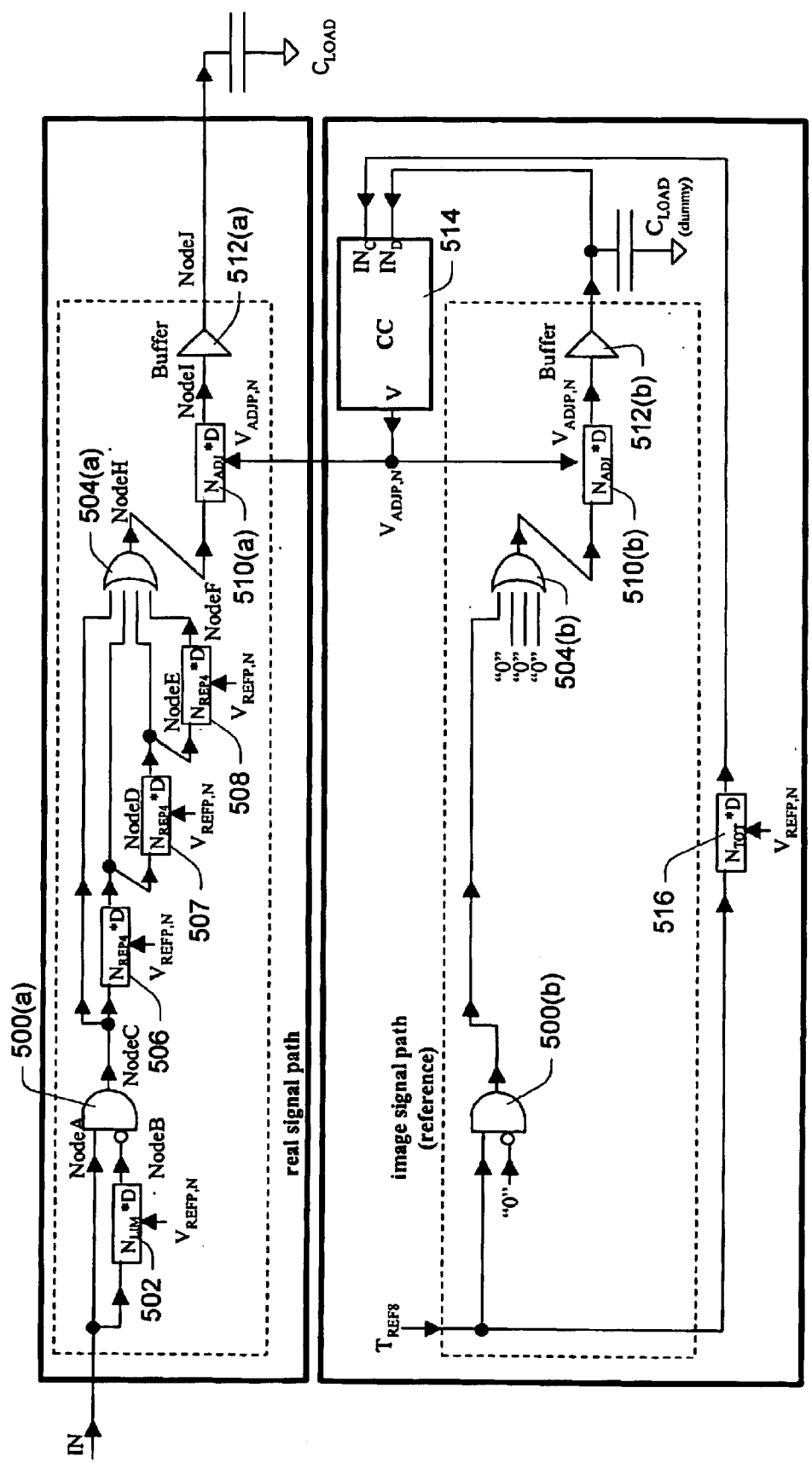
FIG. 35 is a block diagram of an REP4 block.

FIG. 35 shows the internal logic for a REP4 block such as shown in FIG. 28. This is one of the three blocks responsible for shaping the control pulses that have been decoded and delayed. The real signal path is contained in the upper part of the figure. It begins with the input signal IN passing through an "and" gate 500(a). The IN signal also passes through a delay block 502 ($N_{LIM}*D$). This provides a delay of $t_{LIM}=N_{LIM}*t_D$. The inverted delayed IN signal and the undelayed IN signal are and'ed by gate 500(a) to give NodeC. This first circuit is a pulse limiter—it accepts a pulse of unknown width (high time) and produces a pulse of width $t_{LIM}$. Note that the input signal width should be greater than $t_{LIM}$—this will be the case for all the signals produced by the decode blocks 401 in FIG. 28. The limited pulse is also delayed by $t_{AND}$ relative to the input pulse, but the accumulated delays of the REP4 block will be adjusted to a calibrated total with a delay element.

The NodeC output of the pulse limiter passes through an "or" gate 504(a). The NodeF signal also passes through three delay blocks 506, 507, and 508 ($N_{REP4}*D$). Each provides a delay of $t_{REP4}=N_{REP4}*t_D$. The three delayed NodeF signals and the undelayed NodeF signal are or'ed at gate 504(a) to give NodeH. The values of $t_{LIM}$ and $t_{REP4}$ are chosen so that the four pulses do not overlap. This is because the REP4 block produces the load signal for the output registers 255 (FIG. 17). The rising edge of the first pulse loads in the parallel read data (and allows the first piece of it to be driven out), and the rising edges of the next three pulses shift the remaining three pieces out.

The NodeH output of the "or" gate 504(a) passes through a third delay block 510(a) ($N_{ADJ}*D$) and a buffer 512(b) which drives the control signal to the interface logic and the DRAM core. This third delay line is used to add an adjustable delay so the total delay of the REP4 block remains fixed at the desired value $t_{TOT}$.

Below the real signal path is the image signal path. It consists of the TREF8 signal (from the GEN block of FIG. 20) passing through an identical "and" gate 500(b), "or" gate 504(b), delay cell 510(b) ($N_{ADJ}*D$), and buffer 512(b). The buffer 512(b) for the image signal drives a load that is equivalent to that driven by the buffer 512(a) for the real signal. This image signal is fed into the $IN_D$ input of a CC block 514. The TREF8 signal also goes through a second delay cell 516 with a delay of $t_{TOT}=N_{TOT}*t_D$ and is fed into the $IN_C$ input of the CC block 514. The reference voltages $V_{ADJP}$ and $V_{ADJN}$ produced by the CC block control the delay of the $N_{ADJ}*D$ blocks 510(a) and 510(b).

The pulses from the TREF8 signal will propagate through the two paths in the lower block, and will be compared in the CC cell. The CC cell will adjust the $V_{ADJP}$ and $V_{ADJN}$ voltages to make the delay of the two delay cells and buffer equal to $t_{TOT}$. Note that the delay cells ($N_{LIM}*D$) and ($N_{REP4}*D$) are not included here because there is no need to shape the TREF8 reference signal; the CC block only uses the relative positions of the IND and INC rising edges to generate the adjustment voltage.

In the upper cell, the delay seen by the input signal IN through the "and" gate, "or" gate, delay cell, and buffer will also be equal to $t_{TOT}$ since all the components are matched and the $V_{ADJP}$ and $V_{ADJN}$ voltages are shared. If the delay of the receiver and buffer change because of temperature and supply voltage variations, the delay of the $N_{ADJ}*D$ delay cell will change in a complementary fashion so the overall delay remains $t_{TOT}$.

Figure 36:
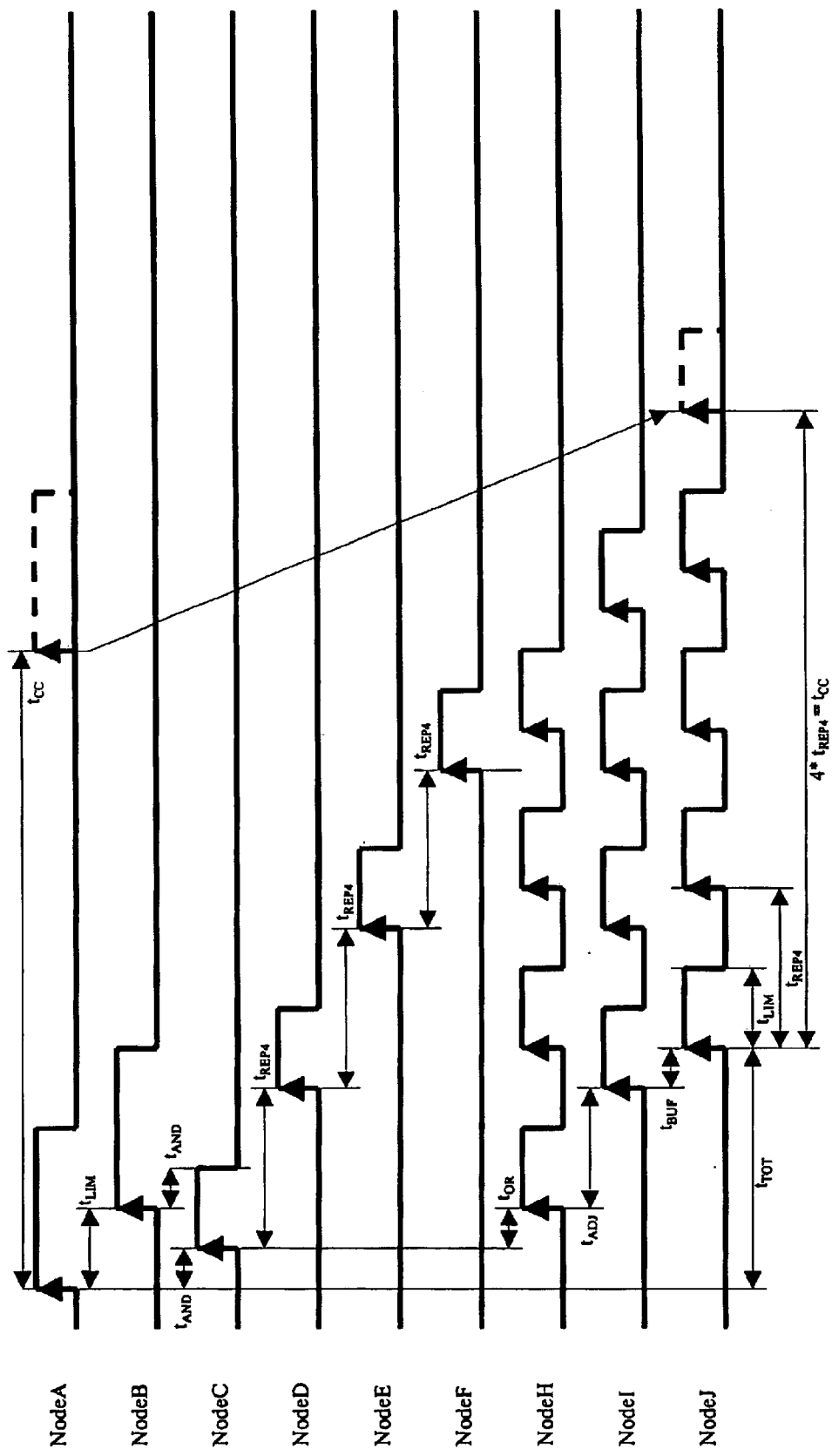
FIG. 36 is a timing diagram illustrating operation of the components shown in FIG. 35.

FIG. 36 shows a timing diagram for a REP4 cell such as shown in FIG. 35. The nodes along the real signal path are shown, and it can be seen that the delay from the IN node (NodeA) to the output node (NodeJ) is the sum of $t_{TOT}=t_{AND}+t_{OR}+t_{ADJ}+t_{BUF}$. The value of $t_{TOT}$ will be chosen to be greater than the maximum possible values (due to process, temperature and voltage variations) of $t_{AND}$, $t_{OR}$, $t_{ADJ}$, and $t_{BUF}$ when the $V_{ADJP}$ and $V_{ADJN}$ voltages are at their minimum and maximum values, respectively (giving minimum delay). This ensures that the $N_{ADJ}*D$ delay cell has enough range to compensate for the process, temperature, and voltage variations without adding unnecessary delay.

The initial pulse on NodeA becomes four pulses, the first delayed by $t_{TOT}$, the rest following at intervals of $t_{REP4}$. Each pulse is asserted for $t_{LIM}$.

If a subsequent column operation is also a RD or RDA command, there will be another pulse on NodeA a time $t_{CC}$ after the first pulse (dotted line). The pulse that is produced a time $t_{TOT}$ later on NodeJ will be NodeA a time $t_{CC}$ after the first pulse. The minimum $t_{CC}$ value will be equal to $4*t_{REP4}$.

This example implementation of an asynchronous DRAM interface assumes that the real signal path of the REP4 cell has a dedicated image signal path (i.e., only one REP4 cell is used in this example). Other implementations might use more than one REP4 cell, in which case the image signal paths could be shared among all real signal paths that are matched. This could be accomplished by adding dummy loading to the real signals so that all REP4 blocks see the same effective load. This would reduce the cost of calibrating the DEC delay to the area of the $(N_{ADJ}*D)$ delay cell plus a fraction of the image signal path cell. The $V_{ADJP}$ and $V_{ADJN}$ voltage signals would be routed to all the (matched) real signal paths from the image signal path.

Fifth Embodiment With Delayed Read Data

Figure 37:
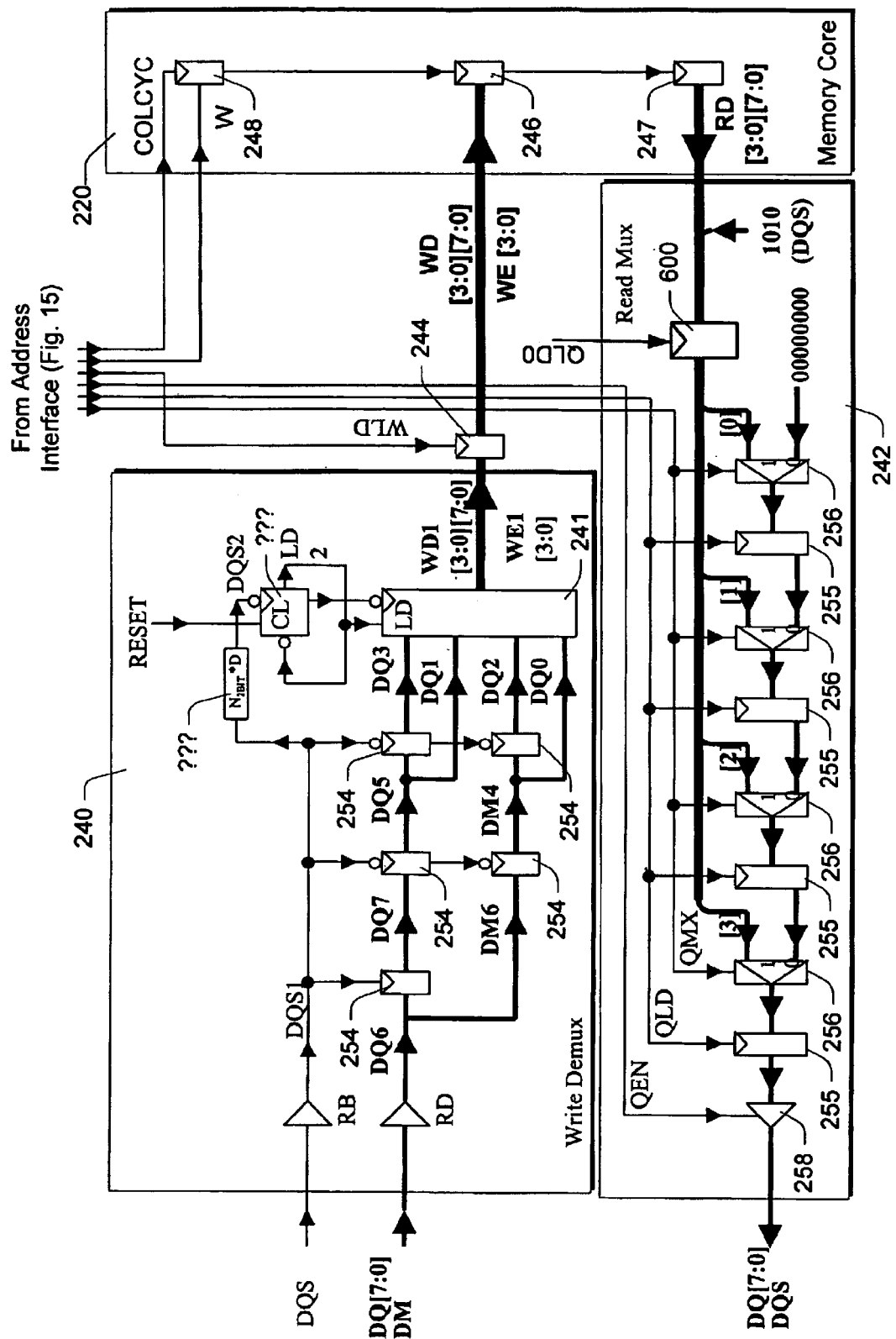
FIG. 37 is a block diagram of a fifth embodiment of an asynchronous pipelined memory device.
Figure 38:
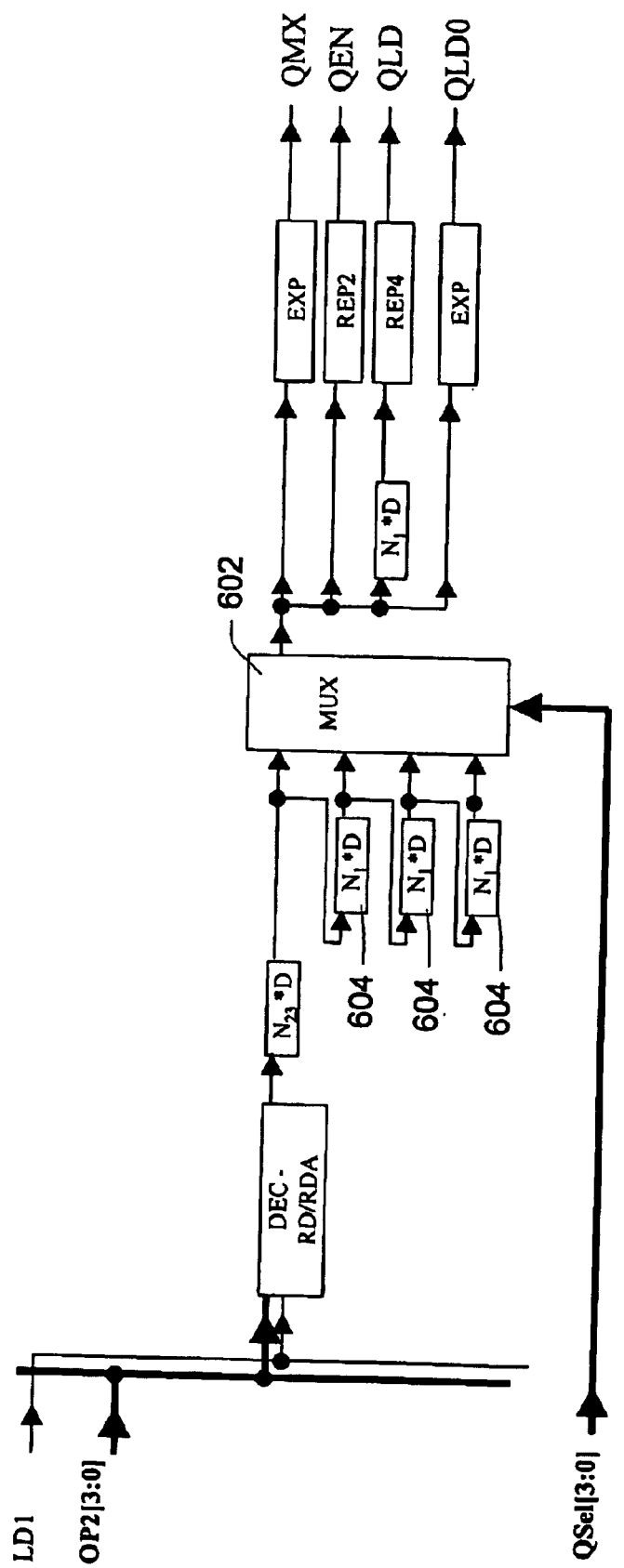
FIG. 38 is a block diagram illustrating timing logic of the device shown in FIG. 37.

FIGS. 37 and 38 show an alternative embodiment in which extra logic has been added to permit read data to be delayed by arbitrary, programmable time intervals. This might be important to ensure that the read data returns to the controller device after a fixed delay from when the read address is first transmitted, regardless of how far the memory component is located from the controller. If, for example, there were two ranks of memory devices present on the memory bus, the closer rank would be programmed with enough extra delay to compensate for the longer round trip flight time to the further rank. When a controller issued a read address to either rank, the read data would appear at the same absolute time at the controller pins.

FIG. 37 shows the data interface logic of an asynchronous memory device in accordance with this alternative embodiment. Most components are identical to those already discussed, and have been referenced with identical numerals. An extra register 600 has been inserted in the path of the read data, and is loaded by the rising edge of the new signal QLD0. This register can be configured to extend the valid window of the read data. It might not be necessary if the programmed delay values spanned a fairly small range, but would be needed for a larger range. The QLD0 signal is asserted at the same time that the QMX signal is also asserted high. This will give a time $t_D$ for the read data that is latched in this register to propagate through the multiplexers controlled by the QMX signal and to set up the registers that are loaded by the rising edge of the QLD signal. The valid window of the RD read data bus from the DRAM core is large enough to accommodate this earlier sampling point.

As shown in FIG. 38, a four-to-one multiplexer 602 has been inserted into the path of the signal that generates the QMX, QLD, QEN, and the new QLD0 signal. This multiplexer is controlled by a Qse1[3:0] programming bus. This bus will typically be driven from a control register in the DRAM that is loaded by the memory controller at system initialization time. It might also be driven from DRAM pins that are dedicated or shared with another function, or from fuses on the DRAM device, or by some equivalent technique.

The multiplexer 602 has four inputs, which receive versions of the LD1 signal that have been delayed by successively larger intervals by delay elements 604. The value of Qse1[3:0] will enable an undelayed signal, or will enable one of three delayed versions of the signal, with incremental delays of $1*t_D$, $2*t_D$, and $3*tD$. This will cause all four of the affected signals to shift together in time, causing the read data bit windows on the external pins of the DRAM device to shift.

Conclusion

Although details of specific implementations and embodiments are described above, such details are intended to satisfy statutory disclosure obligations rather than to limit the scope of the following claims. Thus, the invention as defined by the claims is not limited to the specific features described above. Rather, the invention is claimed in any of its forms or modifications that fall within the proper scope of the appended claims, appropriately interpreted in accordance with the doctrine of equivalents.

What is claimed is:

1. A memory device comprising:
    memory access logic that receives memory access initiation signals and performs pipelined memory access cycles in response, the memory access logic having pipeline elements that are signaled in sequence to complete the memory access cycles;
    matched delay elements that are collectively adjustable to produce matching delays that are asynchronous within the memory device;
    the matched delay elements being configured to produce asynchronously timed pipeline load signals in response to the memory access initiation signals, to load the pipeline elements of the memory access logic in sequence,
    wherein the matched delay elements are calibrated to one or more calibration signals received from a source external to the memory device.

2. A memory device as recited in claim 1, further comprising:
    delay calibration logic that includes at least one of the matched delay elements, wherein the delay calibration logic receives a calibration signal and collectively adjusts the matched delay elements until said at least one of the matched delay elements has a delay corresponding to the received calibration signal.

3. A memory device as recited in claim 1, further comprising:
    delay calibration logic that includes at least one of the matched delay elements, wherein the delay calibration logic receives a calibration signal and collectively adjusts the matched delay elements until said at least one of the matched delay elements has a delay corresponding to the received calibration signal; and
    wherein the delay calibration logic operates periodically to adjust the matched delay elements.

4. A memory device as recited in claim 1, further comprising:
    delay calibration logic that includes at least one of the matched delay elements, wherein the delay calibration logic receives a calibration signal and collectively adjusts the matched delay elements until said at least one of the matched delay elements has a delay corresponding to the received calibration signal; and
    wherein the calibration signal comprises two relatively timed events.

5. A memory device as recited in claim 1, further comprising:

delay calibration logic that includes at least one of the matched delay elements, wherein the delay calibration logic receives a calibration signal and collectively adjusts the matched delay elements until said at least one of the matched delay elements has a delay corresponding to the received calibration signal; and wherein the calibration signal is received on a single input conductor from the external source and comprises two relatively timed signal transitions.

6. A memory device as recited in claim 1, further comprising:

delay calibration logic that includes at least one of the matched delay elements, wherein the delay calibration logic receives a calibration signal and collectively adjusts the matched delay elements until said at least one of the matched delay elements has a delay corresponding to the received calibration signal; and wherein the calibration signal is received on two input conductors from the external source and comprises two relatively timed signal transitions.

7. A memory device as recited in claim 1, further comprising:

delay calibration logic that includes at least one of the matched delay elements, wherein the delay calibration logic receives a calibration signal and collectively adjusts the matched delay elements until said at least one of the matched delay elements has a delay corresponding to the received calibration signal; and wherein the calibration signal is asynchronous within the memory device.

8. A memory device as recited in claim 1, further comprising:

delay calibration logic that includes at least one of the matched delay elements, wherein the delay calibration logic receives a calibration signal and collectively adjusts the matched delay elements until said at least one of the matched delay elements has a delay corresponding to the received calibration signal; and wherein the memory access logic receives memory access initiation signals on a particular input conductor; and wherein the calibration logic receives the calibration signal on said particular input conductor.

9. A memory device as recited in claim 1, further comprising:

delay calibration logic that includes at least one of the matched delay elements, wherein the delay calibration logic receives a calibration signal and collectively adjusts the matched delay elements until said at least one of the matched, delay elements has a delay corresponding to the received calibration signal; and wherein the memory access initiation signals comprise address load signals that are received on a particular input conductor; and wherein the calibration logic receives the calibration signal on said particular input conductor.

10. A memory device comprising;

one or more address registers that load a received memory address at a time indicated by a received input load signal;

one or more delay elements that asynchronously delay the received input load signal;

a memory access logic that is responsive to the delayed input load signal to perform a memory operation;

wherein the delay elements are calibrated to one or more calibration signals received from a source external to the memory device.

11. A memory device as recited in claim 10, wherein the one or more delay elements comprise a plurality of matched delay elements that are collectively adjustable to produce matching delays that are asynchronous within the memory device.

12. A memory device as recited in claim 10, wherein:

the one or more delay elements comprise a plurality of matched delay elements that are collectively adjustable to produce matching delays that are asynchronous within the memory device;

the memory device further comprises delay calibration logic that includes at least one of the matched delay elements;

the delay calibration logic collectively adjusts the matched delay elements until said at least one of the matched delay elements has a delay corresponding to the one or more calibration signals.

13. A memory device as recited in claim 10, wherein the delay elements are calibrated periodically to the one or more calibration signals.

14. A memory device as recited in claim 10, wherein the one or mote delay elements are calibrated using feedback.

15. A memory device as recited in claim 10, wherein the one or more calibration signals comprise two relatively timed signal transitions.

16. A memory device as recited in claim 10, wherein the memory operation is a cell read operation.

17. A memory device as recited in claim 10, wherein the memory operation is a cell write operation.

18. A memory device as recited in claim 10, wherein the memory operation is a cell sense operation.

19. A memory device as recited in claim 10, wherein the memory operation is a cell precharge operation.

20. A memory device as recited in claim 10, wherein the one or more delay elements are configurable, after device manufacture, to delay the received input load signal by different times.

21. A memory device as recited in claim 10, wherein the one or more calibration signals are received on a conductor that also carries the input load signal.

22. A memory device as recited in claim 10, wherein the one or more calibration signals are encoded on an address bus.

23. A memory device as recited in claim 10, wherein the one or more calibration signals are encoded on a command bus.

24. A memory device as recited in claim 10, wherein the one or more calibration signals are encoded on a data bus.

25. A method of accessing a memory device comprising:

performing pipelined memory access cycles in response to receiving memory access initiation signals;

generating asynchronously-timed pipeline load signals to load pipeline elements within the memory device in sequence, the pipeline load signals being generated by matched delay elements; and calibrating one or more of the matched delay elements to one or more calibration signals received from a source external to the memory device.

26. A method of accessing a memory device as recited in claim 25, wherein the matched delay elements are collectively adjustable to generate matching delays that are asynchronous within the memory device.

27. A method of accessing a memory device as recited in claim 25, further comprising collectively adjusting the matched delay elements until at least one of the matched delay elements has a delay corresponding to the one or more calibration signals.

28. A method of accessing a memory device as recited in claim 25, wherein the generating asynchronously-timed pipeline load signals is performed in response to the memory access initiation signals.

29. A method of accessing a memory device as recited in claim 25, further comprising signaling the pipeline elements in sequence to complete the memory access cycles.

30. A method of accessing a memory device as recited in claim 25, wherein the calibrating is performed periodically.

31. A method comprising:
loading one or more address registers of a memory device with a received memory address at a time indicated by a received input load signal;
asynchronously delaying the received input load signal through one or more delay elements;
accessing the memory device in response to the delayed input load signal; and
calibrating the delay elements to one or more calibration signals received from a source external to the memory device.

32. A method as recited in claim 31, wherein the one or more delay elements comprise a plurality of matched delay elements that are collectively adjustable to produce matching delays that are asynchronous within the memory device.

33. A method as recited in claim 31, wherein:
the one or more delay elements comprise a plurality of matched delay elements that are collectively adjustable to produce matching delays that are asynchronous within the memory device;
the memory device further comprises delay calibration lope that includes at least one of the matched delay elements; and
the delay calibration logic collectively adjusts the matched delay elements until the at least one of the matched delay elements has a delay corresponding to the one or more calibration signals.

34. A method as recited in claim 31, wherein the delay elements are calibrated periodically to the one or more calibration signals.

35. A method as recited in claim 31, wherein the one or more delay elements are calibrated using feedback.

36. A method as recited in claim 31, wherein the one or more calibration signals comprise two relatively timed signal transitions.

37. A method as recited in claim 31, wherein the memory operation is a cell read operation.

38. A method as recited in claim 31, wherein the memory operation is a cell write operation.

39. A method as recited in claim 31, wherein the memory operation is a cell sense operation.

40. A method as recited in claim 31, wherein the memory operation is a cell precharge operation.

41. A method as recited in claim 31, wherein, after the device manufacture, the one or more delay elements are configurable to delay the received input load signal by different times.

42. A method as recited in claim 31, wherein the one or more calibration signals are received on a conductor that also carries the input load signal.

43. A method as recited in claim 31, wherein the one or more calibration signals are encoded on an address bus.

44. A method as recited in claim 31, wherein the one or more calibration signals are encoded on a command bus.

45. A method as recited in claim 31, wherein the one or more calibration signals are encoded on a data bus.

* * * * *

UNITED STATES PATENT AND TRADEMARK OFFICE
CERTIFICATE OF CORRECTION

PATENT NO. : 6,788,594 B2 Page 1 of 1
DATED : September 7, 2004
INVENTOR(S) : Ware et al.

It is certified that error appears in the above-identified patent and that said Letters Patent is hereby corrected as shown below:

Column 32,
Line 22, replace "mote" with -- more --.

Column 33,
Line 32, replace "lope" with -- logic --.

Signed and Sealed this

Seventeenth Day of May, 2005

JON W. DUDAS
*Director of the United States Patent and Trademark Office*